US012586659B2

(12) United States Patent
Sravan et al.

(10) Patent No.: US 12,586,659 B2
(45) Date of Patent: Mar. 24, 2026

(54) COLUMN REDUNDANCY DATA CIRCUITS AND METHODS FOR HIGHER TRANSMIT SPEED

(71) Applicant: Sandisk Technologies, Inc., Milpitas, CA (US)

(72) Inventors: A. Harihara Sravan, Bangalore (IN); Akash Kamat, Bangalore (IN); Anushree Singla, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 79 days.

(21) Appl. No.: 18/623,189

(22) Filed: Apr. 1, 2024

(65) Prior Publication Data

US 2025/0308621 A1      Oct. 2, 2025

(51) Int. Cl.
*G11C 29/00*          (2006.01)
*G11C 7/22*          (2006.01)

(52) U.S. Cl.
CPC .............. *G11C 29/76* (2013.01); *G11C 7/222* (2013.01); *G11C 29/785* (2013.01)

(58) Field of Classification Search
CPC ................................ G11C 29/00; G11C 29/76
USPC ............................................................ 365/9
See application file for complete search history.

(56) References Cited

U.S. PATENT DOCUMENTS

| | | | |
|---|---|---|---|
| 6,278,643 B1 | 8/2001 | Penney | |
| RE41,013 E | 11/2009 | Tsai et al. | |
| 7,911,872 B2 | 3/2011 | Lakhani et al. | |
| 11,152,079 B2 | 10/2021 | Bassa et al. | |
| 11,354,209 B2 | 6/2022 | Chinchole et al. | |
| 2011/0267899 A1* | 11/2011 | Kim ..................... | G11C 29/846 365/189.05 |
| 2013/0314992 A1* | 11/2013 | Takagiwa ............... | H10B 43/27 365/185.09 |
| 2014/0241078 A1* | 8/2014 | Komai ................... | G11C 16/26 365/208 |
| 2015/0058664 A1* | 2/2015 | Wu ........................ | G11C 29/00 714/6.32 |

* cited by examiner

*Primary Examiner* — Muna A Techane
(74) *Attorney, Agent, or Firm* — PEARL COHEN ZEDEK LATZER BARATZ LLP

(57)      ABSTRACT

An apparatus is provided that includes a memory structure including non-volatile memory cells that include a plurality of columns, each column including a column address, and a column redundancy system coupled to the memory structure and a clock signal. The column redundancy system is configured to in a first cycle of the clock signal first compare a first input column address to a first pair of defective column addresses received during an immediately preceding cycle of the clock signal, second compare the first input column address to a second pair of defective column addresses received during the first cycle of the clock signal.

20 Claims, 37 Drawing Sheets

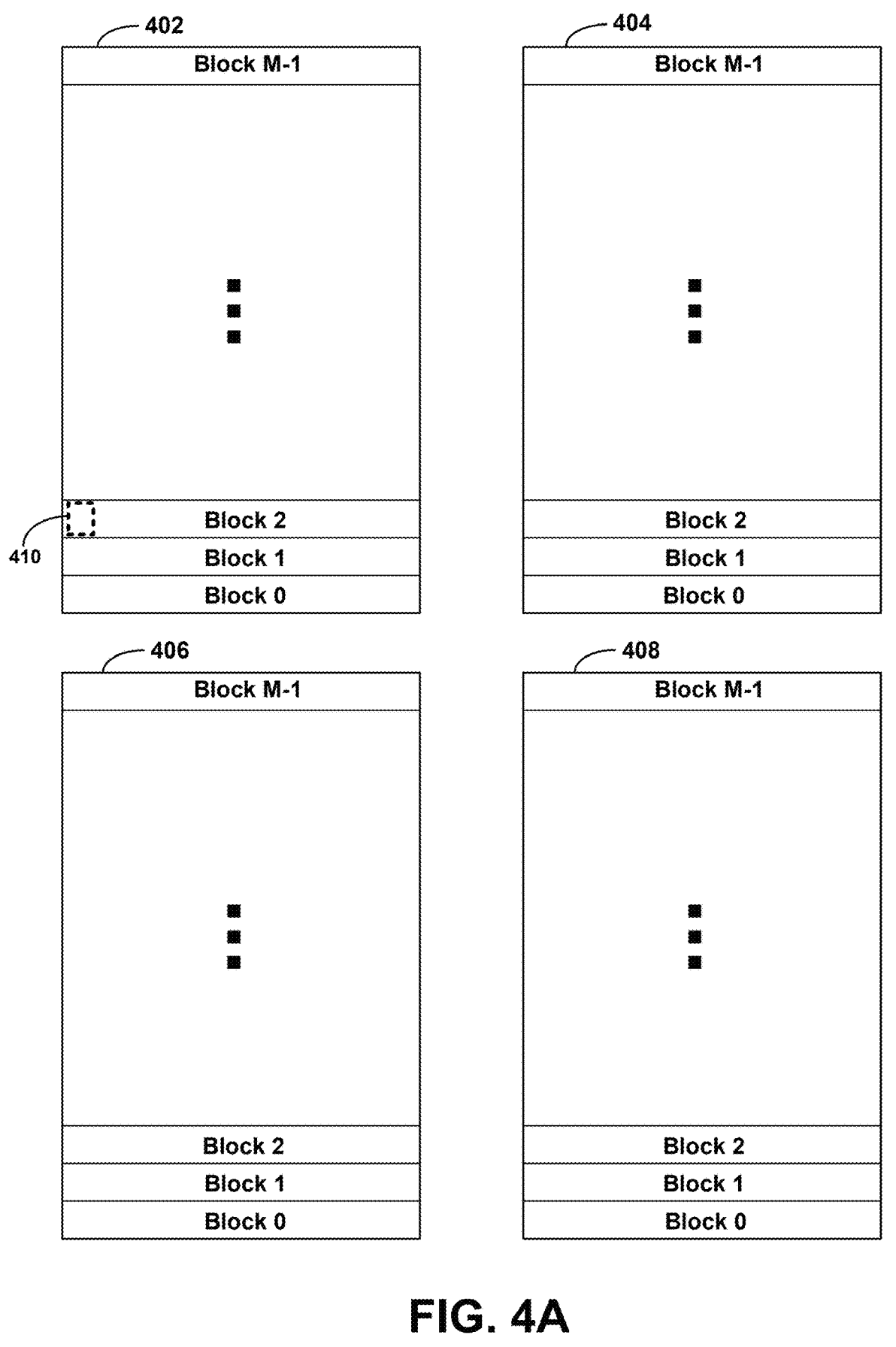

402

| Block M-1 |
| --- |
|  |
| ∎ |
| ∎ |
| ∎ |
|  |
| Block 2 |
| Block 1 |
| Block 0 |

410

404

| Block M-1 |
| --- |
|  |
| ∎ |
| ∎ |
| ∎ |
|  |
| Block 2 |
| Block 1 |
| Block 0 |

406

| Block M-1 |
| --- |
|  |
| ∎ |
| ∎ |
| ∎ |
|  |
| Block 2 |
| Block 1 |
| Block 0 |

408

| Block M-1 |
| --- |
|  |
| ∎ |
| ∎ |
| ∎ |
|  |
| Block 2 |
| Block 1 |
| Block 0 |

FIG. 4A

CRD Flowchart

| Number of Divisions | Rule |
|---|---|
| 2 Divisions | Remove Lower Most Bit |
| 3 Divisions | Lower Two Bits Increment From 0 to 2 |
| 4 Divisions | Remove Two Lower Most Bits |
| 5 Divisions | Lower Three Bits Increment From 0 to 4 |
| 6 Divisions | Lower Three Bits Increment From 0 to 5 |
| 7 Divisions | Lower Three Bits Increment From 0 to 6 |
| 8 Divisions | Remove Three Lower Most Bits |

FIG. 11

| Old CRD Architecture | |
|---|---|
| 0 | Address<12:0> |
| 1 | Address<12:0> |
| 2 | Address<12:0> |
| 3 | Address<12:0> |
| 4 | Address<12:0> |
| 5 | Address<12:0> |
| 6 | Address<12:0> |
| 7 | Address<12:0> |
| | ... |
| | ... |
| | ... |
| 103 | Address<12:0> |
| 104 | Address<12:0> |
| 105 | Address<12:0> |
| 106 | Address<12:0> |
| 107 | Address<12:0> |
| 108 | Address<12:0> |
| 109 | Address<12:0> |
| 110 | Address<12:0> |

FIG. 12

| New CRD Architecture: Four Divisions | | |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| | ... | |
| | ... | |
| | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

FIG. 13A

New Address Format

Match <3:0>

| Starting Address of Divisions to Number of Divisions <4 Divisions> | Information For Four Consecutive Addresses | | | |
|---|---|---|---|---|
| | DIV0 | DIV1 | DIV2 | DIV3 |
| Address<12:2> | GOOD | BAD | BAD | GOOD |

| Starting Address of Divisions to Number of Divisions <4 Divisions> | Information For Four Consecutive Addresses | | | |
|---|---|---|---|---|
| | DIV0 | DIV1 | DIV2 | DIV3 |
| Address<12:2> | GOOD | BAD | GOOD | GOOD |

| Starting Address of Divisions to Number of Divisions <4 Divisions> | Information For Four Consecutive Addresses | | | |
|---|---|---|---|---|
| | DIV0 | DIV1 | DIV2 | DIV3 |
| Address<12:2> | GOOD | BAD | BAD | BAD |

FIG. 13B

| New CRD Architecture: Five Divisions | | |
|---|---|---|
| 0 | New Address<12:3> | Match Bit<4:0> |
| 1 | New Address<12:3> | Match Bit<4:0> |
| 2 | New Address<12:3> | Match Bit<4:0> |
| 3 | New Address<12:3> | Match Bit<4:0> |
| 4 | New Address<12:3> | Match Bit<4:0> |
| 5 | New Address<12:3> | Match Bit<4:0> |
| 6 | New Address<12:3> | Match Bit<4:0> |
| 7 | New Address<12:3> | Match Bit<4:0> |
| | ... | |
| | ... | |
| | ... | |
| 103 | New Address<12:3> | Match Bit<4:0> |
| 104 | New Address<12:3> | Match Bit<4:0> |
| 105 | New Address<12:3> | Match Bit<4:0> |
| 106 | New Address<12:3> | Match Bit<4:0> |
| 107 | New Address<12:3> | Match Bit<4:0> |
| 108 | New Address<12:3> | Match Bit<4:0> |
| 109 | New Address<12:3> | Match Bit<4:0> |
| 110 | New Address<12:3> | Match Bit<4:0> |

FIG. 14A

| New Address Format | Match <4:0> | | | | | |
|---|---|---|---|---|---|---|
| Starting Address of Divisions to Number of Divisions <5 Divisions> | Information For Four Consecutive Addresses | | | | | |
| | | DIV0 | DIV1 | DIV2 | DIV3 | DIV4 |
| Address<12:3> | | GOOD | BAD | BAD | GOOD | GOOD |
| Starting Address of Divisions to Number of Divisions <4 Divisions> | Information For Four Consecutive Addresses | | | | | |
| | | DIV0 | DIV1 | DIV2 | DIV3 | DIV4 |
| Address<12:2> | | GOOD | BAD | GOOD | GOOD | GOOD |
| Starting Address of Divisions to Number of Divisions <4 Divisions> | Information For Four Consecutive Addresses | | | | | |
| | | DIV0 | DIV1 | DIV2 | DIV3 | DIV4 |
| Address<12:2> | | GOOD | BAD | BAD | BAD | BAD |

FIG. 14B

| New CRD Architecture: Four Divisions | | |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| | ... | |
| | ... | |
| | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

FIG. 15A

New CRD Architecture: Four Divisions

| | New Address<12:2> | Match Bit<3:0> |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| ... | ... | |
| ... | ... | |
| ... | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

New CRD Architecture: Four Divisions

| | New Address<12:2> | Match Bit<3:0> |
|---|---|---|
| 0 | New Address<12:2> | Match Bit<3:0> |
| 1 | New Address<12:2> | Match Bit<3:0> |
| 2 | New Address<12:2> | Match Bit<3:0> |
| 3 | New Address<12:2> | Match Bit<3:0> |
| 4 | New Address<12:2> | Match Bit<3:0> |
| 5 | New Address<12:2> | Match Bit<3:0> |
| 6 | New Address<12:2> | Match Bit<3:0> |
| 7 | New Address<12:2> | Match Bit<3:0> |
| ... | ... | |
| ... | ... | |
| ... | ... | |
| 103 | New Address<12:2> | Match Bit<3:0> |
| 104 | New Address<12:2> | Match Bit<3:0> |
| 105 | New Address<12:2> | Match Bit<3:0> |
| 106 | New Address<12:2> | Match Bit<3:0> |
| 107 | New Address<12:2> | Match Bit<3:0> |
| 108 | New Address<12:2> | Match Bit<3:0> |
| 109 | New Address<12:2> | Match Bit<3:0> |
| 110 | New Address<12:2> | Match Bit<3:0> |

FIG. 15B

| clock cycle | DIV0 | DIV1 | DIV2 | · · · | DIV10 | DIV11 |
|---|---|---|---|---|---|---|
| 1 | 0 | 1 | 2 | · · · | 10 | 11 |
| 2 | 12 | 13 | 14 | · · · | 22 | 23 |
| 3 | 24 | 25 | 26 | · · · | 34 | 35 |

FIG. 16A

| clock cycle | indexed addresses (group, division) | | | | | |
|---|---|---|---|---|---|---|
| 1 | (0,0) | (0,1) | (0,2) | · · · | (0,10) | (0,11) |
| 2 | (1,0) | (1,1) | (1,2) | · · · | (1,10) | (1,11) |
| 3 | (2,0) | (2,1) | (2,2) | · · · | (2,10) | (2,11) |

FIG. 16B

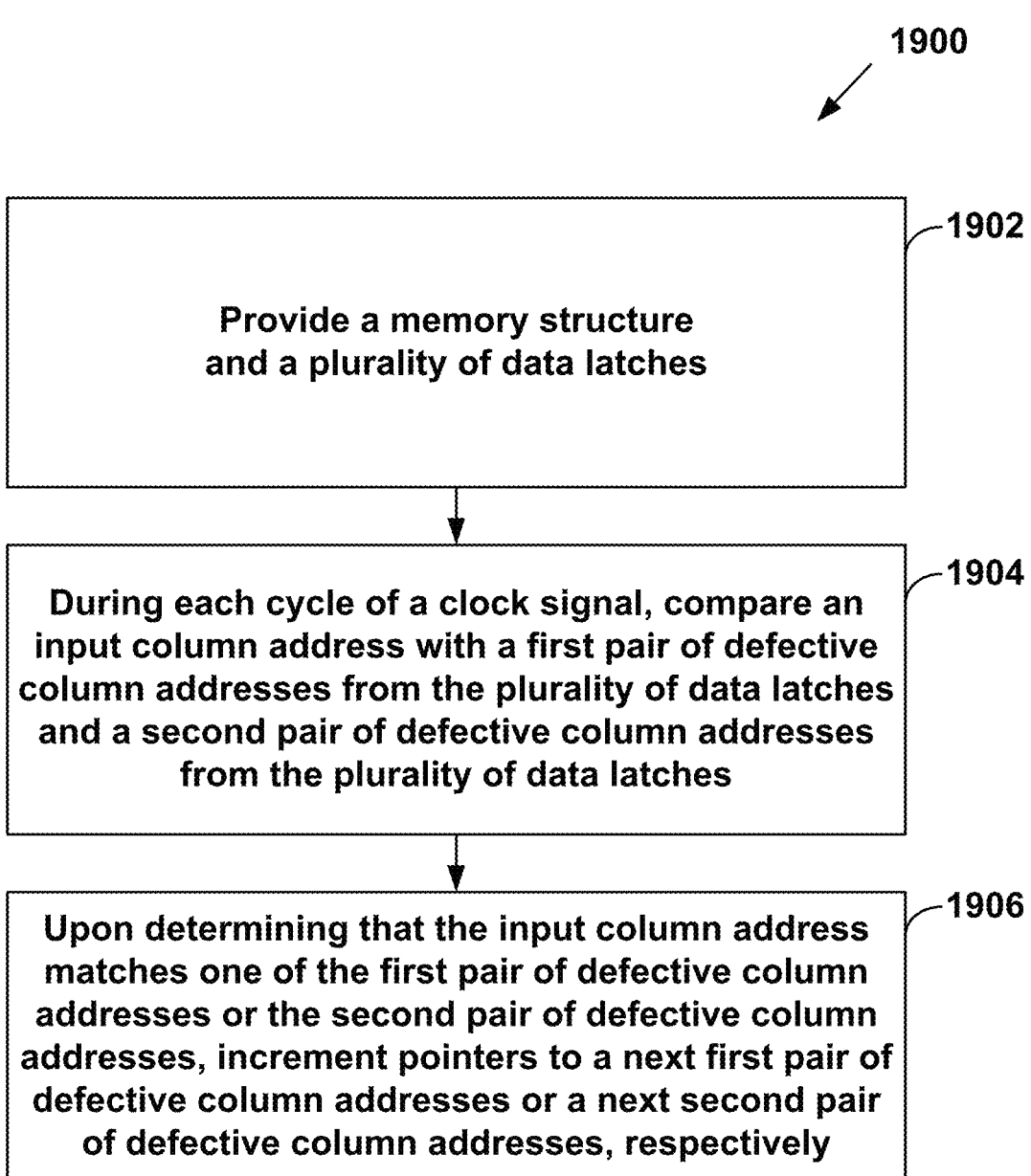

1900

Provide a memory structure
and a plurality of data latches

1902

During each cycle of a clock signal, compare an
input column address with a first pair of defective
column addresses from the plurality of data latches
and a second pair of defective column addresses
from the plurality of data latches

1904

Upon determining that the input column address
matches one of the first pair of defective column
addresses or the second pair of defective column
addresses, increment pointers to a next first pair of
defective column addresses or a next second pair
of defective column addresses, respectively

COLUMN REDUNDANCY DATA CIRCUITS AND METHODS FOR HIGHER TRANSMIT SPEED

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

Non-volatile memory chips may be susceptible to failures of the memory array. Defects in a single bit, in a row, in a column, or both rows and columns may arise during the manufacturing process or during the lifespan of the chip. For example, latch failures, bit line shorts, and word lines shorts may all affect the ability of a memory chip to reliably store data or read-out data that has already been stored.

Avenues for addressing memory defects may include various types of redundancy techniques. These ideally minimize the impact of such defects, although it may not be possible to address all defects without limiting the speed of read/write operations. In such cases, at the manufacturing stage, it may be necessary to discard chips having too many defects. This may have the effect of reducing production yield, or the ratio of the number of functional chips to the total number of chips produced. Thus, improvements to redundancy techniques that do not unduly compromise operational speed while still providing adequate assurances of reliability are desirable

BRIEF DESCRIPTION OF THE DRAWINGS

Like-numbered elements refer to common components in the different figures.

FIG. 4A is a block diagram of one embodiment of a memory structure having two planes.

FIG. 11 provides an example of specific rules by which the addresses may be structured in a division-based architecture.

FIG. 12 provides a tabular representation of an array of individual column data as might be stored in latches of a CRD plane.

FIG. 13A provides a tabular representation of an array of bad column information for a division-based architecture in which a four-division system is used.

FIG. 13B provides a detailed representation of match bits as stored in CRD latches.

FIG. 14A provides a tabular representation of an array of bad column information for a division-based architecture in which a five-division system is used.

FIG. 14B provides a detailed representation of information indicated by match bits when a division-based architecture is used.

FIG. 15A portrays the improved operation of comparison logic when using the division-based CRD architecture.

FIG. 15B shows the compounded benefit of the division-based architecture when performing multiple horizontal comparisons at once.

FIG. 16A is a diagram representing example pages of data written to a memory array with twelve divisions.

FIG. 16B illustrates indexed column addresses corresponding to non-indexed column addresses of FIG. 16A.

FIG. 19 is a flow chart of an example column redundancy data process that may be implemented by the example column redundancy system of FIG. 18A.

DETAILED DESCRIPTION

Technology is described for column redundancy systems that may operate at higher speeds without slowing the column redundancy system clock. In embodiments, column redundancy systems are provided in which, a predetermined number of additional bad column addresses are read from column redundancy data latches during each cycle of the column redundancy system clock. In embodiments, the additional bad column addresses are kept available for use in the next subsequent cycle of the column redundancy system clock.

Without wanting to be bound by any particular theory, it is believed that "pre-fetching" the additional bad column addresses in this manner may reduce a timing path delay in the column redundancy system. Without wanting to be bound by any particular theory, it is believed that "pre-fetching" the additional bad column addresses in this manner may allow the column redundancy systems to operate at higher speeds.

A non-volatile memory includes a plurality of word lines connected to non-volatile memory cells, a plurality of driver lines configured to carry one or more word line voltages, and a plurality of word line switches that selectively connect the driver lines to the word lines. To more efficiently utilize space on the die, the word line switches are arranged in a plurality of three dimensional stacks such that each stack of the plurality of stacks comprises multiple word line switches vertically stacked.

Figure 1:
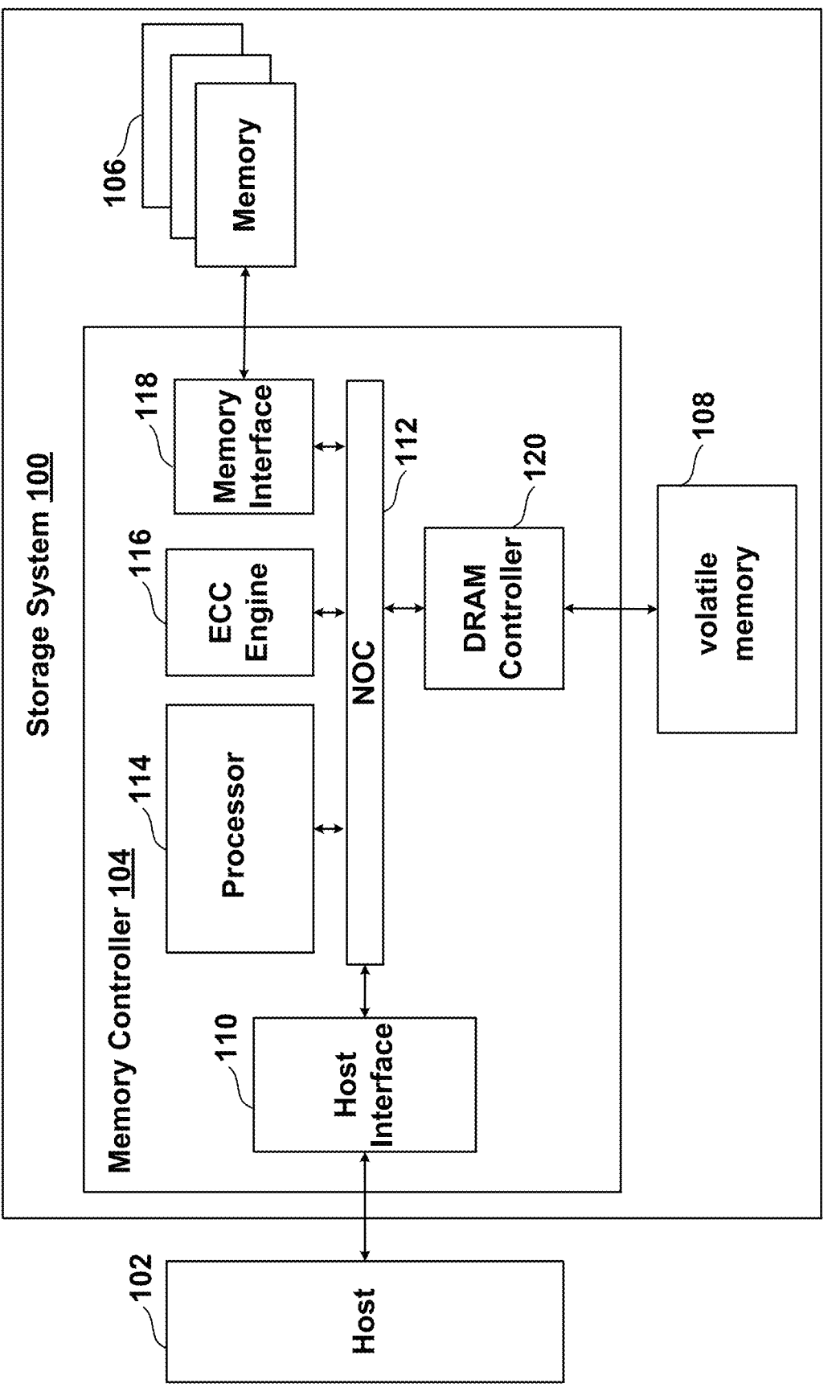
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 also can be a memory card, USB drive or other type of storage system. The proposed technology is not limited to any one type of memory system.

Storage system 100 is connected to a host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 104 connected to non-volatile memory 106 and local high speed volatile memory 108 (e.g., DRAM). Local high speed volatile memory 108 is used by memory controller 104 to perform certain functions. For example, local high speed volatile memory 108 stores logical to physical address translation tables ("L2P tables").

Memory controller 104 includes a host interface 110 that is connected to and in communication with host 102. In one embodiment, host interface 110 implements a NVM Express (NVMe) over PCI Express (PCIe). Other interfaces can also be used, such as SCSI, SATA, etc. Host interface 110 also is connected to a network-on-chip (NOC) 112.

A NOC is a communication subsystem on an integrated circuit. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 112 can be replaced by a bus.

Connected to and in communication with NOC 112 is a processor 114, an ECC engine 116, a memory interface 118, and a DRAM controller 120. DRAM controller 120 is used to operate and communicate with local high speed volatile memory 108 (e.g., DRAM). In other embodiments, local high speed volatile memory 108 can be SRAM or another type of volatile memory.

Processor 114 performs the various controller memory operations, such as programming, erasing, reading, and memory management processes. In one embodiment, processor 114 is programmed by firmware. In other embodiments, processor 114 is a custom and dedicated hardware circuit without any software. Processor 114 also implements a translation module, as a software/firmware process or as a dedicated hardware circuit.

In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 104 (e.g., the translation module) performs address translation between the logical addresses used by the host and the physical addresses used by the memory dies.

One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables.

Instead, the logical address to physical address tables (or L2P tables) can be any type of data structure. In some examples, the memory space of a storage system is so large that the local memory 108 cannot hold all of the L2P tables. In such a case, the entire set of L2P tables are stored in non-volatile memory 106 and a subset of the L2P tables are cached (L2P cache) in the local high speed volatile memory 108.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Memory interface 118 communicates with non-volatile memory 106. In one embodiment, memory interface provides a Toggle Mode interface. Other interfaces also can be used. In some example implementations, memory interface 118 (or another portion of controller 104) implements a scheduler and buffer for transmitting data to and receiving data from one or more memory die.

Figure 2A:
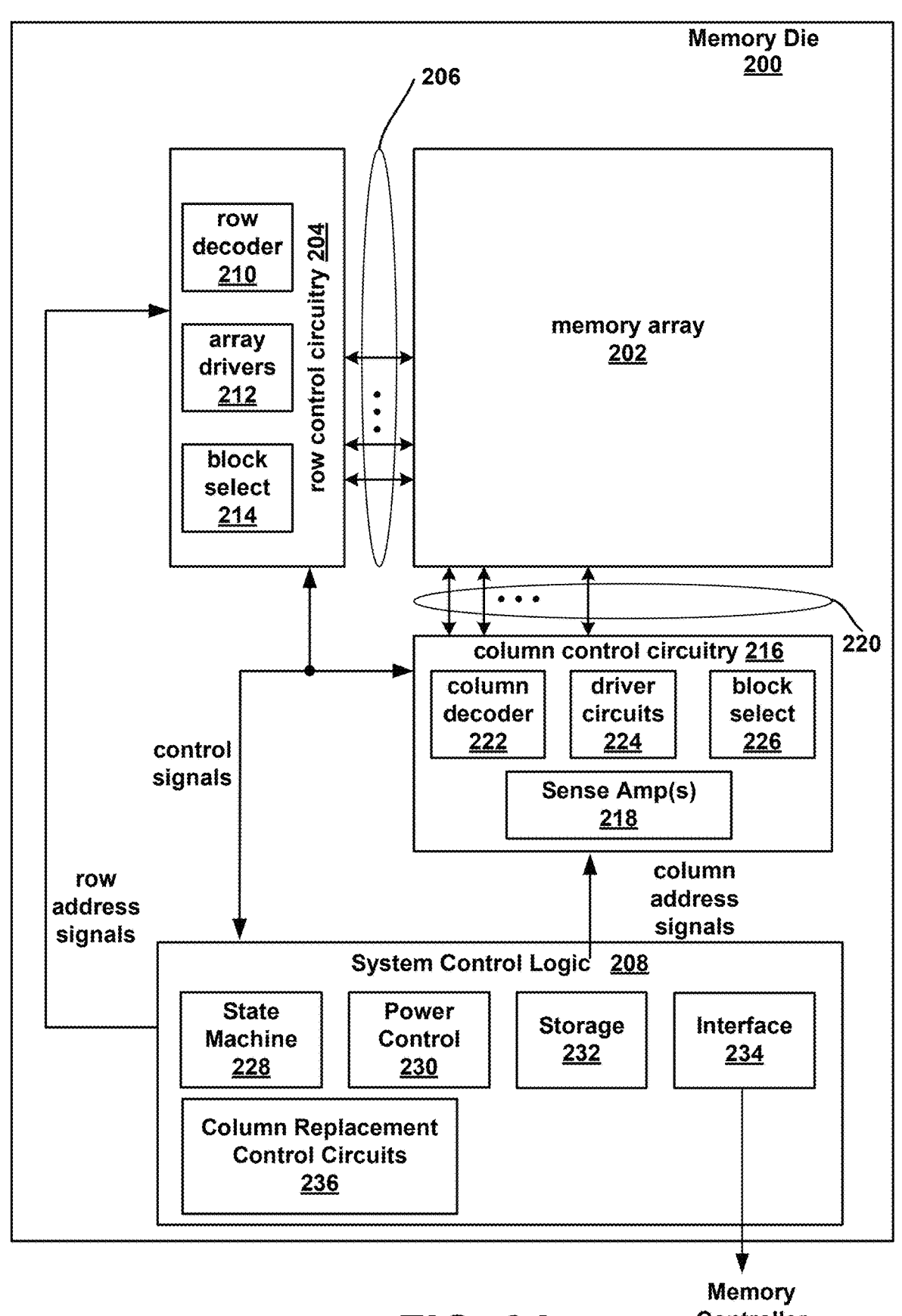
FIG. 2A is a block diagram of one embodiment of a memory die.

In one embodiment, non-volatile memory 106 includes one or more memory die. FIG. 2A is a functional block diagrams of one embodiment of a memory die 200 that includes non-volatile memory 106. Each of the one or more memory die of non-volatile memory 106 can be implemented as memory die 200 of FIG. 2A. The components depicted in FIG. 2A are electrical circuits.

Memory die 200 includes a memory array 202 that can include non-volatile memory cells, as described in more detail below. The array terminal lines of memory array 202 include the various layer(s) of word lines organized as rows, and the various layer(s) of bit lines organized as columns. However, other orientations can also be implemented.

Memory die 200 includes row control circuitry 204, whose outputs 206 are connected to respective word lines of the memory array 202. Row control circuitry 204 receives a group of M row address signals and one or more various control signals from system control logic circuit 208, and typically may include such circuits as row decoders 210, array terminal drivers 212, and block select circuitry 214 for both reading and writing (programming) operations.

Row control circuitry 204 also may include read/write circuitry. Memory die 200 also includes column control circuitry 216 including sense amplifier(s) 218 whose input/ outputs 220 are connected to respective bit lines of memory array 202. Although only a single block is shown for memory array 202, a memory die can include multiple arrays that can be individually accessed.

Column control circuitry 216 receives a group of N column address signals and one or more various control signals from system control logic 208, and typically may include such circuits as column decoders 222, array terminal receivers or driver circuits 224, block select circuitry 226, as well as read/write circuitry, and I/O multiplexers.

System control logic 208 receives data and commands from memory controller 104 (FIG. 1) and provides output data and status to host 102. In some embodiments, system control logic 208 (which includes one or more electrical circuits) includes a state machine 228 that provides die-level control of memory operations.

In one embodiment, state machine 228 is programmable by software. In other embodiments, state machine 228 does not use software and is completely implemented in hardware (e.g., electrical circuits). In another embodiment, state machine 228 is replaced by a micro-controller or microprocessor, either on or off the memory chip.

System control logic 208 also can include a power control module 230 that controls the power and voltages supplied to the rows and columns of memory structure 202 during memory operations and may include charge pumps and regulator circuit for creating regulating voltages. System control logic 208 includes storage 232 (e.g., RAM, registers, latches, etc.), which may be used to store parameters for operating memory array 202.

Commands and data are transferred between memory controller 104 and memory die 200 via memory controller interface 234 (also referred to as a "communication interface"). Memory controller interface 234 is an electrical interface for communicating with memory controller 104. Examples of memory controller interface 234 include a Toggle Mode Interface and an Open NAND Flash Interface (ONFI). Other I/O interfaces can also be used.

In an embodiment, system control logic 208 also includes column replacement control circuits 236, described in more detail below.

In some embodiments, all elements of memory die 200, including the system control logic 208, can be formed as part of a single die. In other embodiments, some or all of the system control logic 208 can be formed on a different die.

In one embodiment, memory structure 202 comprises a three-dimensional memory array of non-volatile memory cells in which multiple memory levels are formed above a single substrate, such as a wafer. Memory structure 202 may include any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein.

Other examples of suitable technologies for memory cells of memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory structure 202 include two dimensional arrays, three dimensional arrays, crosspoint arrays, stacked two dimensional arrays, vertical bit line arrays, and the like.

One example of a ReRAM cross-point memory includes reversible resistance-switching elements arranged in crosspoint arrays accessed by X lines and Y lines (e.g., word lines and bit lines). In another embodiment, the memory cells may include conductive bridge memory elements. A conductive bridge memory element may also be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells.

In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light.

In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to memory structure 202. However, this reduces the area of the memory die available for the peripheral circuitry. This can place quite severe restrictions on these elements of the peripheral circuitry.

For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 is the amount of area to devote to memory structure 202 and the amount of area to devote to the peripheral circuitry.

Another area in which memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based.

For example, elements such sense amplifier circuits, charge pumps, logic elements in a state machine, and other peripheral circuitry in system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, memory structure 202 can be formed on one die (referred to as the memory die) and some or all of the peripheral circuitry elements, including one or more control circuits, can be formed on a separate die (referred to as the control die).

For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
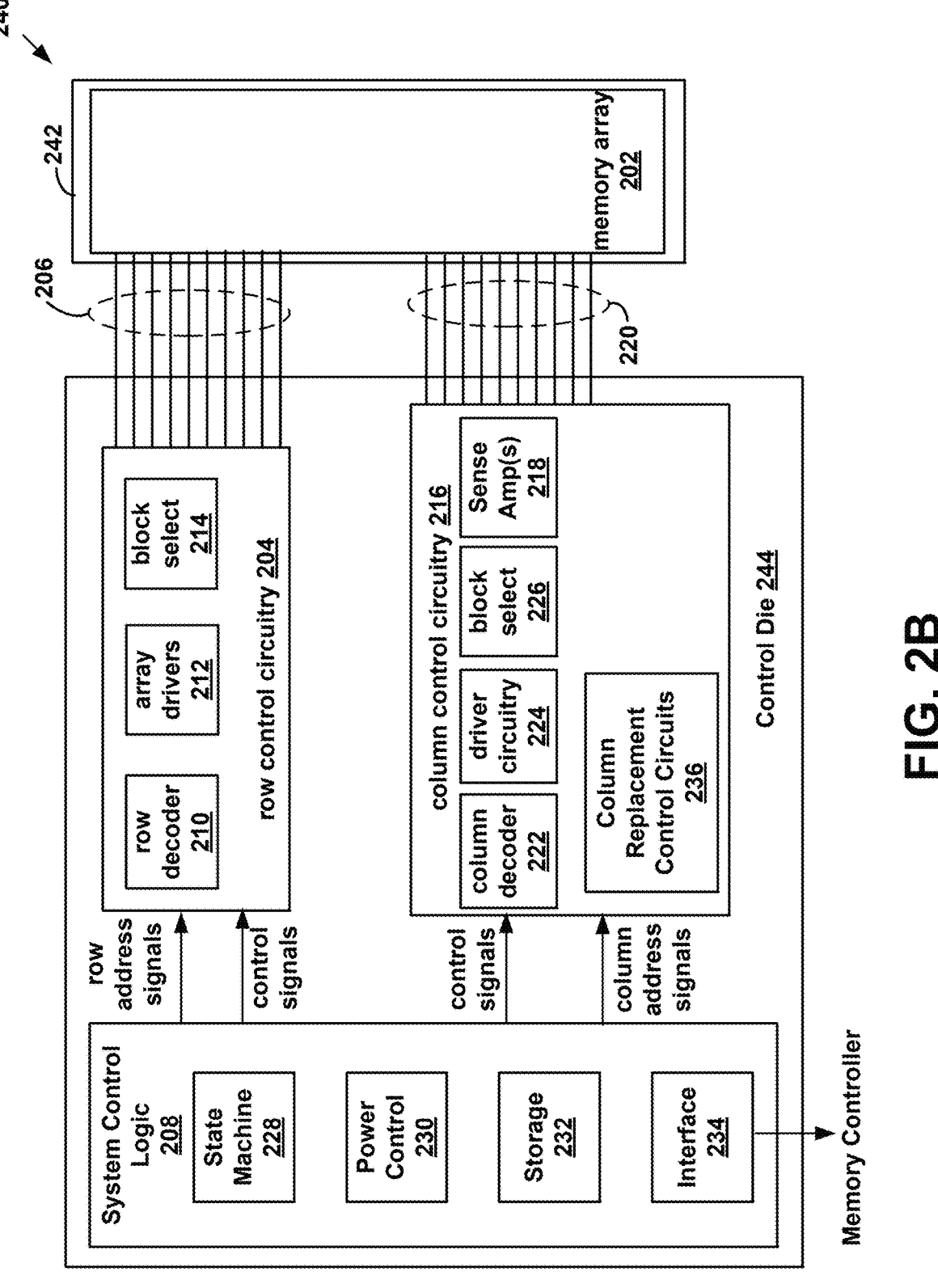
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 240. One or more integrated memory assemblies 240 may be used to implement the non-volatile memory 106 of storage system 100.

Integrated memory assembly 240 includes two types of semiconductor die (or more succinctly, "die"). Memory die 242 includes memory structure 202. Memory structure 202 includes non-volatile memory cells. Control die 244 includes control circuitry 208, 216, and 204 (as described above). In some embodiments, control die 244 is configured to connect to memory structure 202 in memory die 242. In some embodiments, memory die 242 and control die 244 are bonded together.

FIG. 2B shows an example of the peripheral circuitry, including control circuits, formed in a peripheral circuit or control die 244 coupled to memory structure 202 formed in memory die 242. Common components are labelled similarly to FIG. 2A. System control logic 208, row control circuitry 204, and column control circuitry 216 are located in control die 244. In some embodiments, all or a portion of column control circuitry 216 and all or a portion of row control circuitry 204 are located on memory die 242. In some embodiments, some of the circuitry in system control logic 208 is located on memory die 242.

System control logic 208, row control circuitry 204, and column control circuitry 216 may be formed by a common process (e.g., CMOS process), so that adding elements and functions, such as ECC, more typically found on a memory controller 104 may require few or no additional process steps (i.e., the same process steps used to fabricate controller 104 may also be used to fabricate system control logic 208, row control circuitry 204, and column control circuitry 216).

Thus, while moving such circuits from a die such as memory 242 may reduce the number of steps needed to fabricate such a die, adding such circuits to a die such as control die 244 may not require many additional process steps. Control die 244 also could be referred to as a CMOS die, due to the use of CMOS technology to implement some or all of control circuitry 204, 208, 216.

FIG. 2B shows column control circuitry 216 including sense amplifier(s) 218 on control die 244 coupled to memory structure 202 on memory die 242 through electrical paths 220. For example, electrical paths 220 may provide electrical connection between column decoder 222, driver circuitry 224, and block select 226 and bit lines of memory structure 202. In an embodiment, column control circuitry 216 also includes column replacement control circuits 236, described in more detail below.

Electrical paths may extend from column control circuitry 216 in control die 244 through pads on control die 244 that are bonded to corresponding pads of the memory die 242, which are connected to bit lines of memory structure 202. Each bit line of memory structure 202 may have a corresponding electrical path in electrical paths 220, including a pair of bond pads, which connects to column control circuitry 216.

Similarly, row control circuitry 204, including row decoder 210, array drivers 212, and block select 214 are coupled to memory structure 202 through electrical paths 206. Each of electrical path 206 may correspond to a word line, dummy word line, or select gate line. Additional electrical paths may also be provided between control die 244 and memory die 242.

For purposes of this document, the phrases "a control circuit" or "one or more control circuits" can include any one of or any combination of memory controller 104, state machine 228, all or a portion of system control logic 208, all or a portion of row control circuitry 204, all or a portion of column control circuitry 216, a microcontroller, a microprocessor, and/or other similar functioned circuits.

The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In some embodiments, there is more than one control die 244 and more than one memory die 242 in an integrated memory assembly 240. In some embodiments, the integrated memory assembly 240 includes a stack of multiple control die 244 and multiple memory die 242.

Figure 3:
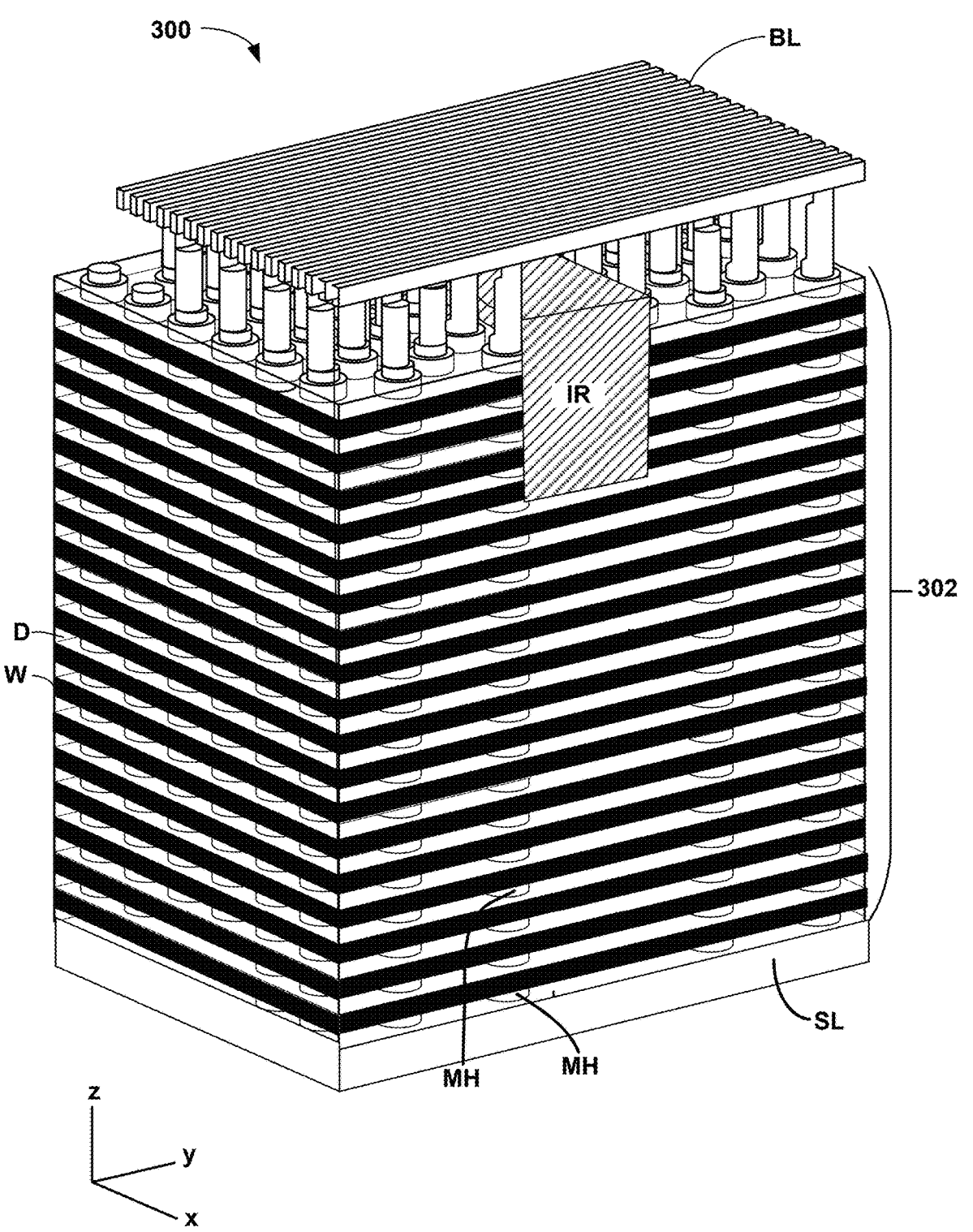
FIG. 3 is a perspective view of a portion of one embodiment of a monolithic three dimensional memory structure.

FIG. 3 is a perspective view of a portion of one example embodiment of a monolithic three dimensional memory array/structure included in memory structure 202, which includes a plurality non-volatile memory cells arranged as vertical NAND strings. For example, FIG. 3 shows a portion 300 of one block of memory.

The structure depicted includes a set of bit lines BL positioned above a stack 302 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into four or five (or a different number of) regions by isolation regions IR. FIG. 3 shows one isolation region IR separating two regions. Below the alternating dielectric layers and word line layers is a source line layer SL. Memory holes are formed in the stack of alternating dielectric layers and conductive layers.

For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

Each memory cell can store one or more bits of data. Thus, the non-volatile memory cells are arranged in memory holes. More details of the three dimensional monolithic memory array that comprises memory structure 202 is provided below.

FIG. 4A is a block diagram explaining one example organization of memory structure 202, which is divided into four planes 402, 404, 406 and 408. Each plane is then divided into M blocks. In one example, each plane has about 2000 blocks. However, different numbers of blocks and planes can also be used.

In one embodiment, a block of memory cells is a unit of erase. That is, all memory cells of a block are erased together. In other embodiments, blocks can be divided into sub-blocks and the sub-blocks can be the unit of erase. Memory cells also can be grouped into blocks for other reasons, such as to organize the memory structure to enable the signaling and selection circuits.

In some embodiments, a block represents a groups of connected memory cells as the memory cells of a block share a common set of word lines. For example, the word lines for a block are all connected to all of the vertical NAND strings for that block. Although FIG. 4A shows four planes, more or less than four planes can be implemented. In some embodiments, memory structure 202 includes eight planes.

Figure 4B:
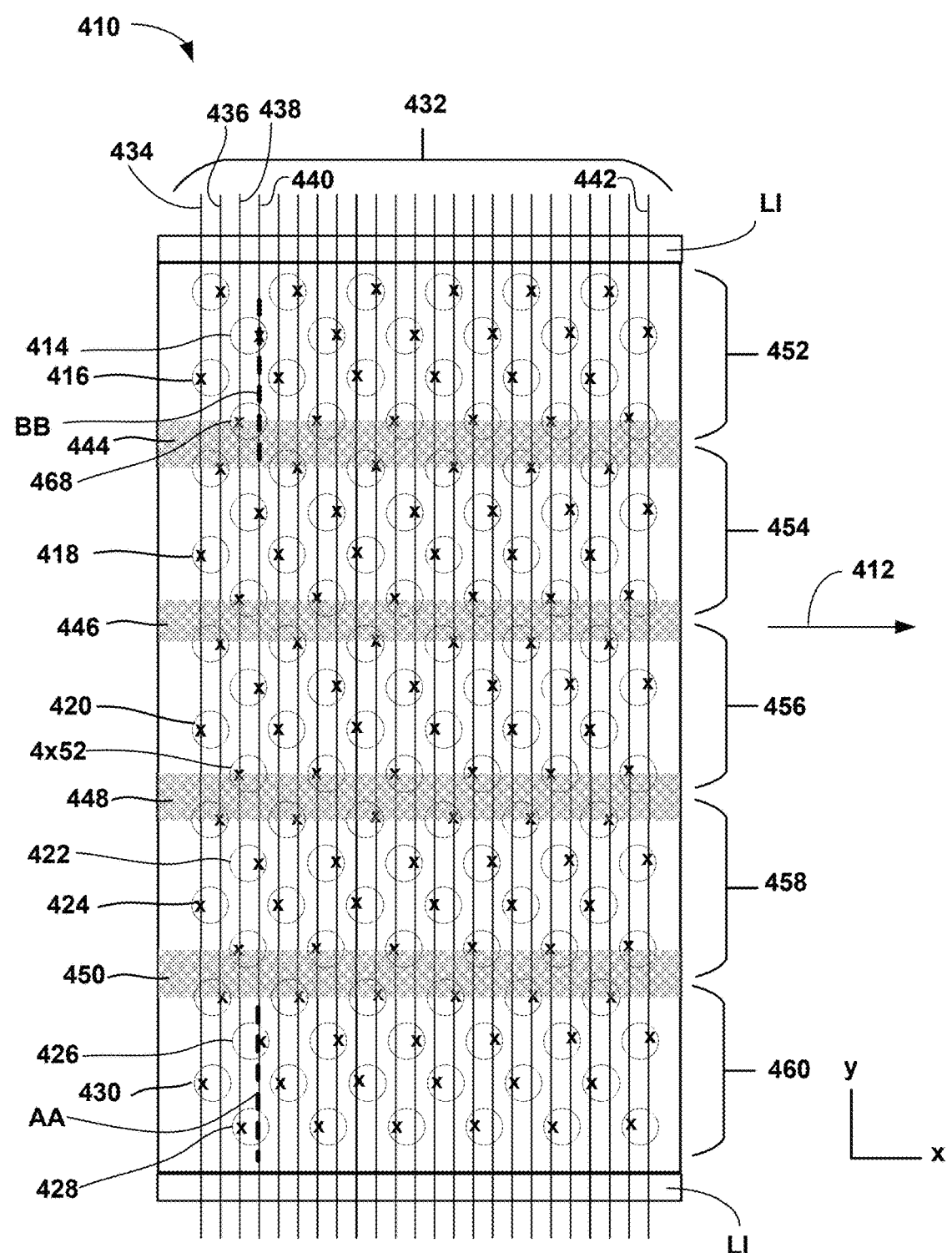
FIG. 4B depicts a top view of a portion of one embodiment of a block of memory cells.

FIGS. 4B-4F depict an example three dimensional ("3D") NAND structure that corresponds to the structure of FIG. 3 and can be used to implement memory structure 202 of FIGS. 2A and 2B. FIG. 4B is a block diagram depicting a top view of a portion 410 of Block 2 of plane 402. As can be seen from FIG. 4B, the block depicted in FIG. 4B extends in the direction of 412. In one embodiment, the memory array has many layers. However, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 414, 416, 418. 420, 422, 424, 426, 428 and 430.

FIG. 4B also depicts a set of bit lines 432, including bit lines 434, 436, 438, 440, 442. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 434 is connected to memory holes/vertical columns 416, 418, 420, 424 and 430.

The block depicted in FIG. 4B includes a set of isolation regions 444, 446, 448 and 450, which are formed of SiO$_2$. However, other dielectric materials also can be used. Isolation regions 444, 446, 448 and 450 serve to divide the top layers of the block into five regions For example, the top layer depicted in FIG. 4B is divided into regions 452, 454, 456, 458 and 460.

In one embodiment, the isolation regions only divide the layers used to implement select gates so that NAND strings in different regions can be independently selected. In one example implementation, a bit line connects to one memory hole/vertical column/NAND string in each of regions 452, 454, 456, 458 and 460. In that implementation, each block has twenty four rows of active columns and each bit line connects to five rows in each block.

In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 452 and 460.

Although FIG. 4B shows each region 452, 454, 456, 458 and 460 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block.

FIG. 4B also shows the memory holes/vertical columns being staggered. In other embodiments, different patterns of staggering can be used. In some embodiments, the memory holes/vertical columns are not staggered.

Figure 4C:
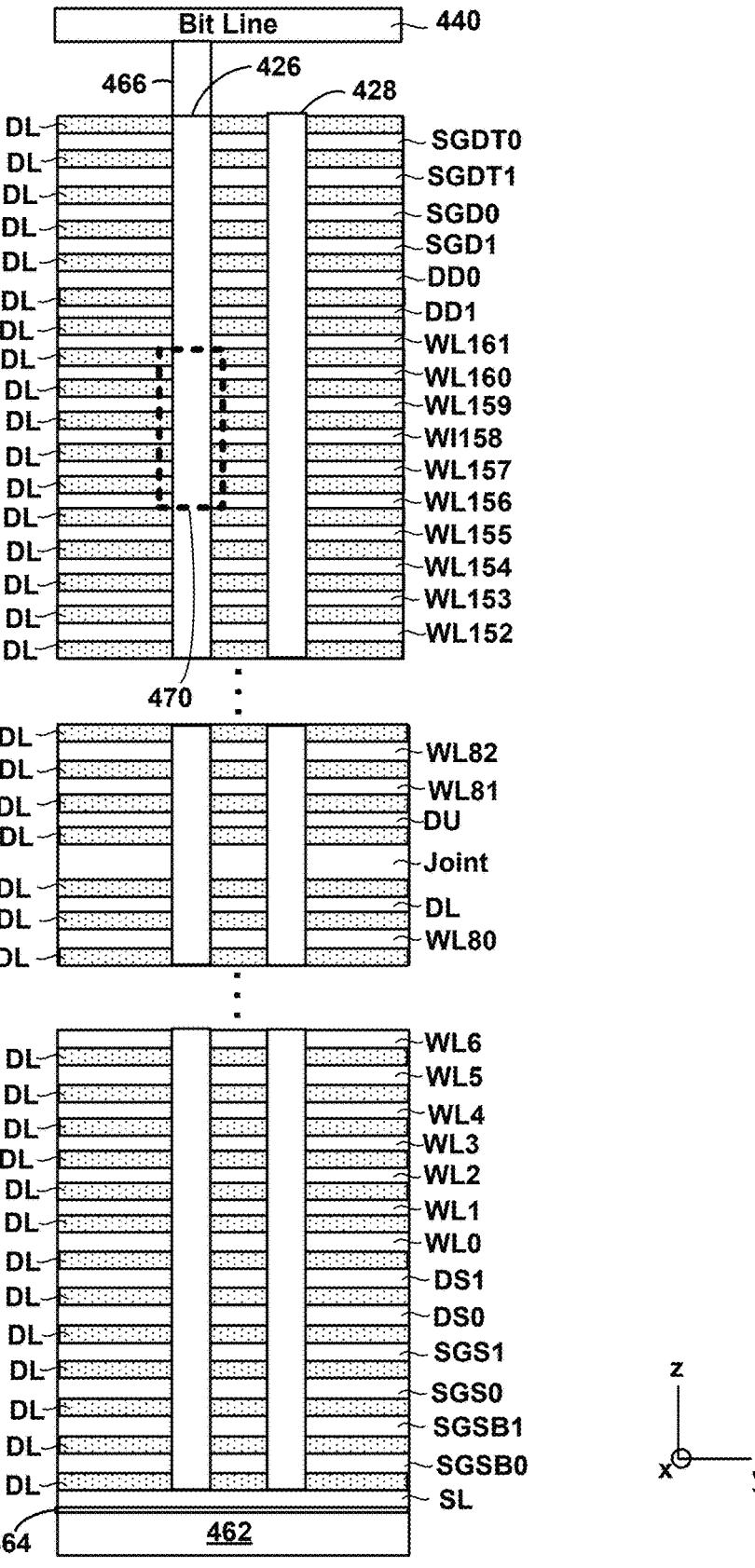
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 426 and 428 of region 460 (see FIG. 4B).

The structure of FIG. 4C includes two drain side select layers SGD0 and SGD, the source side select layers SGS0 and SGS1, two drain side GIDL generation transistor layers SGDT0 and SGDT1, two source side GIDL generation transistor layers SGSB0 and SGSB1, two drain side dummy word line layers DD0 and DD1, two source side dummy word line layers DS0 and DS1, dummy word line layers DU and DL, one hundred and sixty two word line layers WL0-WL161 for connecting to data memory cells, and dielectric layers DL.

Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGS devices (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three.

Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL.

For example, the GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 426 and 428 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 462, an insulating film 464 on the substrate, and source line SL. The NAND string of memory hole/vertical column 426 has a source end at a bottom of the stack and a drain end at a top of the stack. As in agreement with FIG. 4B, FIG. 4C show vertical memory hole/column 426 connected to bit line 440 via connector 466.

For ease of reference, drain side select layers, source side select layers, dummy word line layers, GIDL generation transistor layers and data word line layers collectively are referred to as conductive layers.

In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from SiO$_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells.

A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
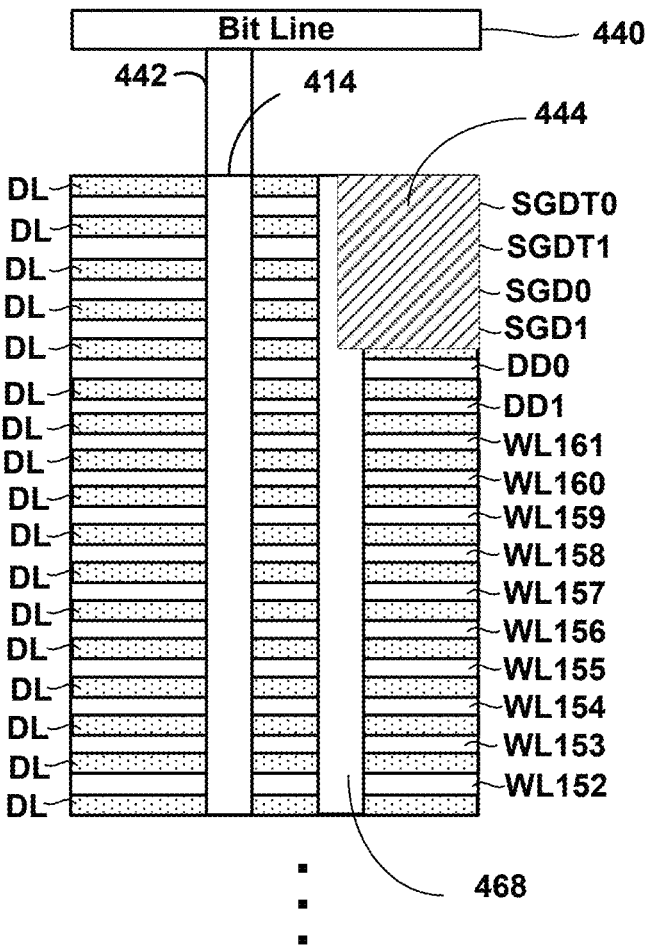
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 414 and 468 of region 452 (see FIG. 4B). FIG. 4D shows the same alternating conductive and dielectric layers as FIG. 4C.

FIG. 4D also shows isolation region 444. Isolation regions 444, 446, 448 and 450) occupy space that would have been used for a portion of the memory holes/vertical columns/ NAND stings. For example, isolation region 444 occupies space that would have been used for a portion of memory hole/vertical column 468. More specifically, a portion (e.g., half the diameter) of vertical column 468 has been removed in layers SGDT0, SGDT1, SGD0, and SGD1 to accommodate isolation region 444.

Thus, while most of the vertical column 468 is cylindrical (with a circular cross section), the portion of vertical column 468 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 452, 454, 456, 458, and 460.

Figure 4E:
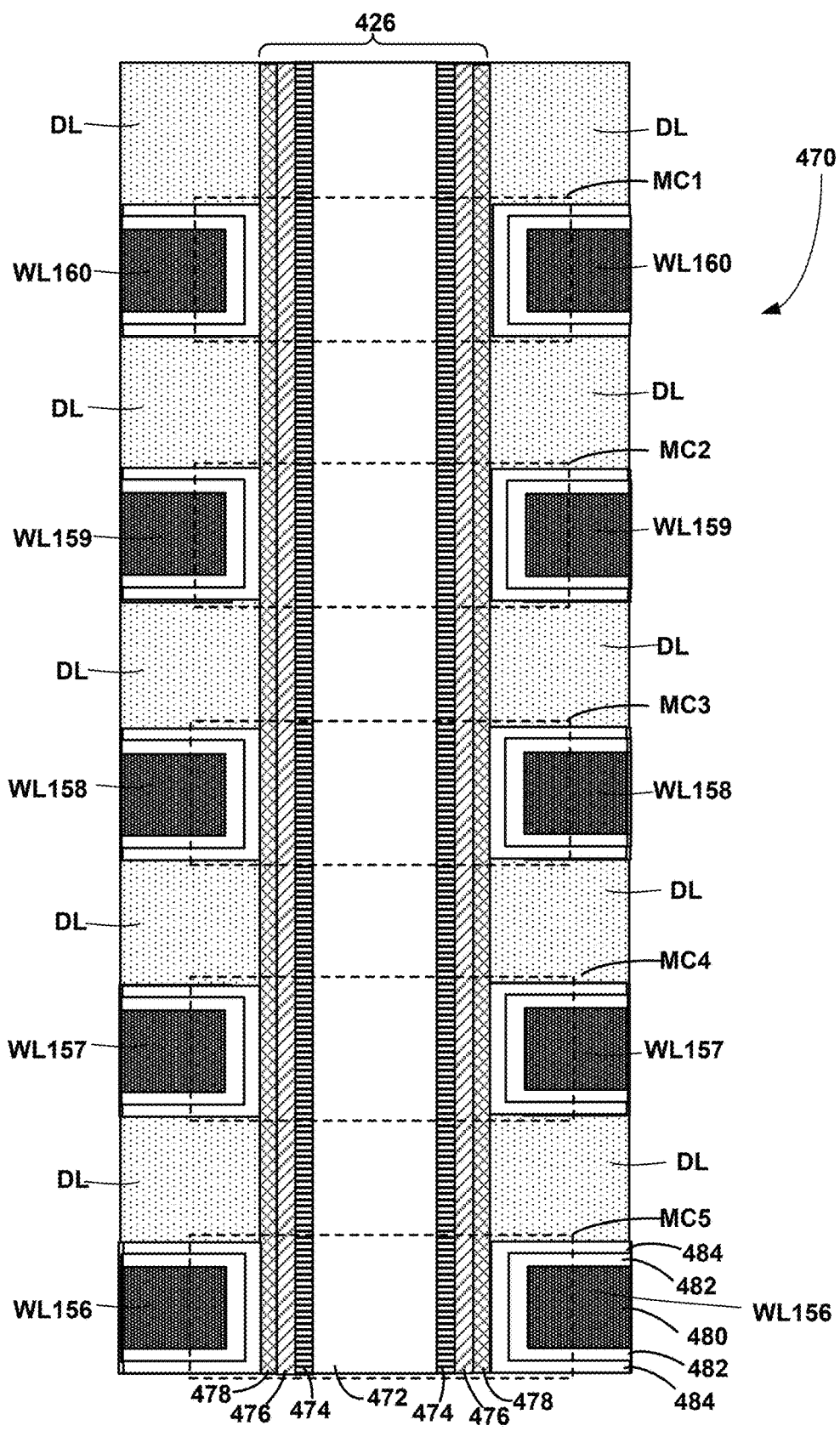
FIG. 4E is a cross sectional view of one embodiment of a vertical column of memory cells.

FIG. 4E depicts a cross sectional view of region 470 of FIG. 4C that includes a portion of memory hole/vertical column 426. In one embodiment, the memory holes/vertical columns are round. However, in other embodiments other shapes can be used. In one embodiment, memory hole/ vertical column 426 includes an inner core layer 472 that is made of a dielectric, such as $SiO_2$. Other materials can also be used.

Surrounding inner core 472 is polysilicon channel 474. Materials other than polysilicon can also be used. Note that it is the channel 474 that connects to the bit line and the source line. Surrounding channel 474 is a tunneling dielectric 476. In one embodiment, tunneling dielectric 476 has an ONO structure. Surrounding tunneling dielectric 476 is charge trapping layer 478, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 480 surrounded by an aluminum oxide layer 482, which is surrounded by a blocking oxide layer 484. In other embodiments, the blocking oxide layer can be a vertical layer parallel and adjacent to charge trapping layer 478. The physical interaction of the word line layers with the vertical column forms the memory cells.

Thus, in one embodiment a memory cell includes channel 474, tunneling dielectric 476, charge trapping layer 478, blocking oxide layer 484, aluminum oxide layer 482 and word line region 480. For example, word line layer WL160 and a portion of memory hole/vertical column 426 comprise a memory cell MC1. Word line layer WL159 and a portion of memory hole/vertical column 426 comprise a memory cell MC2. Word line layer WL158 and a portion of memory hole/vertical column 426 comprise a memory cell MC3. Word line layer WL157 and a portion of memory hole/ vertical column 426 comprise a memory cell MC4. Word line layer WL156 and a portion of memory hole/vertical column 426 comprise a memory cell MC5. In other architectures, a memory cell may have a different structure; however, the memory cell would still be the storage unit.

When a memory cell is programmed, electrons are stored in a portion of the charge trapping layer 478 which is associated with (e.g. in) the memory cell. These electrons are drawn into the charge trapping layer 478 from the channel 474, through the tunneling dielectric 476, in response to an appropriate voltage on word line region 480. The threshold voltage (Vth) of a memory cell is increased in proportion to the amount of stored charge.

In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
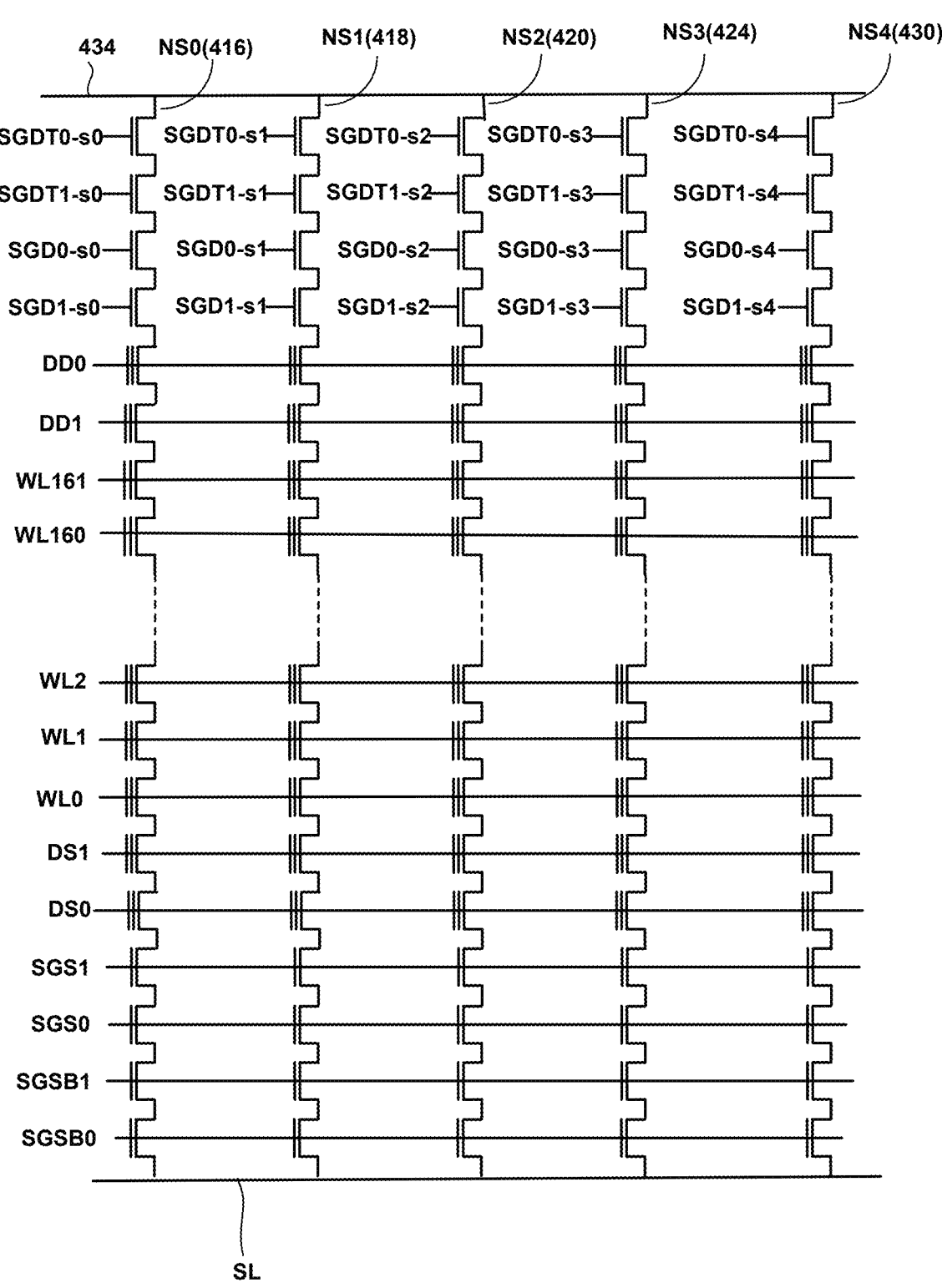
FIG. 4F is a schematic of a plurality of NAND strings in multiple regions of a same block.

FIG. 4F is a schematic diagram of a portion of the three dimensional memory array 202 depicted in in FIGS. 4A-4E. FIG. 4F shows physical data word lines WL0-WL161 running across the entire block. The structure of FIG. 4F corresponds to a portion 410 in Block 2 of FIG. 4A, including bit line 434. Within the block, in one embodiment, each bit line is connected to five NAND strings, one in each region of regions 452, 454, 456, 458, 460.

Thus, FIG. 4F shows bit line 434 connected to NAND string NS0 (which corresponds to memory hole/vertical column 416 of region 452), NAND string NS1 (which corresponds to memory hole/vertical column 418 of region 454), NAND string NS2 (which corresponds to vertical column 420 of region 456), NAND string NS3 (which corresponds to memory hole/vertical column 424 of region 458), and NAND string NS4 (which corresponds to memory hole/vertical column 430 of region 460).

Drain side select line/layer SGD0 is separated by isolation regions isolation regions 444, 446, 448 and 450 to form SGD0-s0, SGD0-s1, SGD0-s2, SGD0-s3 and SGD0-s4 in order to separately connect to and independently control regions 452, 454, 456, 458, 460.

Similarly, drain side select line/layer SGD1 is separated by isolation regions 444, 446, 448 and 450 to form SGD1-s0, SGD1-s1, SGD1-s2, SGD1-s3 and SGD1-s4 in order to separately connect to and independently control regions 452, 454, 456, 458, 460.

Drain side GIDL generation transistor control line/layer SGDT0 is separated by isolation regions 444, 446, 448 and 450 to form SGDT0-s0, SGDT0-s1, SGDT0-s2, SGDT0-s3 and SGDT0-s4 in order to separately connect to and independently control regions 452, 454, 456, 458, 460.

Drain side GIDL generation transistor control line/layer SGDT1 is separated by isolation regions 444, 446, 448 and 450 to form SGDT1-*s0*, SGDT1-*s1*, SGDT1-*s2*, SGDT1-*s3* and SGDT1-*s4* in order to separately connect to and independently control regions 452, 454, 456, 458, 460.

FIG. 4F only shows NAND strings connected to bit line 434. However, a full schematic of the block would show every bit line and five vertical NAND strings (that are in separate regions) connected to each bit line.

Although the example memories of FIGS. 4A-4F are three dimensional memory structures that include vertical NAND strings with charge-trapping material, other (2D and 3D) memory structures can also be used with the technology described herein.

Figure 5:
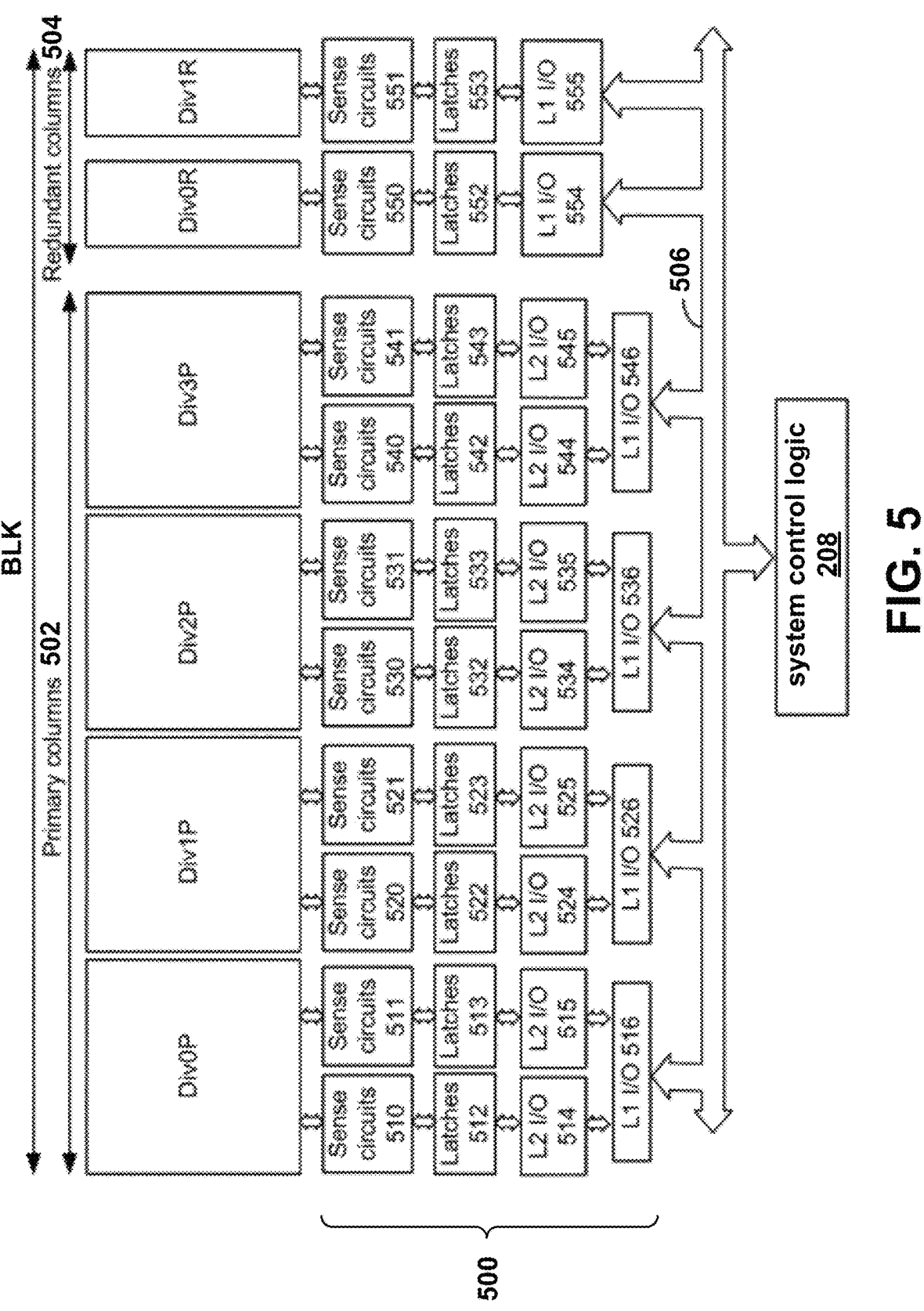
FIG. 5 depicts an example configuration of the block of FIG. 4F where the NAND strings are arranged in divisions for primary columns and redundant columns.

FIG. 5 depicts an example configuration of FIG. 4F and associated access circuitry 500 where the NAND strings are arranged in divisions for primary columns and redundant columns. Since a block can typically include thousands of NAND strings, it may be convenient to divide the block into divisions. Each division in turn includes many columns. Where a column intersects a group of word lines, a word is stored at each such intersection of a column and a group of word lines.

For example, with a 16-bit word, there are 16 NAND strings in a column. The block can be divided into primary columns 502 and redundant columns 504. In an embodiment, each of primary columns 502 and redundant columns 504 has a corresponding address. A primary column is a column which does not replace a defective column but is intended to be used to store data as long as it is not defective. A redundant column (replacement column) replaces a defective primary column.

A primary column can be deemed defective if one or more of its NAND strings are defective (e.g., more than a predetermined number of errors), for example, or if one or more bit lines of the column is defective (e.g. broken or with high resistance), or for some other reason. The number of redundant columns is much less than the number of primary columns, e.g., <1% of the number of primary columns.

In this example, there are four divisions of primary columns, Div0P-Div3P, and two divisions of redundant columns, Div0R and Div1R. The number of columns per division is less for the redundant column divisions than for the primary column divisions. As a result, the input/output circuits for the redundant column divisions may have a lower degree of parallelism than the input/output circuits for the primary column divisions.

The parallelism of the primary column divisions is represented by two levels of input/output circuits, including a first level L1 and a second level L2, in this example. For the primary columns, the first level includes a first set of input/output circuits 516, 526, 536 and 546, with one input/output circuit per division, and the second level includes a second set of input/output circuits 514, 515, 524, 525, 534, 535, 544 and 545, with two input/output circuits per division.

Input/output circuits are connected to system control logic 208 by bus 506. This is an example of a pipeline in which two units of data are received by one L1 input/output circuit are transferred to two L2 input/output circuits, one unit per L2 input/output circuit. That is, one half of the data is handled by one L2 input/output circuit and the other half is handled by another L2 input/output circuit.

In other examples, the primary column divisions have more than two levels of input/output circuits, or may have only one level of input/output circuits. Each L2 I/O circuit is associated with, and connected to, a set of input/output latches. For example, the L2 input/output circuits 514, 515, 524, 525, 534, 535, 544 and 545 are associated with sets of latches 512, 513, 522, 523, 532, 533, 542 and 543, respectively, which in turn are associated with, and connected to, sets of sense circuits 510, 511, 520, 521, 530, 531, 540 and 541, respectively.

Figure 10:
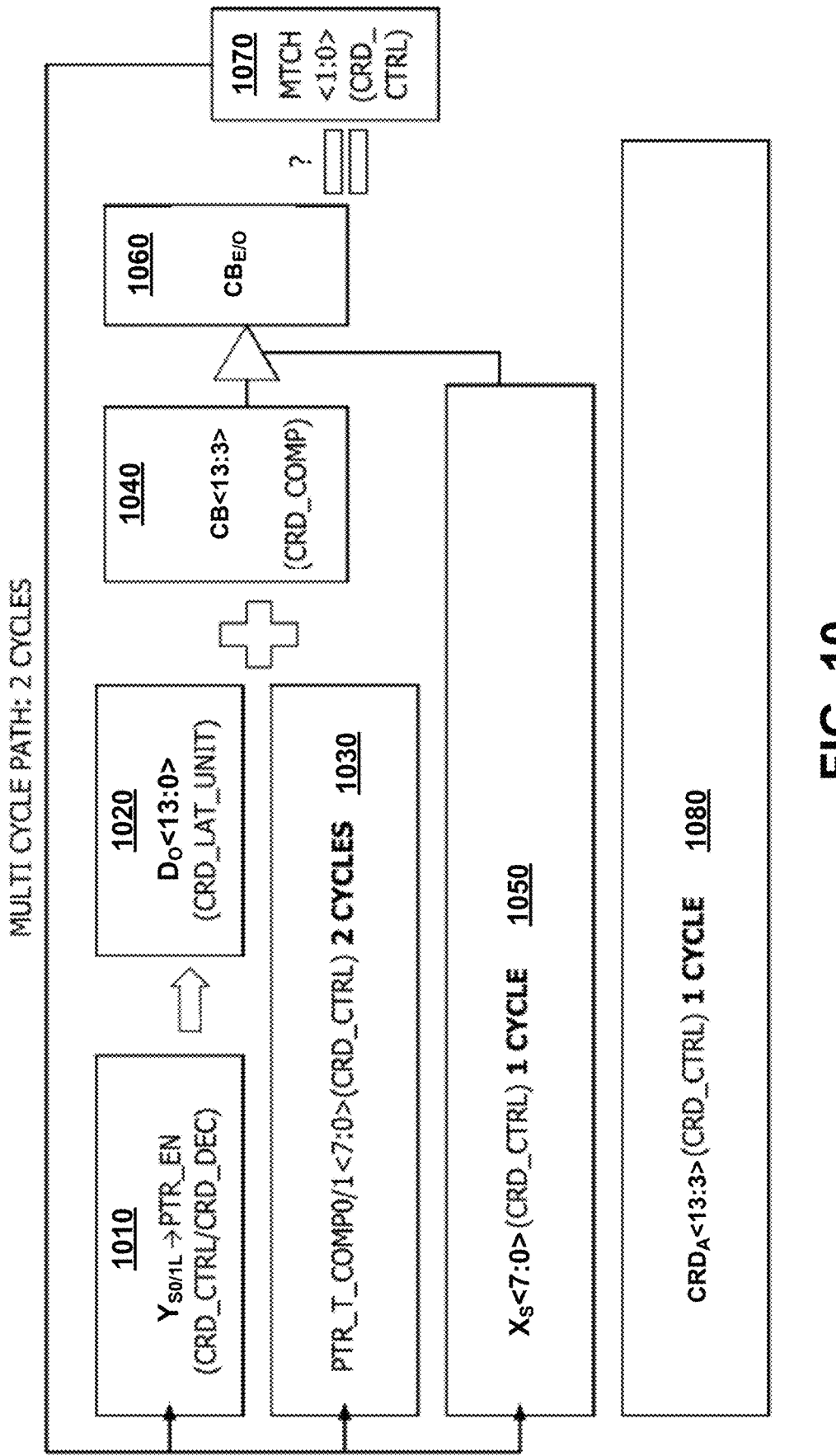
FIG. 10 is a flowchart showing the timing of the multi-cycle and single-cycle paths of the dynamic skip calculation process.

The input/output circuits of the redundant column divisions are represented by a first level L1. The first level includes a first set of L1 input/output circuits 554 and 555 associated with sets of latches 552 and 553 respectively, which in turn are associated with, and connected to, sets of sense circuits 550, 551 respectively. It will be understood that FIG. 10 illustrates a detailed example and that the present technology is applicable to a wide range of other examples that do not include the features shown Memory redundancy techniques may offer an effective solution for addressing memory array failures that arise during or after manufacturing. Though column redundancy techniques are discussed specifically herein, techniques may be developed for both columns and rows, or a combination of both.

A column redundancy technique may include a "shifting" or "skipping" operation and an arrangement by which a skipped column may be replaced by a spare column. As used herein, the terms "defective column" and "bad column" may be used interchangeably to refer to columns in which failures have occurred.

In a column skipping operation, the locations of bad columns in physical memory may be detected, recorded, and ignored during read and write operations. In embodiments providing for spare columns, a particular number of redundant columns may be made available to repair column failures.

If a failure is detected in a given column, a spare column may be assigned to replace the defective column, and data that would be written to, or read from, the defective column may instead be written to, or read from, the corresponding spare column.

In some embodiments of a memory array, the cells may be further arranged in a plurality of divisions. A division may be a higher-level abstraction of the column. In one example, a division may include a set of 16 columns, though it may be appreciated that other embodiments of a division may have a greater or lesser number of columns.

A set of divisions also may be coextensive with the structure of an array. For instance, divisions may collectively encompass all columns of an array such that all columns in the array are divided among each of the divisions, and the word lines of each row may span across all divisions.

User data may be stored in each of the divisions in a sequential manner. User data may be segmented into words of two bytes in length, and each word may have consecutive logical addresses. Successive words may be fed into columns of each division upon transitioning of a clock signal.

For instance, for a memory cell array having five divisions DIV0, DIV1, DIV2, DIV3, and DIV4, a first word may be loaded into a first column of DIV0, a second word may be loaded into a first column of DIV1, and so on until the words of the data are distributed among all of the columns. Upon storing a word in the last division DIV4, a next word of the data may be stored in a second column of the division DIV0, and subsequent words of data may be stored in second columns of the divisions accordingly.

Each of the divisions of the memory array may have peripheral circuitry enabling columns of each division to be accessed. For example, data busses may permit transfer of user data into or latches of the columns. Persons of ordinary skill in the art will understand that other embodiments may provide for an array having more or fewer divisions.

During manufacturing, testing of memory chips may be performed to assess the presence of defects. Upon determining the location of defects in the memory (e.g., at a particular column) data may be generated to track the addresses where such defects arise. In some embodiments, the data may include logical addresses and/or physical addresses of the defective columns. This data may be stored for example, in an array of latches on the same memory chip, in a partitioned area of the chip, or in some other external memory location.

In embodiments, defect data may be generated via on-chip logic by using a built-in-self-test (BIST) mechanism, which may provide a chip with defect detection capabilities useable after shipping. In some embodiments, memory defect data may be generated using both the defect data present during shipping as well as defect data generated during operational of the chip.

After column defects are detected and the corresponding bad column addresses are latched, column redundancy techniques may be used to ignore bad addresses during read or write operations. A column skipping process may be divided into two parts: (1) calculating a number of initial columns to skip, and (2) subsequently determining, on a dynamic basis with respect to a clock, to skip over additional columns based on the latched bad column data. The following paragraphs provide an overview of the initial skip and dynamic skip calculations. In some embodiments a column skipping process may include just one of the above parts.

In calculating an initial skip value, the initial number of columns to be skipped may be determined based on a number of bad columns in a sector of memory cells. For example, an input column address at which a controller wishes to read-out user data or write user data may be shifted based on a bad column index. The bad column index may be determined based on a number of bad column addresses stored within a column redundancy data (CRD) array.

Logic configured to perform this operation may compare the input column address with bad column addresses stored at each of the latches. The logic may determine the first latch for which the stored bad column address is greater than the input column address, and the index corresponding to this latch may be used to advance a starting address for which to begin performing the dynamic skipping procedure.

The comparison of the incoming address with the bad column addresses may be performed by embedded circuitry at each of the latches, or may be performed by a centralized controller or other dedicated circuitry located, for example, in a column redundancy block.

During the dynamic skip procedure, the starting column address may be compared against one or multiple stored bad column addresses. The starting column address may be incremented dynamically based on a clock signal such that at each successive clock interval, a new address is delivered to the comparison logic The incremented starting column addresses may have consecutive logical column addresses that may not correspond to consecutive physical locations in memory. The starting column address may be incremented automatically regardless of whether a match between the starting column address and one of the stored bad column addresses was revealed.

Upon incrementing, the comparison logic may compare the starting column address to stored addresses of bad columns. The stored bad column addresses may be read into the comparison logic from an array of CRD latches using row and column pointers and busses.

The pointers may then operate in concert to select the appropriate latch storing a bad column address. Taking into account whether any of the compared bad column addresses match the starting address, the pointers may be updated to select a new bad column address or addresses for comparison in the following clock cycle.

Figure 6:
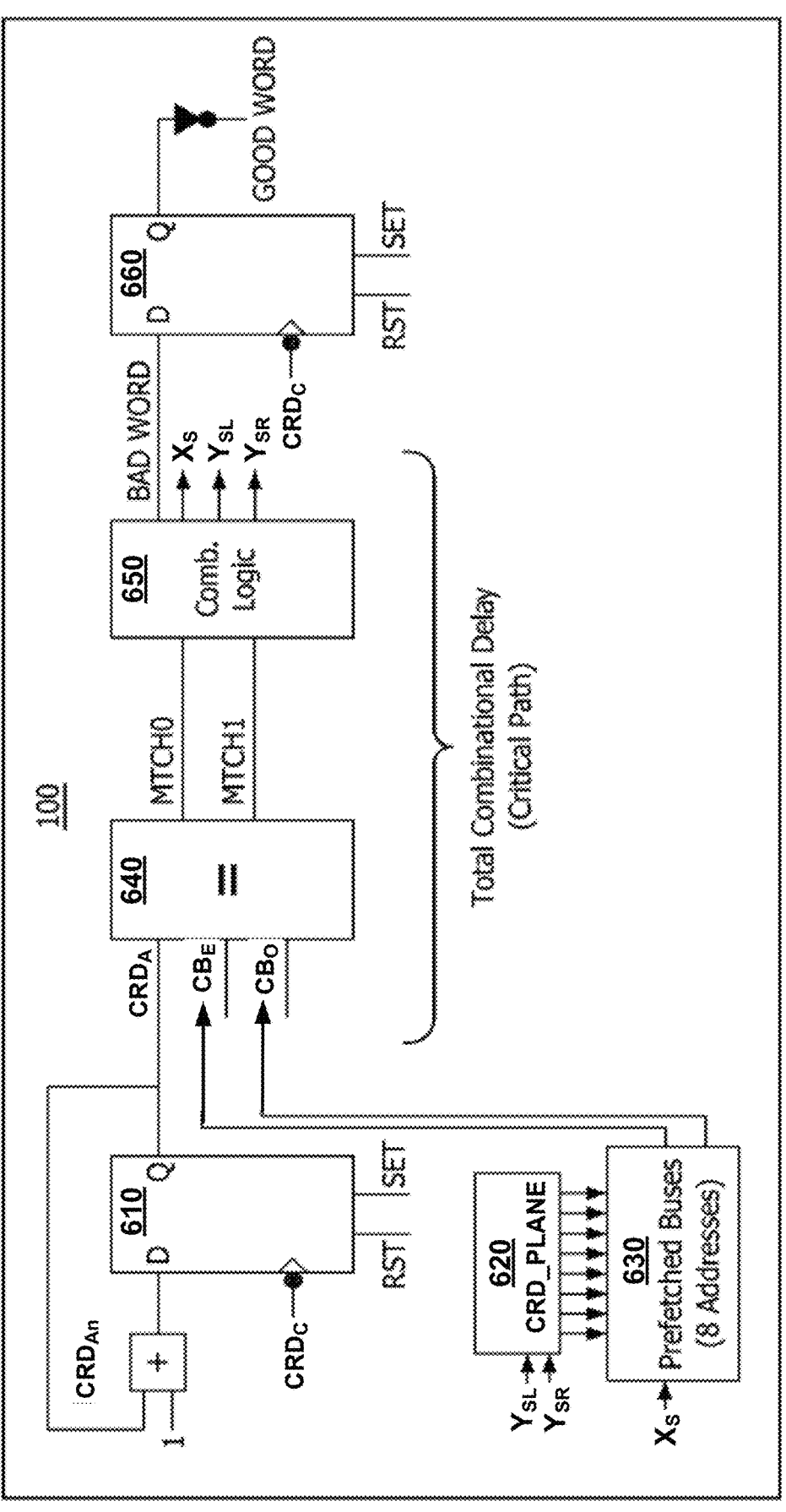
FIG. 6 depicts column redundancy logic configured to perform a dynamic column skip calculation.

FIG. 6 provides a broad overview of a column redundancy system 100 configured to perform the dynamic skip calculation. As shown, column redundancy system 100 may be driven by a CRD clock signal (referred to herein as "the $CRD_C$ clock"). Following an initial skip calculation, an input column address $CRD_A$ to be compared against stored bad column addresses may be incremented dynamically based on the $CRD_C$ clock such that at each successive clock interval, a new input column address $CRD_A$ is delivered to the comparison logic. Flip-flop 610 may be configured to pass the incremented input column address $CRD_A$ to a comparator 640 at a transition of the $CRD_C$ clock.

Comparator 640 may include one or more comparators depending on the configuration of the column redundancy circuit. Comparator 640 compares input column address $CRD_A$ to the stored addresses of bad columns, including an even bad column address $CB_E$ and an odd bad column address $CB_O$. The even bad column address $CB_E$ and odd bad column address $CB_O$ may be read into the comparator 640 from an array of CRD latches, shown at CRD_PLANE, using a series of row pointers $Y_{SL}$ and $Y_{SR}$, and column pointer $X_S$, and prefetch busses 630. In particular, row pointers $Y_{SL}$ and $Y_{SR}$, and column pointer $X_S$ may be used to select one or more latches storing bad column addresses.

In some embodiments, input column address $CRD_A$ may be compared against one or more of even bad column address $CB_E$ and odd bad column address $CB_O$ at once, depending upon of the number of column addresses that may be skipped or the number of column redundancies supported.

Upon determining that an input column address $CRD_A$ matches one of even bad column address $CB_E$ and odd bad column address $CB_O$, comparator 640 may generate outputs equal to the number of bad column addresses used in the comparison. Based on the generated outputs, it may be determined that input column address $CRD_A$ corresponds to a bad column address and to skip over that column. In some embodiments, comparator 640 may determine that input column address $CRD_A$ is not bad and that a read or write operation may be performed at input column address $CRD_A$.

In the embodiment depicted in FIG. 6, it may be assumed that two column addresses may be skipped, though in other embodiments, the maximum number of columns that may be skipped may be less than or greater than two. Thus, as shown, two bad column addresses—even bad column address $CB_E$ and odd bad column address $CB_O$—are compared to input column address $CRD_A$ at each clock cycle.

Upon determining whether input column address $CRD_A$ matches even bad column address $CB_E$ and/or odd bad column address $CB_O$, comparator 640 may generate a number of match outputs. The number of match outputs may be equal to the number of bad column addresses used in the comparison. The match outputs may be one-bit outputs such that a match between input column address $CRD_A$ and even bad column address $CB_E$ and/or odd bad column address $CB_O$ results in a one-bit output of '1' for the corresponding bad column.

For example, in the embodiments pictured in FIG. 6, comparator 640 generates MTCH0 and MTCH1 following the comparison, where MTCH0 corresponds to a match between input column address $CRD_A$ and odd bad column address $CB_O$, and MTCH1 corresponds to a match between input column address $CRD_A$ and even bad column address $CB_E$.

If comparator 640 determines that input column address $CRD_A$ matches odd bad column address $CB_O$, comparator 640 may output MTCH0=1 and MTCH1=0. If comparator 640 determines that input column address $CRD_A$ the CRD matches even bad column address $CB_E$, comparator 640 may output MTCH0=0 and MTCH1=1. If input column address $CRD_A$ matches neither even bad column address $CB_E$, or odd bad column address $CB_O$, comparator 640 may output MTCH0=0 and MTCH1=0.

Bad column addresses to which input column address $CRD_A$ is compared may be selected from a series of latch units in CRD_PLANE 610 using row pointers $Y_{SL}$ and $Y_{SR}$. Each latch unit may be located at an intersection between a row and a column, and each latch unit may store a single column address. In an embodiment, comparator 640 may compare input column address $CRD_A$ with two bad column addresses in an iterative fashion.

Addresses for two rows may be read from the CRD_PLANE 610 at a given time, and each row may contain four columns. Thus, a series of eight selected addresses may be prefetched using prefetch busses 630, and two latches among the rows, one even-numbered and one odd-numbered, may be selected using the column pointer $X_S$. The addresses stored at the even-numbered and odd-numbered latches may be communicated to comparator 640 by $CB_E$ and $CB_O$, respectively.

Following comparison of input column address $CRD_A$ with $CB_E$ and $CB_O$, MTCH0 and MTCH1 may be processed by combinational logic 650 to update the row and column pointers. In addition, combinational logic 650 may generate an output BAD_WORD in the case either MTCH0 or MTCH1 are high. The output may be latched at 660 for use in other processes.

In some embodiments, bad column addresses stored in CRD latches may be indexed addresses converted from non-indexed column addresses for use in the comparison operation. The bit sequences used to indicate indexed and non-indexed addresses may be expressed by a range of bits, <X:Y>. A bit range <X:Y> may indicate a position of a most significant bit (or a left-most bit), X, and a position of the least significant bit (or a right-most bit), Y.

For a non-indexed address mode, an entire bit sequence may be used to individually indicate the address of each column. For example, a bit sequence corresponding to a non-indexed column address of length 14 bits may be indicated by the range <13:0>, where the most significant bit of the transferred bit sequence is at position 13, and the least significant bit of the sequence is at position 0. In a division-based CRD technique, non-indexed addresses may increment without regard to the position of the columns within the divisions.

For an indexed address, the configuration of the bit sequence may be different. In a division-based CRD technique where the columns of an array are divided among multiple divisions, a first portion of the address bits may be used to refer to a position of a column without specifying the division in which the column resides, while a second range of the bit sequence may provide the division information. Using the example of a 14-bit address as introduced above in the context of a five-division technique, the position of the column may be indicated by the 11 most significant bits <13:3> and the 3 least significant bits <2:0> may indicate one of the five divisions of the array in which the column resides.

Additionally, the indexed address may be used to refer to a range of consecutive columns among the divisions. As described above, data may be read from or written to consecutive columns among the divisions. For instance, when a read or write operation is performed, data may be converted into a number of packets equal to the number of divisions, and each packet may have a number of bits corresponding to the length of a column word.

Each packet may be loaded into or read from an array at once. Thus, given an array with five divisions and column word length of 16 bits, a total of 80 bits may be written to or read from the array in a single clock cycle. Furthermore, the location or column address at which data is to be read or written may be determined based on the initial address.

For example, a first 16-bit packet may be loaded into a first column, a second 16-bit packet may be loaded into a second column, and so on. Passing the column position using the starting column address only, e.g., a first portion of the address bits, may allow loading of multiple column addresses in a single clock cycle.

Data from multiple-column address may include, for example, one column of each successive division. Accordingly, the indexed addresses may facilitate comparisons between one or more incoming column address and multiple successive column addresses.

To perform the indexing operation, one or more conversion formulas or equations may be applied to the non-indexed addresses. For instance, the conversion formula may perform integer division on the non-indexed address using the number of divisions in the array to determine the starting or initial address at which the data is located.

This information may be indicated by a first bit range, for example, as described in examples above. Further, the formula may use a modulus or a remainder of the integer division operation to determine a corresponding division for each column. Such information may be indicated by a second bit range as described above.

Figure 7:
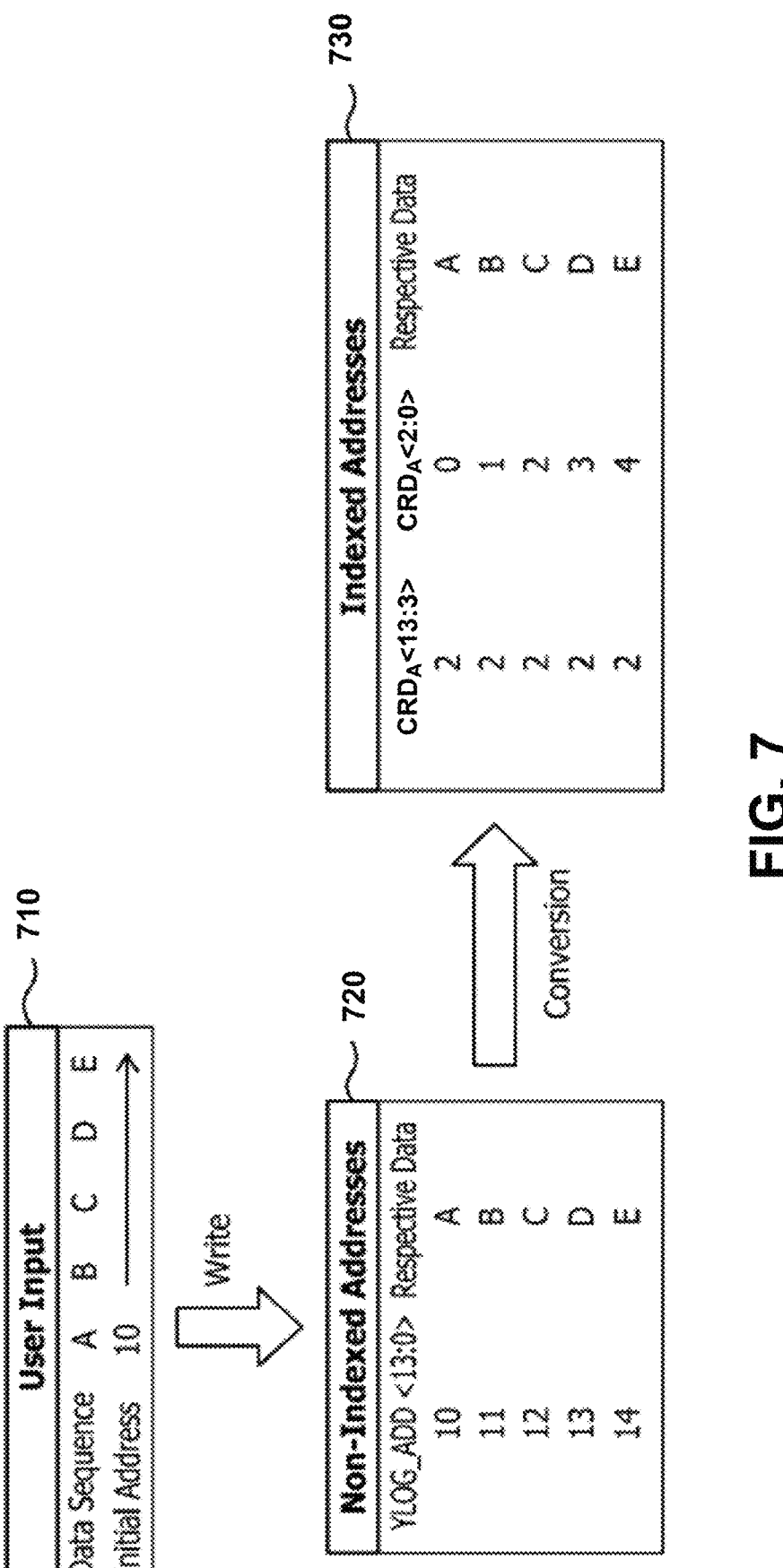
FIG. 7 portrays an example of an indexing operation for addresses of a five-division array.

FIG. 7 portrays an example of an indexing operation for addresses of a five-division array. As shown, at 710 user data may be fed into a memory circuit, and packetized according to the number of divisions and the column word length as indicated above. Such packets may be loaded into a memory array beginning at a starting column address.

For simplicity, the starting column address 10 is expressed here in decimal form, and the column address 10 may store a first element of a data sequence, 'A'. Following a write operation, subsequent data packets may be loaded into columns substantially as shown at 720. Remaining elements of the data sequence 'B', 'C', 'D', and 'E' may be written to successive column addresses 11, 12, 13, and 14. The non-indexed addresses may be given by YLOG_ADD, which may comprise a 14-bit sequence <13:0>.

As shown at 730, the non-indexed addresses may be converted into indexed addresses via application of two conversion formulas. As depicted, the conversion formula may perform integer division on the non-indexed address, YLOG_ADD <13:0> to obtain an initial or starting column address to be stored at input column address $CRD_A$<13:3>.

In the case of a five-division system as shown, the non-indexed address may be divided by 5. A first conversion formula may be expressed as input column address $CRD_A$<13:3>=YLOG_ADD/5. For non-indexed column addresses of 10, 11, 12, 13, and 14, respective data 'A', 'B', 'C', 'D', and 'E' may each therefore be respectively stored in the third column, 2, of each division.

A second conversion formula may be used to indicate such division information for each respective data element of the stored data sequence. As shown, the division data may be determined by performing a modulo-N operation on the non-indexed address, where N is equal to the number of divisions in the array.

Thus, the second conversion formula may be expressed as input column address $CRD_A<2:0>=YLOG\_ADD$ % 5. As shown, for non-indexed column addresses of 10, 11, 12, 13, and 14, the respective divisions in which 'A', 'B', 'C', 'D', and 'E' are stored may be indicated by input column address $CRD_A<2:0>$.

In another embodiment characterized by a four-division array, the formulas may be expressed in a similar fashion. For example, a first conversion formula may be expressed as input column address $CRD_A<13:2>=YLOG\_ADD/4$, and a second formula may be expressed as input column address $CRD_A<1:0>=YLOG\_ADD$ % 4.

In this example, as the array has four divisions rather than five, only two bits <1:0> are needed to indicate the division information for each column address. Persons of ordinary skill in the art may appreciate that a greater or lesser number of bits may be used to indicate such information for arrays having a greater or lesser number of divisions.

Figure 8:
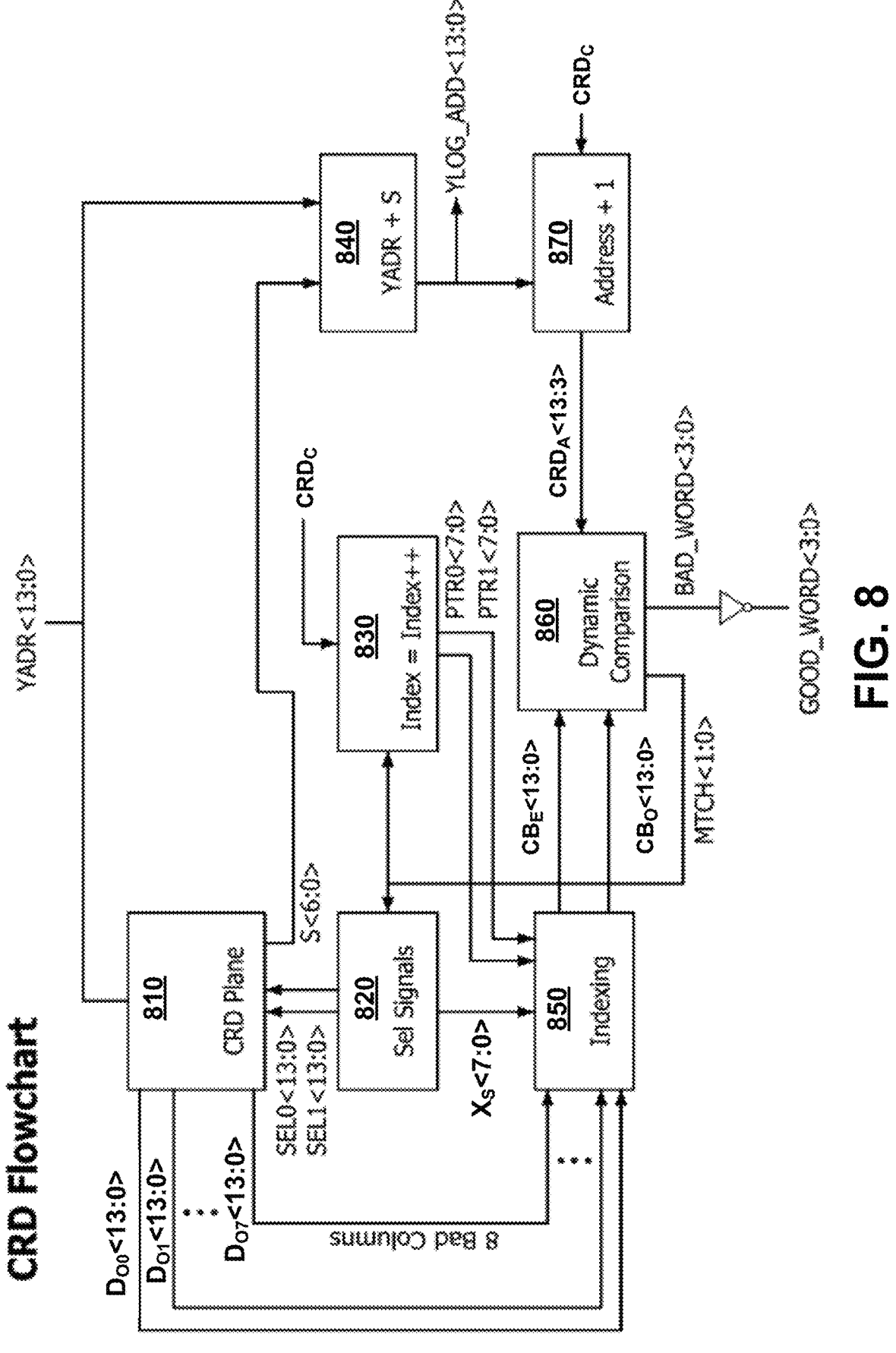
FIG. 8 provides a detailed example of a column redundancy system showing the flow of address and pointer data during both initial skip and dynamic skip calculation steps.

FIG. 8 provides a more detailed example of a column redundancy circuit showing the flow of address and pointer data during both the initial skip calculation and the dynamic skip calculation. As exemplified in FIG. 8, bit sequences corresponding to each of the addresses and pointers may be communicated through the column redundancy circuit, shown schematically by arrows.

As shown, an incoming address YADR<13:0> may be input to the CRD plane 810. CRD plane 810 may determine a number of bad column addresses, S<6:0>, in the bad column array that precede the incoming address, and provide this initial skip value to initial skip logic 840. Initial skip logic 840 may increment YADR<13:0> by the number of bad column addresses S to obtain a starting address, YLOG_ADD<13:0>. Using the $CRD_C$ clock, the address may be converted to generate input column address $CRD_A<13:3>$ via an address indexing process such as one described above.

Similarly as described above, a comparator 860 may compare input column address $CRD_A<13:3>$ with bad column addresses stored at selected latches in CRD plane 810. Selection circuitry 820 may be configured to select two rows from the CRD plane 810 using selection signals SEL0<13:0> and SEL1<13:0>. The full address stored at each latch of the two rows may be read-out by busses $D_{OO}<13:0>$ through $D_{O8}<13:0>$ for indexing.

Selection circuitry 820 may be configured to indicate a column pointer $X_S<7:0>$ to select from the read-out addresses. For example, two addresses may be selected. Subsequently, an even column indexing pointer PTR0<7:0> and an odd column indexing pointer PTR1<7:0> may be added to the address or addresses selected from among Doo to Dos to generate even-numbered bad column address $CB_E<13:0>$ and odd-numbered bad column address $CB_O<13:0>$ for comparison to input column address $CRD_A<13:3>$.

Depending on whether a match is found for either the even or odd bad column addresses, the MTCH<1:0> field may be output by comparator 860, indicating to selection circuitry 820 to send updated select signals to CRD plane 810 and prefetch data from a next latch or latches, and indicating to an index incrementor module 830 to increment the even column indexing pointer PTR0<7:0> and odd column indexing pointer PTR1<7:0>.

Figure 9A:
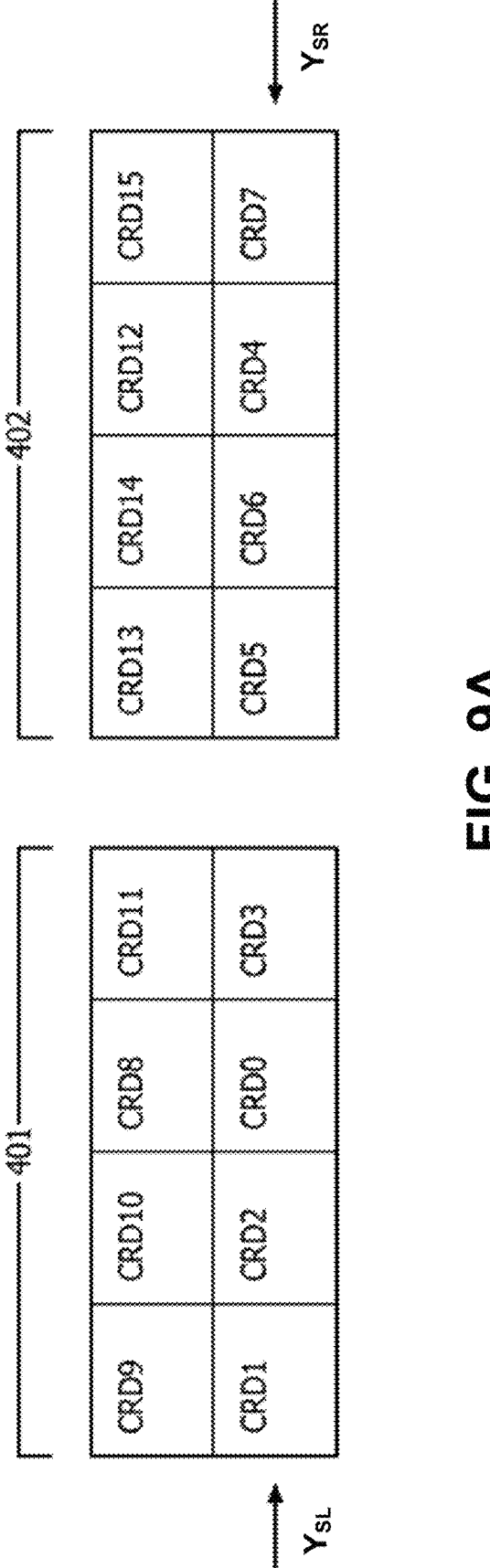
FIG. 9A depicts the arrangement of latches in the CRD plane storing bad column data.

FIG. 9A depicts an example arrangement of latches in CRD plane 810 storing bad column data. As shown, CRD plane 810 may include multiple rows, each containing eight CRD latches. A first row may contain latches CRD0 through CRD7, while a second may contain latches CRD8 through CRD 15.

Though not shown in FIG. 9A, the CRD latches themselves may be identified by CRD_LAT_UNIT, e.g., CRD_LAT_UNIT0 through CRD_LAT_UNIT15. Each of the rows of CRD plane 810 may increment from the bottom row, moving upwards. For example, a bottom row may be referenced as row 0, the row above may be referenced as row 1, the row above may be referenced as row 2, and so on.

In an embodiment, CRD plane 810 may include two halves: a left half 401 providing the first four latches of each row, and a right half 402 providing the second four latches of each row. As described above with respect to FIG. 6, row pointers $Y_{SL}$ and $Y_{SR}$ may correspond, respectively, to the left and right halves 401 and 402 of CRD plane 810.

The latches within each half of the rows may or may not have a sequential physical arrangement corresponding to a sequential ordering of the stored addresses. For example, as shown in FIG. 9A, the bad column addresses stored in the first four latches may be distributed from left to right as CRD1, CRD2, CRD0, and CRD3. Data stored in the second four latches may be distributed from right to left as CRD7, CRD4, CRD6, and CRD5.

In some embodiments, data may be distributed in increasing numerical order from left to right or from right to left. In some embodiments, the number of CRD latches located in CRD plane 810 may be more or less than 16, the number of rows may be more or less than 2, and the number of columns may be more or less than 4.

Additionally, CRD plane 810 may be sectioned into thirds, quarters, or another conceivable number of sectors according to, for example, the configuration of comparator 860, pointers, and/or the CRD address architectures. For instance, in a system designed to compare four bad column addresses to one given CRD column address, a CRD plane may conceivably be divided into four parts.

Figure 9B:
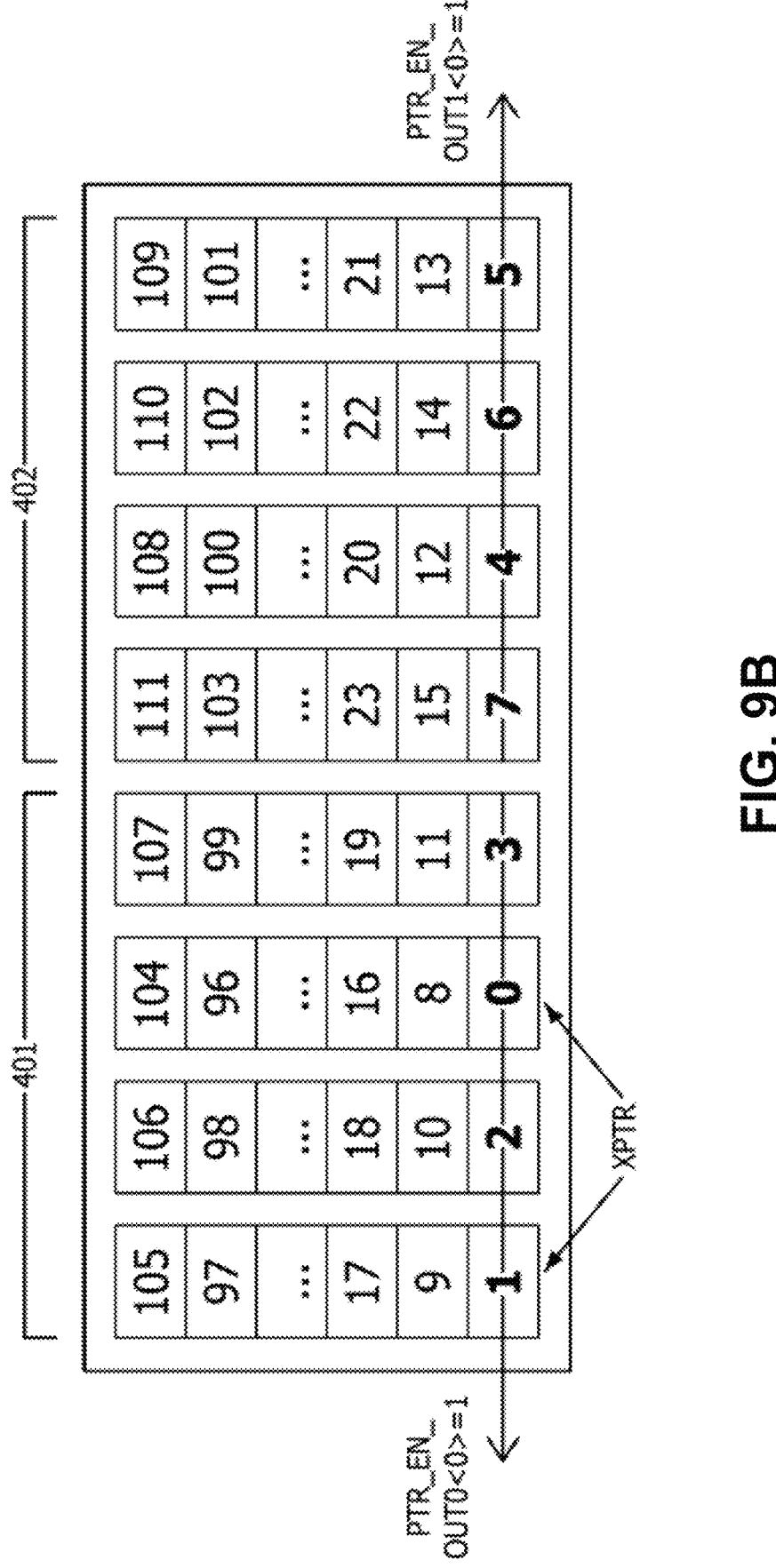
FIG. 9B portrays the functionality of row and column pointers during an initial time period of a read-out operation when a first two CRD latches are selected.
Figure 9C:
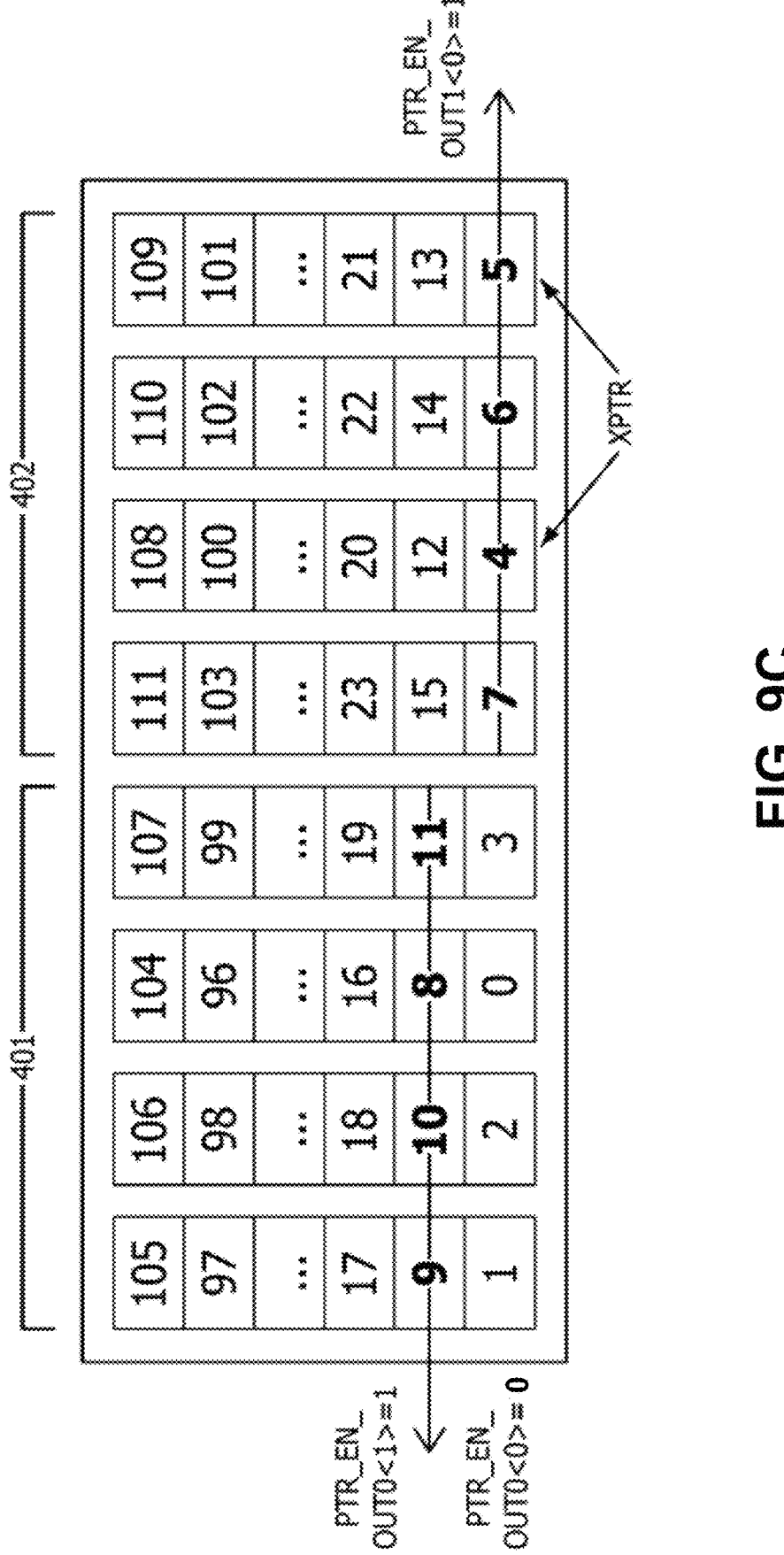
FIG. 9C depicts the operation of the row pointers when, in a later clock cycle, fifth and sixth CRD latches are selected.
Figure 9D:
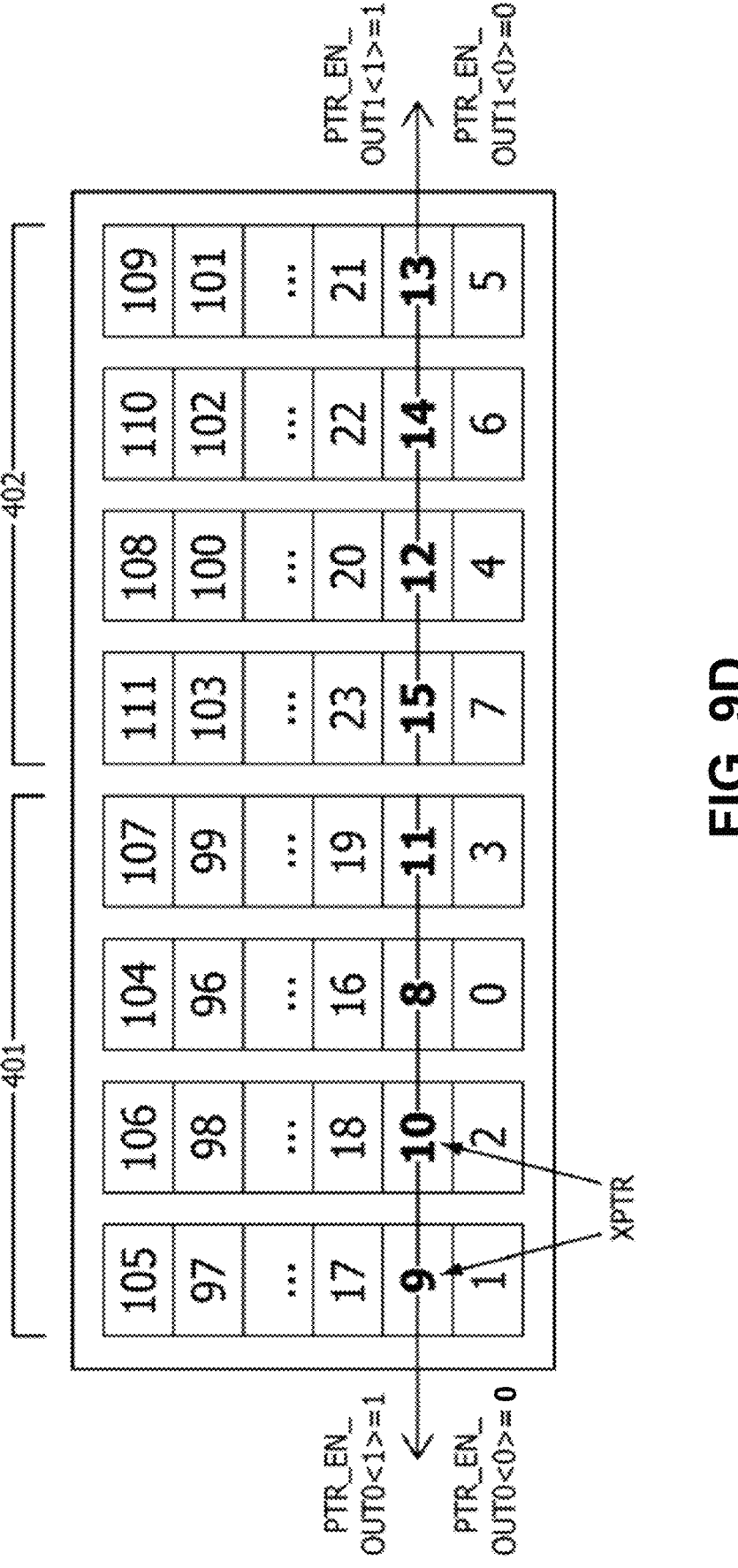
FIG. 9D depicts the operation of the row pointers when, in a later clock cycle, tenth and eleventh CRD latches are selected.

FIGS. 9B through 9D portray the functionality of the row pointers $Y_{SL}$ and $Y_{SR}$ and the column pointer $X_S$ described above in the context of a read-out operation. In some embodiments, the row pointer $Y_{SL}$ and $Y_{SR}$ data may include four-bit fields identifying latches within a left or right half of a particular row of CRD plane 810. The pointer data may be decoded to obtain an address or range of addresses stored by the latches.

For example, row pointer $Y_{SL}<3:0>$ may be decoded to obtain PTR_EN_OUT0<13:0>, which may point to addresses in the left half of one of fourteen rows of CRD plane 810. Row pointer $Y_{SR}<3:0>$ may be decoded to obtain PTR_EN_OUT1<13:0>, which may point to addresses in the right half of one of fourteen rows of CRD plane 810.

For instance, as shown in FIG. 9B, while PTR_EN_OUT0<0>=1, address data stored in CRD_LAT_UNIT0 through CRD_LAT_UNIT3 may be read-out of the left half of the first row of CRD plane 810, and while PTR_EN_OUT1<0>=1, address data in CRD_LAT_UNIT4 through CRD_LAT_UNIT7 may be read out of the right half of the first row of CRD plane 810.

In an embodiment, column pointer $X_S<7:0>$ may point to one or more columns at a given moment. The number of columns selected during a read-out operation may differ from the number of columns selected during a write operation. In the example shown in FIG. 9B, during a read-out operation two columns may be indicated at one time. Additionally, in an embodiment column pointer $X_S$ may indicate multiple numerically adjacent columns at a given time.

In an embodiment, at a given clock cycle column pointer $X_S<7:0>$ points to an even bad column address and an odd bad column address. For example, column pointer $X_S<0>$ and column pointer $X_S<1>$ may transition to high values. In this example, column pointer $X_S<0>$ is referred to herein as the "even column pointer" and column pointer $X_S<1>$ is referred to herein as the "odd column pointer." In another example, column pointer $X_S<1>$ and column pointer $X_S<2>$ may transition to high values. In this example, column pointer $X_S<2>$ is the even column pointer and column pointer $X_S<1>$ is the odd column pointer.

While column pointer $X_S<7:0>$ points to the pointer indexes 0 through 3, each of CRD_LAT_UNIT0 through CRD_LAT_UNIT7 may respectively output stored address data for the entire first row to busses $D_{OO}$-$D_{O7}<13:0>$. Subsequently, the $D_O$ busses may transfer the bad column address data stored by the selected latches for indexing.

Another set of functions, CRD_COMP0 through CRD_COMP7, may add the corresponding pointer index to each of the bad column address data. Given, however, that only two columns (one even and one odd) are selected by column pointer $X_S$, only the addresses for those two columns are output to $CB_E/O<13:0>$ for comparison with input column address $CRD_A<13:0>$.

FIG. 9C depicts the operation of the row pointers when, in a later clock cycle, column pointers $X_S<4>$ and $X_S<5>$ are high. As shown, PTR_EN_OUT0<1> may transition to a high state, and PTR_EN_OUT0<0> may transition to a low state. PTR_EN_OUT1<0> may remain in a high state. At this juncture, each of the latches CRD_LAT_UNIT4 through CRD_LAT_UNIT11 may output stored bad column addresses to CRD_COMP0 through CRD_COMP7 for addition with corresponding indexes, though only the combined addresses and indexes output from COMP4 and COMP5 are compared with input column address $CRD_A$.

As can be seen, when the value of column pointer $X_S<3>$ and MTCH1 are both high, at the next cycle of the $CRD_C$ clock, PTR_EN_OUT0 will advance to next bit, selecting the next row of CRD latches in the left half of the CRD plane. Accordingly, toggling of one bit of the row pointer PTR_EN_OUT may trigger operation of four CRD_LAT_UNITs.

FIG. 9D depicts the operation of the row pointers when column pointer $X_S<9>$ and column pointer $X_S<10>$ are high. In a previous clock cycle, for example, when column pointer $X_S<7>$ & MTCH1 both are high, as shown, the row pointers may increment and the right half of the first row may no longer be selected; thus, PTR_EN_OUT1<0> may transition to a low state. At the same time, even though none of the CRD latches in the right half of the second row are selected, PTR_EN_OUT1<1> may transition to a high state and prefetch bad column data stored at those latches.

In embodiments, operation of the row pointers in preparing the stored bad column addresses for the dynamic skip calculation may limit the speed of a read or write operation. In one illustration considering the context of previously described FIGS. 9A through 9D, assume that latches CRD3 and CRD4 have been selected during a first clock cycle. Thus, PTR_EN_OUT0<0> and PTR_EN_OUT1<0> may be high. In the same cycle, CRD3 is determined to match input column address $CRD_A$.

In a second cycle, based on the determined match with CRD3, the column pointer $X_S$ pointers may increment to select CRD5 and CRD6. Since CRD3 and CRD4 are no longer selected, PTR_EN_OUT0<0> may go low and PTR_EN_OUT0<1> may go high, such that addresses from CRD8, CRD9, CRD10, and CRD11 can be pre-fetched. Assuming that subsequent matches are found for addresses stored at CRD5 and CRD6, after one cycle it may be necessary that address data from CRD8 is ready for comparison with input column address $CRD_A$. The timeframe in which the address data is to be prepared may be constrained, as input column address $CRD_A$ may be incoming at a high rate.

FIG. 10 depicts an example timing of the dynamic skip calculation process on a step-by-step basis. As shown in FIG. 10, there may exist two paths: a single-cycle path characterized by the incrementing of input column address $CRD_A$, and a multi-cycle path characterized by selecting and processing bad column addresses to be compared with input column address $CRD_A$. Iteration of input column address $CRD_A$ 1080 may occur at each clock cycle. Similarly, at 1050, updating of column pointers $X_S<7:0>$ may be performed in a single clock cycle based on the MTCH output shown at 1070. Both of these steps may be completed in a single clock cycle.

The minimum cycle time for the multi-cycle path, on the other hand may be longer, such as two clock cycles. To select and process the bad column data for comparison, at 1010, row pointers $Y_{SL}$ and $Y_{SR}$ data may need to be decoded to enable the selected latches. At 1020, the selected latches read-out their stored address data via $D_O<13:0>$. At the same time, PTR_T_COMP0/1 may update index information for the rows, shown at 1030. BAD<13:3>, shown by 1040, may add row and column index information to the addresses received via $D_O<13:0>$ to obtain real addresses, forwarding real addresses for an even and an odd column to $CB_{E/O}$ at 1060 for comparison with input column address $CRD_A$.

Delay may occur along the multi-cycle path in scenarios such as in FIGS. 9B through 9D, described above. This may be, for example when three or more pairs of matches between stored and incoming addresses occur consecutively. When column pointer $X_S$ points to CRD_LAT_UNIT5 and CRD_LAT_UNIT6, PTR_EN_OUT0<1> may transition to a high state, and CRD_LAT_UNIT8 through CRD_LAT_UNIT11 may output their stored address data to the buses Doo through $D_{O3}$. If CRD_LAT_UNIT5 and CRD_LAT_UNIT6 match the current input column address $CRD_A$, then column pointer $X_S$ may advance to CRD_LAT_UNIT7 and CRD_LAT_UNIT8.

When column pointer $X_S$ points to CRD_LAT_UNIT8, it may be necessary to again update and decode the row pointers, instruct the appropriate latches to read-out their stored addresses, and add index information to those addresses. At least two cycles may be necessary for all these steps to be carried out and for the comparison with input column address $CRD_A$ to be completed. This may present a timing bottleneck, because input column address $CRD_A$ may be incremented in just one cycle.

In response, for some column redundancy systems, manufacturers may place restrictions on the maximum number of columns that may be skipped. In some embodiments, manufacturers may stipulate that no more than two bad columns be present within a series of five consecutive columns. In other embodiments, no more than two bad columns are permitted within five given sectors of a memory array. If a chip does not meet these or similar requirements, the manufacturer may decide to reject the chip.

For column redundancy techniques similar to that described above, it may be desirable to reduce the combinational delay of the comparison logic, diminishing the bottlenecking effect on the incoming address data stream and, therefore, on the speed of read/write operations. By doing so, a manufacturer may be able to ignore or replace a greater number of bad columns without needing to reject the chip, increasing production yield.

In some solutions, a column redundancy technique may leverage alternative data architectures to reduce the delay in comparison logic. For example, a column redundancy technique may be applied on a per-division basis. A division may be said to be "defective" or "bad" if one or more columns corresponding to the division is defective or bad. This approach, and approaches derivable from it, may be referred to hereinafter as "division-based" approaches or techniques, distinct from the "column-based" techniques described above in which bad column data are generated for each individual column.

For embodiments implementing spare or redundant columns, a certain number of redundant columns may be allocated within each division. For instance, where ten spare columns in total are permitted for a given array, and the array includes columns divided into five divisions, each division may have two spare columns allocated within it. This figure may be lesser or greater depending on the configuration of the column redundancy system.

In a system employing a division-based column redundancy data architecture described below, the system may support a greater maximum number of skipped column addresses. Therefore, to replace the greater number of skipped column addresses, in some cases a greater number of redundant columns may be provided.

As described above for column redundancy techniques, implementation of the technique may require testing to determine the number and locations of bad columns. In such a process, contextual information for each division also may be generated based on which columns belong to each division. The column redundancy data may include a starting address for a series of columns spanning all divisions.

The column redundancy data also may include a sequence of match bits indicating whether a column of the range within each division is defective, for which one match bit may be used for each division in the group. The address and match bit data may be stored in an array of CRD latches similar to those described above for columns and may be tabulated to represent the address and match data in separate fields.

In some embodiments, the column addresses and the match bits may be stored in separate arrays. In other embodiments, the match bits may be stored in the same data latches as the address bits. A starting address for a given range of columns may use 13 bits, though it may be appreciated that the address data may use more or fewer bits in other embodiments. The number of bits used to indicate the address as well as the number of bits used to indicate the match data may depend on, for example, the number of divisions in the chip.

Column addresses as implemented in a division-based technique may be determined according to one or more conversion formulas, which may be applied during an indexing stage of a CRD flow as described above. In other embodiments, column addresses may be determined prior to storing the address data in latches of a CRD plane, prior to comparing.

In some embodiments, a rule or an arithmetic operation may be applied to one or more non-indexed column addresses such that a first portion of bits of an address provides a starting address for a group of columns spanning across the divisions of an array. The group of columns may include, for example, one column located at the starting address from each of the divisions.

In some embodiments, the group of columns may not span across all divisions of the array. A second portion of bits of the address may indicate, for instance, match data for the columns within each division. The number of bits used for each of these portions of the address may depend on a number of columns in the array, a number of divisions in the array, and/or a number of bits needed to indicate match data for the divisions (e.g., whether one match bit is allocated for each division, or whether the number of match bits is determined by a maximum number of potential matches).

FIG. 11 provides an example of specific rules by which the addresses may be structured. When the number of divisions is a power of two, for example, a starting address of a group of columns may be derived by dropping a number of bits equal to the power. For example, given a column redundancy technique with four divisions using 13 bit addresses <12:0>, the first 11 bits <12:2> may be used to address the group of divisions, while the lower two bits <1:0> may provide a binary sequence corresponding to the individual column within each of the four divisions.

When the number of divisions is not a power of two, the address may be expressed using a similar arrangement. For example, for a column redundancy technique having five divisions, the first 10 bits <12:3> may provide a starting address for the series of five consecutive logical column addresses, while the lower three bits <2:0> may be used to address each of the five columns at each division. In this case, however, the address generation logic may cause the binary sequence of the three lower bits to only increment from 0 to 2.

FIGS. 12 and 13A depict embodiments of two column redundancy data architectures in which a memory array is divided into four divisions. Specifically, FIG. 12 provides a tabular representation of an array of individual column data as might be stored in latches of a CRD plane (e.g., CRD plane 810), described above in the context of FIG. 9A through 9D. As shown, the column data may include 111 addresses, each having a total of 13 bits, though it may be appreciated that in other embodiments, a greater or lesser number of addresses may be stored, and a greater or lesser number of bits may be used for each address.

Addresses for each individual column may be presented as separate rows of the table, therefore being stored at separate latches. As shown, only data for bad columns is stored, and therefore, the mere presence of the column address in the table may indicate that the column is defective. Such addresses may be compared against an input column address $CRD_A$ and ignored during either the initial skip or dynamic skip processes described in paragraphs above.

FIG. 13A, in contrast, provides a tabular representation of an array of bad column information organized in accordance with the division-based approach described above. Here, first (i.e., starting) logical addresses for groupings of four columns are shown in the table. As in the previously-described CRD architecture, the array of column data might be stored in latches of a CRD array, and each starting address presented in a separate row of the table may be stored at a separate latch.

In accordance with the rule provided in previously described FIG. 11, for this four-division architecture, the first 10 bits are used to indicate the starting address of the consecutive columns. Additionally, as not all of the columns indicated by the range of addresses may be defective, the table may include a sequence of corresponding match bits for each starting address. As described above, the four match bits <3:0> used here may correspond to the four divisions in which the columns are located, and each bit may indicate whether an individual column located within each of the divisions is defective.

FIG. 13B provides a more detailed representation of the match bits as stored in CRD latches. As shown, the starting address of the range of columns spanning four divisions (DIV0, DIV1, DIV2, and DIV3) is indicated by address<12:2>. The match bits may indicate information for the four consecutive logical addresses corresponding to the columns of each division.

For example, each of the four match bits may indicate whether the column located in each division is bad. Where DIV0 and DIV3 are not defective (i.e., the divisions are "good"), the first and the fourth match bits of the four-bit sequence may remain in a low state, 0. Where DIV1 and DIV2 are bad, the corresponding match bits may transition to a high state, 1. In other embodiments, the defective divisions may be indicated by a match bit value of 0, and the non-defective divisions may be indicated by a match bit value of 1.

Figure 13C:
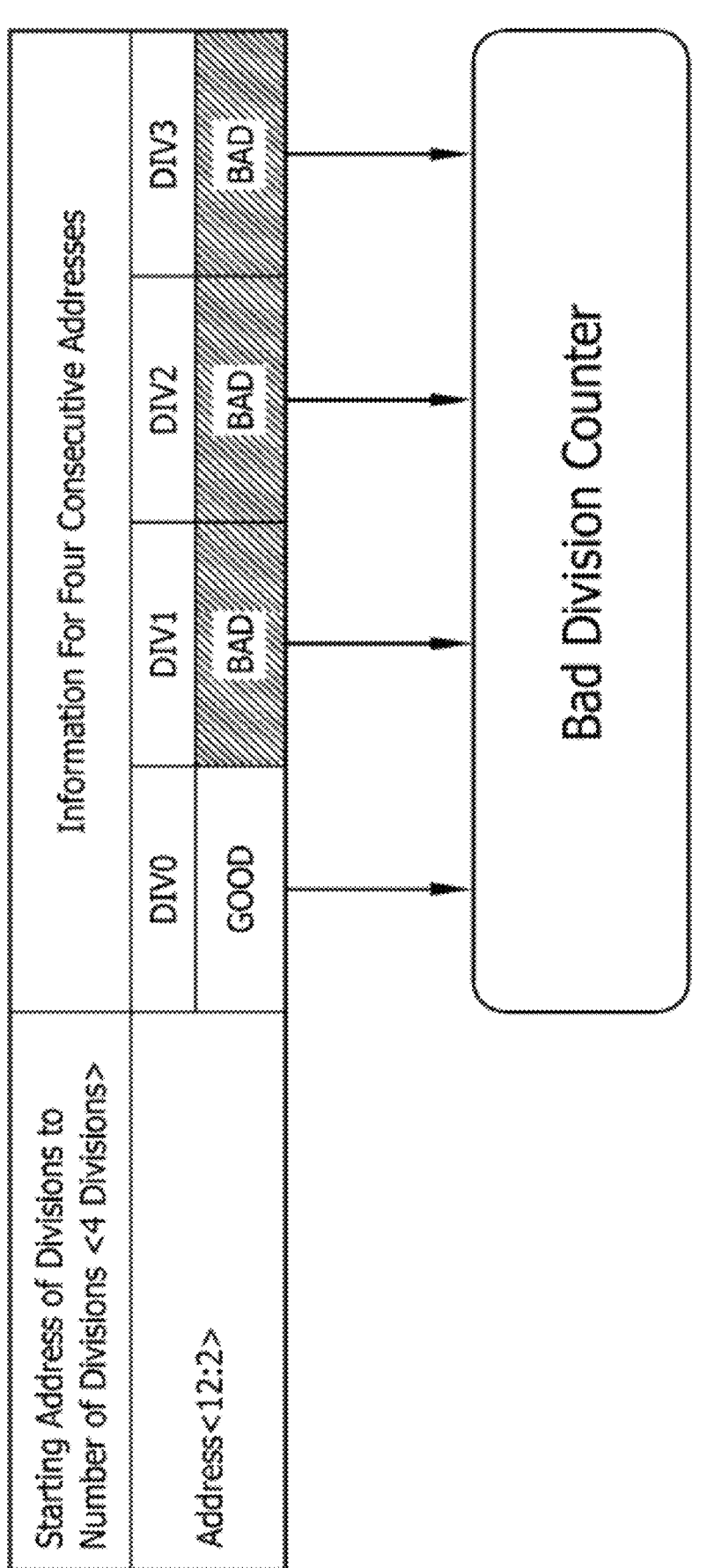
FIG. 13C depicts the match bit information as may be used in a bad division counter.

FIG. 13C depicts the match bit information as may be used in a bad division counter. As shown, the match bits indicating whether the columns in each of the divisions are bad may be input to the division counter, which may determine a total number of bad divisions for the four consecutive logical addresses of the columns. Though not depicted, it may be appreciated that the bad division counter logic may include, for instance, a four-bit adder. The four-bit adder may be configured to take each of the four match bits as inputs to generate, for instance, a two-bit output providing the total number of bad division.

Using the division-based CRD architecture, as shown, it may be possible to generate this information within one clock cycle, while when comparing address information for each individual column, this process may take longer. For match bits indicating a bad division, corresponding pointers for the bad column addresses may be updated such that they fetch a next bad column address or a next set of column addresses for comparison with an incremented input column address $CRD_A$.

FIG. 14A depicts an embodiment of a column redundancy data architecture in which a memory array is divided into five divisions. Specifically, FIG. 14A provides a tabular representation of an array of bad column information organized in accordance with the division-based approach. First (or starting) logical addresses for groupings of five columns are shown in the table.

The array of column data may be stored in latches of a CRD plane (e.g., CRD plane 810), and each starting address presented in a separate row of the table may be stored at a separate latch. As shown, the data may include 111 starting addresses, each having a total of 13 bits, though it may be appreciated that in other embodiments, a greater or lesser number of addresses may be stored, and a greater or lesser number of bits may be used for each address.

For the five-division architecture, the first 9 bits may be used to indicate the starting address of the consecutive columns. As described above with respect to FIG. 11, for five divisions, the three lower bits may increment from 0 to 4 in order to select the individual columns. As not all of the columns indicated by the range of addresses may be defective, the table includes a sequence of corresponding match bits for each starting address. The five match bits <4:0> used here may correspond to the five divisions in which the columns are located, and each bit may indicate whether an individual column located within each of the divisions is defective.

FIG. 14B provides a more detailed representation of the match data. As shown, the starting address of the range of columns spanning five divisions (DIV0, DIV1, DIV2, DIV3, and DIV4) is indicated by address<12:3>. The match bits may indicate information for the five consecutive logical addresses corresponding to the columns of each division.

For example, each of the five match bits may indicate whether the column located in each division is bad. Where DIV0, DIV3, and DIV4 are good, the first and the third match bits of the five-bit sequence may remain in a low state, 0. Where DIV1 and DIV2 are bad, the corresponding match bits may transition to a high state, 1.

Figure 14C:
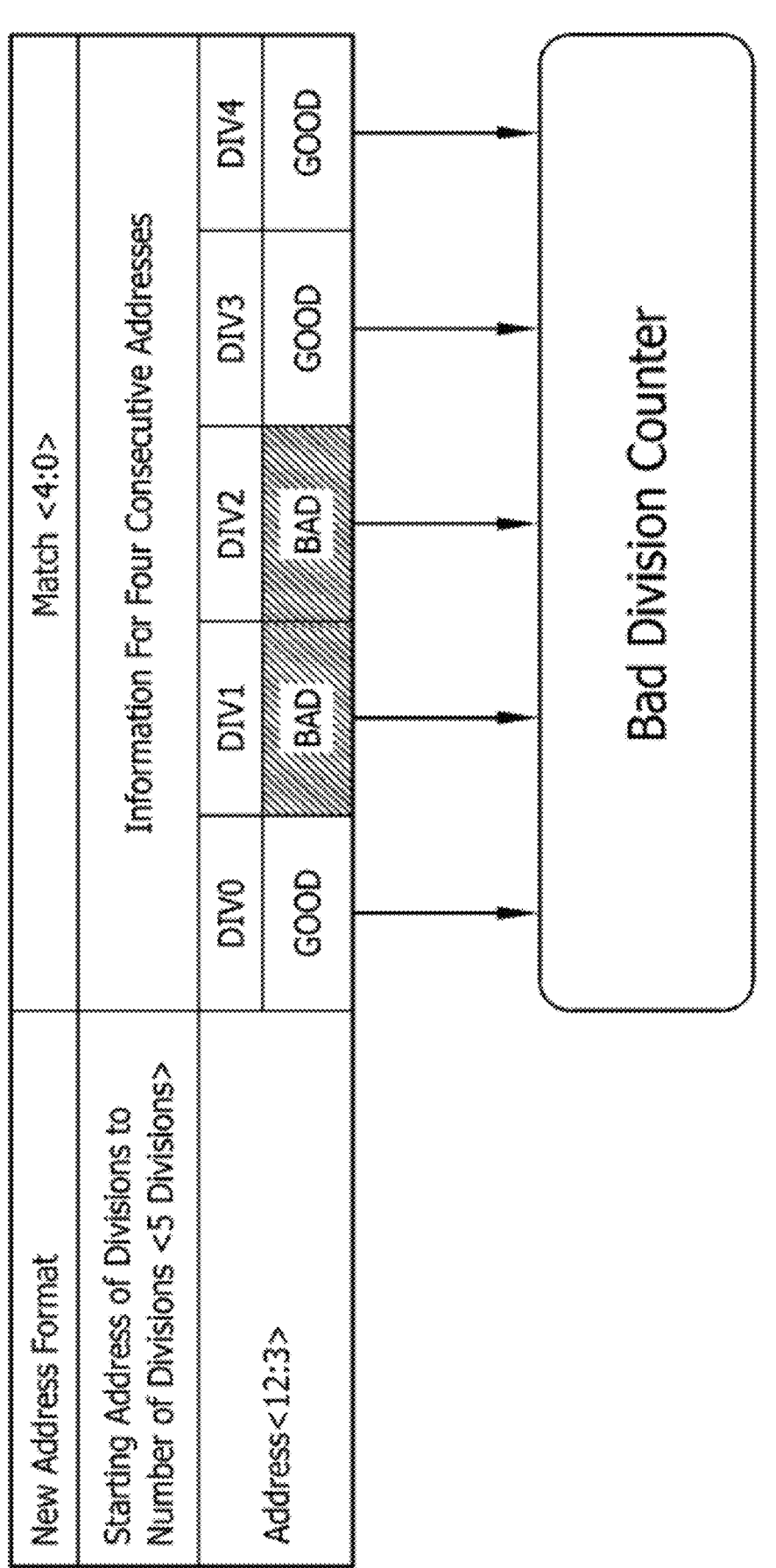
FIG. 14C depicts the match bit information as may be used to drive a bad division counter.

FIG. 14C depicts the match bit information as may be used in a bad division counter. As shown, the match bits indicating whether the columns in each of the divisions are bad may be input to the division counter, which may determine a total number of bad divisions for the five consecutive logical addresses of the columns.

Though not depicted, the bad division counter logic may include, for instance, a five-bit adder. The five-bit adder may be configured to take each of the five match bits as inputs and generate, for instance a three-bit output providing the total number of bad divisions.

Using the new CRD architecture, as shown, it may be possible to generate this information within one clock cycle, while when comparing address information for each individual column, this process may take longer. For match bits indicating a bad division, corresponding pointers for the bad column addresses may be updated such that they fetch a next bad column address or a next set of column addresses for comparison with input column address $CRD_A$.

When implemented in the column redundancy technique introduced and described above with respect to FIG. 6 and FIG. 7, the division-based CRD architecture described above may allow column redundancy logic to identify defective columns faster than it may when using the individual column-based approach. Because each address stored in the data latches may be used to indicate a range of bad columns rather than only a single bad column, a greater amount of bad column information may be extracted from the latches in any given comparison.

FIG. 15A portrays this operation of the comparator when using the division-based CRD architecture. A "horizontal" comparison or search for bad column information at the range of addresses provides results equal to the number of match bits. As shown, for a four-division technique, four match bits are returned for a single comparison. In contrast, a comparison performed using an architecture that tabulates column redundancy data on an individual column-basis would provide bad column information for only a single address.

FIG. 15B shows the compounded benefit of the division-based architecture when performing multiple horizontal comparisons at once. In some embodiments, multiple horizontal comparisons may be performed at the same time, such as when multiple comparators operate in a single clock cycle. This may be called a "vertical" or "parallel" search or comparison.

Depending on how many parallel searches are performed, the advantages over comparisons using the individual column-based architecture may be multiplied. In examples as shown, assuming that a four-division technique is implemented, for two comparisons, the search may return the number of bad columns that are present in the next 8 logical addresses. Similarly, if four comparisons are performed at a single time, the number of bad columns that are present in the next 16 addresses may be returned.

FIG. 16A is a diagram representing example pages of data written to a memory array with twelve divisions. In particular, each clock cycle twelve 16-bit words are written to divisions DIV0, DIV1, DIV2, . . . , DIV10, DIV11. Non-indexed column addresses are depicted in the boxes below the division headings. So, for example, during clock cycle 1 data associated with non-indexed column addresses 0, 1, 2, . . . , 10, 11 are written to divisions DIV0, DIV1, DIV2, . . . , DIV10, DIV11, respectively, during clock cycle 2 data associated with non-indexed column addresses 12, 13, 14, . . . , 22, 23 are written to divisions DIV0, DIV1, DIV2, . . . , DIV10, DIV11, respectively, and so on.

FIG. 16B illustrates indexed column addresses corresponding to non-indexed column addresses of FIG. 16A. In an embodiment, corresponding indexed column addresses are determined by performing integer division on a non-indexed address using the number of divisions in the array to determine the starting address (also referred to herein as the "group") at which the data are located, and then using a modulus or a remainder of the integer division operation to determine a corresponding division for each column.

In the example of FIG. 16B, the corresponding indexed addresses are depicted as (group, division). For example, for non-indexed column address 2, the corresponding indexed group address is determined by performing integer division: 2/12=0, and the corresponding division is the remainder of the integer division: 2. So the corresponding indexed address to non-indexed column address 2 is: (0, 2).

Likewise, for non-indexed column address 10, the corresponding indexed group address is determined by performing integer division: 10/12=0, and the corresponding division is the remainder of the integer division: 10. So the corresponding indexed address to non-indexed column address 10 is: (0, 10).

Similarly, for non-indexed column address 25, the corresponding indexed group address is determined by performing integer division: 25/12=2, and the corresponding division is the remainder of the integer division: 1. So the corresponding indexed address to non-indexed column address 25 is: (2, 1).

In an embodiment, a column redundancy system stores addresses for bad columns in a same (group, division) format. In an embodiment, a column redundancy system performs a first level match to determine if there is a match between an indexed group address of an input column address and an indexed group address of a bad column address.

Figure 17A:
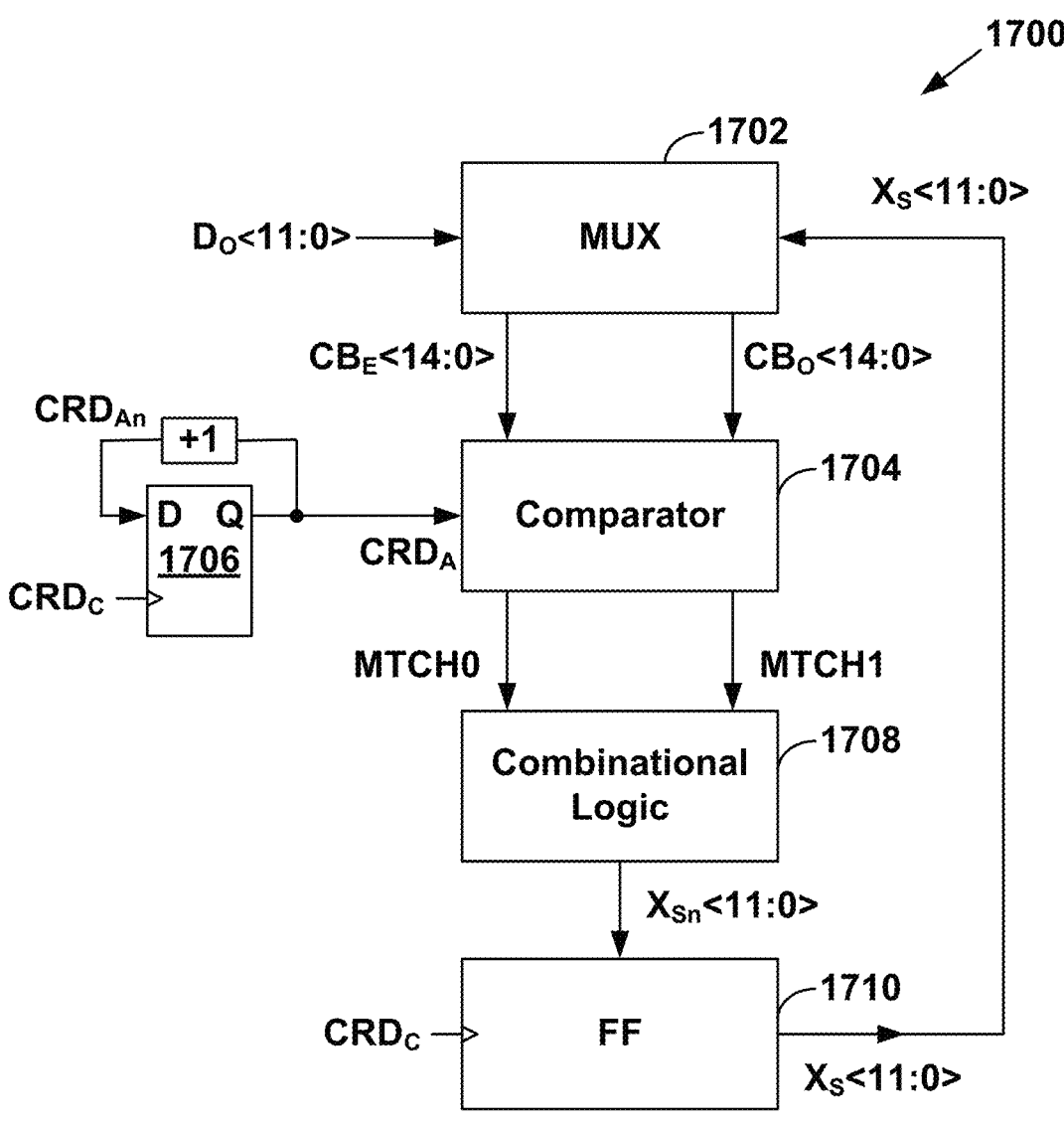
FIG. 17A is a simplified block diagram of another column redundancy system.

For example, FIG. 17A is a simplified block diagram of a column redundancy system 1700. Column redundancy system 1700 includes a MUX 1702, a comparator 1704, a flip-flop 1706, a combinational logic block 1708, and a flip-flop 1710.

MUX 1702 has a first input terminal coupled to receive bad column address data (e.g., from CRD plane 810) on busses DO<11:0>, and has a second input terminal coupled to receive column pointer $X_S$<11:0>. In the illustrated example, busses DO<11:0> provide twelve bad column addresses, and column pointer $X_S$<11:0> has a twelve bit width for selecting amongst the twelve bad column addresses on busses DO<11:0>. Persons of ordinary skill in the art will understand that busses DO alternatively may provide more or fewer than twelve bad column addresses, and column pointer $X_S$ may have bit widths greater than or less than twelve bits In an embodiment, MUX 1702 provides at a first output $CB_E$ and a second output $CB_O$ two bad column addresses from busses DO<11:0> based on bit values of column pointer $X_S$<11:0>. In an embodiment, two of the twelve bits of column pointer $X_S$<11:0> have a value of 1, and all other bits of column pointer $X_S$<11:0> are 0. For example, column pointer $X_S(0)=X_S(1)=1$, and all other bits of column pointer $X_S$<11:0> are 0.

As described above, one of the two bits of column pointer $X_S$<11:0> that have a value of 1 is referred to herein as the even column pointer and the other of the two bits of column pointer $X_S$<11:0> that have a value of 1 is referred to herein as the odd column pointer. So for example, if column pointer $X_S(0)=X_S(1)=1$, $X_S(0)$ is the even column pointer and $X_S(1)$ is the odd column pointer. Likewise, if column pointer $X_S(1)=X_S(2)=1$, $X_S(2)$ is the even column pointer and $X_S(1)$ is the odd column pointer, and so on.

In an embodiment, MUX 1702 selects two bad column addresses from busses DO<11:0> corresponding to the bit values of column pointer $X_S$<11:0>, and outputs the bad column addresses as an even bad column address at first output $CB_E$ (also referred to herein as "even bad column address $CB_E$") and an odd bad column address at second output $CB_O$ (also referred to herein as "odd bad column address $CB_O$").

In an embodiment, each bad column address is fifteen bits, although other address bit lengths may be used. In the example above, with column pointer $X_S(0)=X_S(1)=1$, MUX 1702 selects bad column addresses from busses DO(0) and DO(1) and provides the bad column address at busses DO(0) and DO(1) as even bad column address $CB_E$ and odd bad column address $CB_O$, respectively.

Comparator 1704 receives at first and second input terminals even bad column address $CB_E$ and odd bad column address $CB_O$, respectively, from MUX 1702, and receives at a third input terminal input column address $CRD_A$. Flip-flop 1706 increments input column address $CRD_A$ each cycle of the $CRD_C$ clock, such as described above.

In an embodiment, comparator 1704 compares the indexed group address of input column address $CRD_A$ with the indexed group address of each of even bad column address $CB_E$ and odd bad column address $CB_O$ (e.g., the indexed group addresses specified at busses DO(0) and DO(1), respectively, in the above example), and generates even match signal MTCH0 and odd match signal MTCH1, where even match signal MTCH0 corresponds to an even-numbered column and odd match signal MTCH1 corresponds to an odd-numbered column.

In an embodiment, if comparator 1704 determines that the indexed group address of input column address $CRD_A$ matches the indexed group address of even bad column address $CB_E$, comparator 1704 outputs even match signal MTCH0=1.

In an embodiment, if comparator 1704 determines that the indexed group address of input column address $CRD_A$ does not match the indexed group address of even bad column address $CB_E$, comparator 1704 outputs even match signal MTCH0=0.

In an embodiment, if comparator 1704 determines that the indexed group address of input column address $CRD_A$ matches the indexed group address of odd bad column address $CB_O$, comparator 1704 outputs odd match signal MTCH1=1.

In an embodiment, if comparator 1704 determines that the indexed group address of input column address $CRD_A$ does not match the indexed group address of odd bad column address $CB_O$, comparator 1704 outputs odd match signal MTCH1=0.

Thus, even match signal MTCH0 and odd match signal MTCH1 may have any of the following four outputs:

| MTCH0 | MTCH1 | SCENARIO |
|---|---|---|
| 0 | 0 | indexed group address of input column address $CRD_A$ does not match the indexed group address of even bad column address $CB_E$, or the indexed group address of odd bad column address $CB_O$ |
| 0 | 1 | indexed group address of input column address $CRD_A$ does not match the indexed group address of even bad column address $CB_E$, but matches the indexed group address of odd bad column address $CB_O$ |
| 1 | 0 | indexed group address of input column address $CRD_A$ matches the indexed group address of even bad column address $CB_E$, but does not match the indexed group address of odd bad column address $CB_O$ |
| 1 | 1 | indexed group address of input column address $CRD_A$ matches the indexed group address of even bad column address $CB_E$, and matches the indexed group address of odd bad column address $CB_O$ |

For example, if the indexed input column address $CRD_A$= (0, 3), and if indexed even bad column address $CB_E$=(0, 2) and indexed odd bad column address $CB_O$=(0, 4), comparator 1704 outputs even match signal MTCH0=1 and odd match signal MTCH1=1. Alternatively, in the same example if indexed odd bad column address $CB_O$=(3, 10), comparator 1704 outputs even match signal MTCH0=1 and odd match signal MTCH1=0.

In an embodiment, combinational logic 1708 receives MTCH0 and MTCH1 from comparator 1104, and generates a next column pointer $X_{Sn}$. In an embodiment, if even match signal MTCH0=0, combinational logic 1708 does not change the even column pointer in the bit pattern of next column pointer $X_{Sn}$. In an embodiment, if even match signal MTCH0=1, combinational logic 1708 changes the even column pointer in the bit pattern of next column pointer $X_{Sn}$ to point to the next even bad column address.

In an embodiment, if odd match signal MTCH1=0, combinational logic 1708 does not change the odd pointer in the bit pattern of next column pointer $X_{Sn}$. In an embodiment, if odd match signal MTCH1=1, combinational logic 1708 changes the odd pointer in the bit pattern of next column pointer $X_{Sn}$ to point to the next odd bad column address.

For example, assume that prior to comparator 1704 performing a comparison, column pointer $X_S(0)=X_S(1)=1$, and all other bits of column pointer $X_S<11:0>$ are 0, and next column pointer $X_{Sn}(0)=X_{Sn}(1)=1$, and all other bits of next column pointer $X_{Sn}<11:0>$ are 0. In this example, column pointer $X_S(0)=1$ points to the even bad column address and column pointer $X_S(1)=1$ points to the odd bad column address.

If comparator 1704 determines that the indexed group address of input column address $CRD_A$ does not match the indexed group address of even bad column address $CB_E$ or the indexed group address of odd bad column address $CB_O$, comparator 1704 outputs even match signal MTCH0=0 and odd match signal MTCH1=0, and combinational logic 1108 leaves the bit pattern of next column pointer $X_{Sn}$ unchanged. That is, next column pointer $X_{Sn}(0)=X_{Sn}(1)=1$, and all other and all other bits of next column pointer $X_{Sn}<11:0>$ are 0.

In contrast, if comparator 1704 determines that the indexed group address of input column address $CRD_A$ matches the indexed group address of even bad column address $CB_E$ but does not match the indexed group address of odd bad column address $CB_O$, comparator 1704 outputs even match signal MTCH0=1 and odd match signal MTCH1=0, and combinational logic 1708 sets next column pointer $X_{Sn}(0)=0$, next column pointer $X_{Sn}(2)=1$, and leaves next column pointer $X_{Sn}(1)$ unchanged at next column pointer $X_{Sn}(1)=1$. All other bits of next column pointer $X_{Sn}<11:0>=0$. In this regard, next column pointer $X_S(2)=1$ points to the even bad column address and next column pointer $X_S(1)=1$ points to the odd bad column address.

Likewise, if comparator 1704 determines that the indexed group address of input column address $CRD_A$ does not match the indexed group address of even bad column address $CB_E$ but matches the indexed group address of odd bad column address $CB_O$, comparator 1704 outputs even match signal MTCH0=0 and odd match signal MTCH1=1, and combinational logic 1708 sets next column pointer $X_{Sn}(1)=0$, next column pointer $X_{Sn}(3)=1$, and leaves next column pointer $X_{Sn}(0)$ unchanged at next column pointer $X_{Sn}(0)=1$. All other bits of next column pointer $X_{Sn}<11:0>=0$. In this regard, next column pointer $X_S(0)=1$ points to the even bad column address and next column pointer $X_S(3)=1$ points to the odd bad column address.

Similarly, if comparator 1704 determines that the indexed group address of input column address $CRD_A$ matches the indexed group address of even bad column address $CB_E$ and matches the indexed group address of odd bad column address $CB_O$, comparator 1704 outputs even match signal MTCH0=1 and odd match signal MTCH1=1, and combinational logic 1708 sets next column pointers $X_{Sn}(0)=X_{Sn}(1)=0$, and next column pointer $X_{Sn}(2)=X_{Sn}(3)=1$. All other bits of next column pointer $X_{Sn}<11:0>=0$. In this regard, next column pointer $X_S(2)=1$ points to the even bad column address and next column pointer $X_S(3)=1$ points to the odd bad column address.

Flip-flop 1710 receives 1708 receives next column pointer $X_{Sn}$ from combinational logic 1708 at a first input terminal, receives the $CRD_C$ clock at a second input terminal, and generates column pointer $X_S$ based on the bit values of next column pointer $X_{Sn}$. Thus, on the next cycle of the $CRD_C$ clock the bit values of column pointer $X_S$ are equal to the bit values of next column pointer $X_{Sn}$ from the current cycle of the $CRD_C$ clock.

Figure 17B:
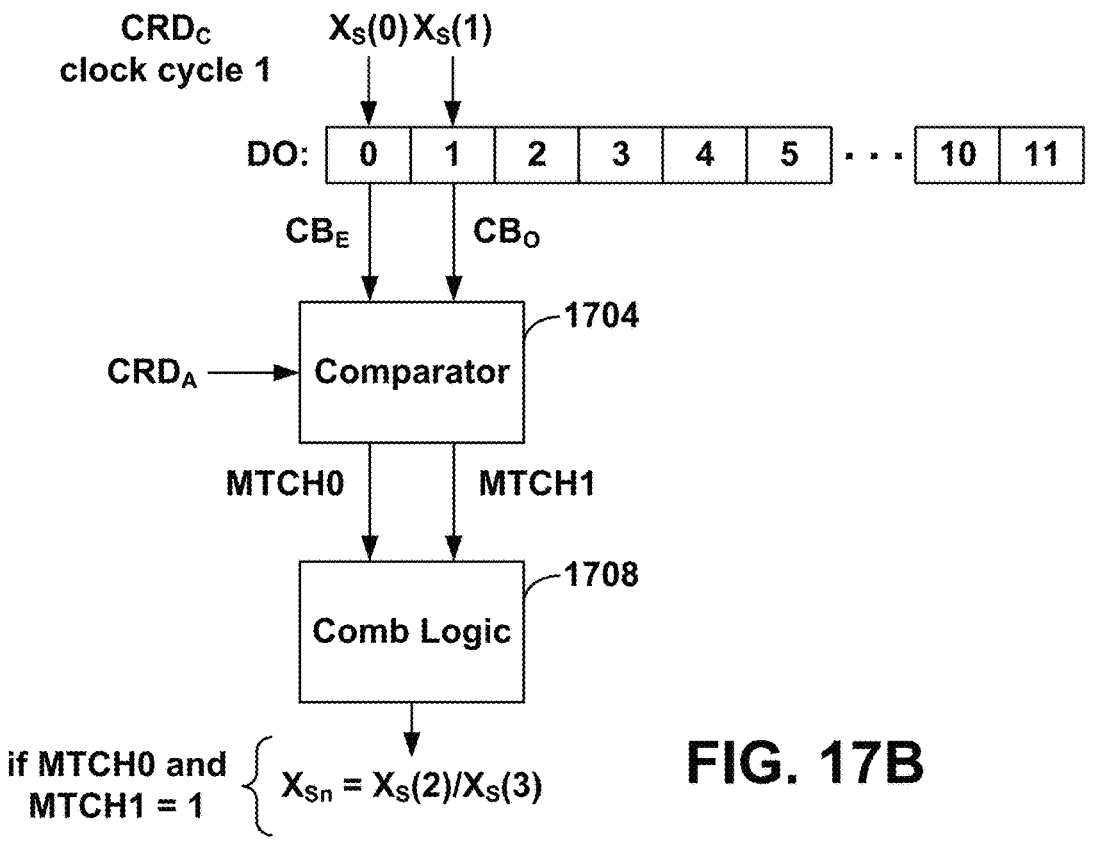
FIGS. 17B-17C depict an example operation of the column redundancy system of FIG. 17A.
Figure 17C:
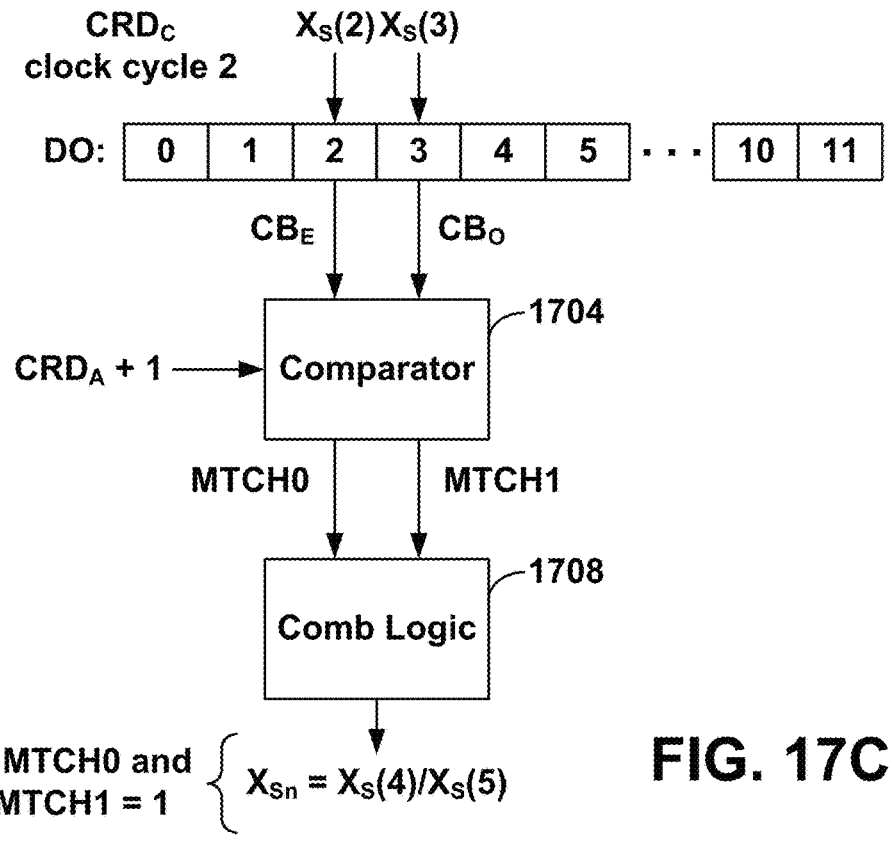

FIGS. 17B-17C depict an example operation over two clock cycles of column redundancy system 1700 of FIG. 17A. In particular, as depicted in FIG. 17B on a first cycle of the $CRD_C$ clock, column pointer $X_S(0)=X_S(1)=1$, and all other bits of column pointer $X_S<11:0>$ are 0. As a result, bad column address at busses DO(0) and DO(1) are provided as even bad column address $CB_E$ and odd bad column address $CB_O$, respectively, to comparator 1704.

Comparator 1704 compares the indexed group address of input column address $CRD_A$ with the indexed group address of even bad column address $CB_E$ and the indexed group address of odd bad column address $CB_O$ (e.g., the indexed group addresses specified at busses DO(0) and DO(1), respectively), and generates even match signal MTCH0 and odd match signal MTCH1.

In this example, assume that the indexed group address of input column address $CRD_A$ matches the indexed group address of even bad column address $CB_E$ and the indexed group address of odd bad column address $CB_O$. As a result, comparator 1704 outputs even match signal MTCH0=1 and odd match signal MTCH1=1. Combinational logic 1708 then sets next column pointer $X_{Sn}(2)=X_{Sn}(3)=1$, and sets all other bits of next column pointer $X_{Sn}<11{:}0>$ to 0.

Next, as depicted in FIG. 17C on a second cycle of the $CRD_C$ clock, column pointer $X_S$ is made equal to next column pointer $X_{Sn}$. Thus, column pointer $X_S(2)=X_S(3)=1$, and all other bits of column pointer $X_S<11{:}0>$ are 0. As a result, bad column address at busses DO(2) and DO(3) are provided as even bad column address $CB_E$ and odd bad column address $CB_O$, respectively, to comparator 1704.

Comparator 1704 compares the indexed group address of input column address $CRD_A+1$ with the indexed group address of even bad column address $CB_E$ and the indexed group address of odd bad column address $CB_O$ (e.g., the addresses specified at busses DO(2) and DO(3), respectively), and generates even match signal MTCH0 and odd match signal MTCH1.

In this example, assume that the indexed group address of input column address $CRD_A+1$ matches the indexed group address of even bad column address $CB_E$ and the indexed group address of odd bad column address $CB_O$. As a result, comparator 1704 outputs even match signal MTCH0=1 and odd match signal MTCH1=1. Combinational logic 1708 then sets next column pointer $X_{Sn}(4)=X_{Sn}(5)=1$, and sets all other bits of next column pointer $X_{Sn}<11{:}0>$ to 0.

In the examples depicted in FIGS. 17B-17C, within one cycle of the $CRD_C$ clock, upon detecting a bad column address match, the values of column pointer $X_{Sn}$ must be updated to the values of next column pointer $X_{Sn}$, the updated values of column pointer $X_S$ must be used to select bad column addresses at busses DO, the indexed group address of an incremented input column address $CRD_A$ must be compared with the indexed group address of even bad column address $CB_E$ and the indexed group address of odd bad column address $CB_O$, the even match signal MTCH0 and odd match signal MTCH1 must be updated, and next column pointer $X_{Sn}$ may need to be updated.

Figure 17D:
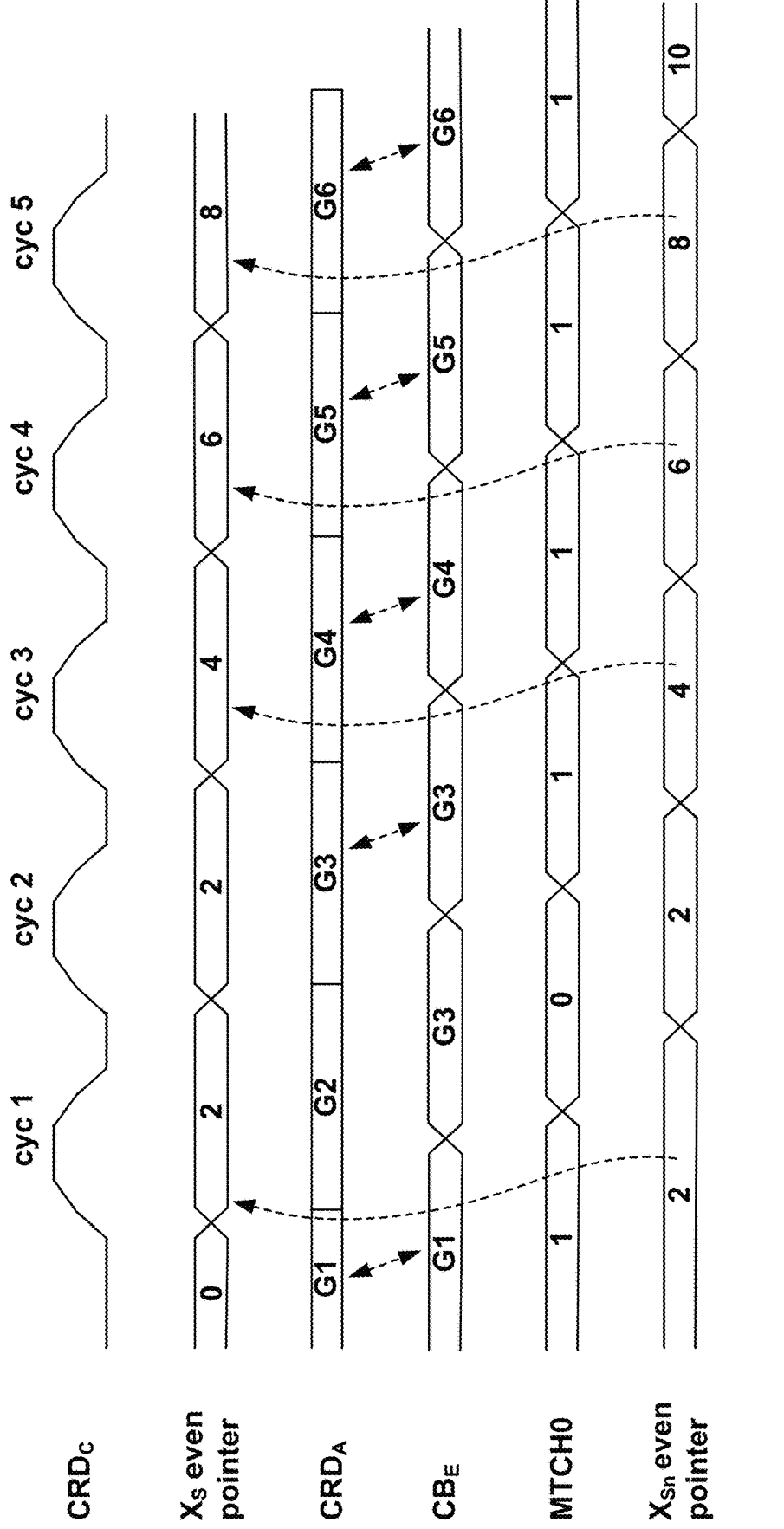
FIG. 17D is an example timing diagram depicting various values of signals of the column redundancy system of FIG. 17A.

FIG. 17D is an example timing diagram depicting values of various signals of column redundancy system 1700 of FIG. 17A. In particular, FIG. 17D depicts example values of even column pointer $X_S$, input column address $CRD_A$, even bad column address $CB_E$, even match signal MTCH0 and next even column pointer $X_{Sn}$ over several cycles of the $CRD_C$ clock. In the depicted example, prior to cycle 1 of the $CRD_C$ clock, even column pointer $X_S(0)=1$, the indexed group address of input column address $CRD_A$=G1, the indexed group address of even bad column address $CB_E$=G1, and even match signal MTCH0=1. Accordingly, next even column pointer is incremented to next even column address, $X_{Sn}(2)=1$.

On cycle 1 of the $CRD_C$ clock, the values of even column pointer $X_S$ must be updated to the values of next even column pointer $X_{Sn}$ (indicated by the dashed line in FIG. 17D). Thus, even column pointer $X_S(2)=1$. In this example, on cycle 1 of the $CRD_C$ clock the indexed group address of input column address $CRD_A$=G2, the indexed group address of even bad column address $CB_E$=G3, there is no match and even match signal MTCH0=0. Accordingly, the value of next even column pointer $X_{Sn}(2)$ remains 1, and even column pointer $X_S(2)$ remains 1.

On cycle 2 of the $CRD_C$ clock, even column pointer $X_S(2)=1$, and the indexed group address of input column address $CRD_A$=G3, the indexed group address of even bad column address remains $CB_E$=G3, there is a match and even match signal MTCH0=1. Accordingly, next even column pointer is incremented to next even column address, $X_{Sn}(4)$=1.

On cycle 3 of the $CRD_C$ clock, the values of even column pointer $X_S$ must be updated to the values of next even column pointer $X_{Sn}$ (indicated by the dashed line in FIG. 17D). Thus, even column pointer $X_S(4)=1$. In this example, on cycle 3 of the $CRD_C$ clock the indexed group address of input column address $CRD_A$=G4, the indexed group address of even bad column address $CB_E$=G4, there is a match and even match signal MTCH0=1. Accordingly, next even column pointer is incremented to next even column address, $X_{Sn}(6)=1$.

On cycle 4 of the $CRD_C$ clock, the values of even column pointer $X_S$ must be updated to the values of next even column pointer $X_{Sn}$ (indicated by the dashed line in FIG. 17D). Thus, even column pointer $X_S(6)=1$. In this example, on cycle 4 of the $CRD_C$ clock the indexed group address of input column address $CRD_A$=G5, the indexed group address of even bad column address $CB_E$=G5, there is a match and even match signal MTCH0=1. Accordingly, next even column pointer is incremented to next even column address, $X_{Sn}(8)=1$.

On cycle 5 of the $CRD_C$ clock, the values of even column pointer $X_S$ must be updated to the values of $X_{Sn}$ next even column pointer (indicated by the dashed line in FIG. 17D). Thus, even column pointer $X_S(8)=1$. In this example, on cycle 5 of the $CRD_C$ clock the indexed group address of input column address $CRD_A$=G6, the indexed group address of even bad column address $CB_E$=G6, there is a match and even match signal MTCH0=1. Accordingly, next even column pointer is incremented to next even column address, $X_{Sn}(10)=1$.

As can be seen in this example, each instance in which there are back-to-back matches, the values of even column pointer $X_S$ must be updated to the values of next even column pointer $X_{Sn}$, comparator 1704 must compare the indexed group address of input column address $CRD_A$ to the indexed group address of even bad column address $CB_E$, the value of even match signal MTCH0 must be determined and set, and next even column pointer $X_{Sn}$ must incremented to the next even column address, and all of these operations must occur within one clock cycle.

If there is a delay in updating the values of even column pointer $X_S$ relative to the timing of the $CRD_C$ clock, column redundancy system 1700 may produce an erroneous result. For example, in the above example if on cycle 3 of the $CRD_C$ clock there is a delay in updating the values of even column pointer $X_S$ relative to the timing of the $CRD_C$ clock (such that even column pointer $X_S(2)=1$ rather than being updated to even column pointer $X_S(4)=1$), the indexed group address of even bad column address $CB_E$ will remain at $CB_E$=G3, the indexed group address of input column address $CRD_A$=G4, comparator 1704 will determine that there is no match, even match signal MTCH0=0, and next even column pointer $X_{Sn}(4)$ remains 1.

As memory technology advances, input-output speed continues to increase. One memory interface is referred to as "Toggle Mode," and Toggle Mode speed continues to increase from one generation to another generation. In embodiments, the period of the $CRD_C$ clock is derived from a high speed clock signal $DQS_x$. As Toggle Mode speed increases, high speed clock signal $DQS_x$ increases, and the period of the $CRD_C$ clock correspondingly decreases.

As described above, in the example operation of column redundancy system 1700, when back-to-back bad column address matches are detected, the values of column pointer $X_S$ must be updated to the values of next column pointer $X_{Sn}$, and the updated values of column pointer $X_S$ must be used to select bad column address at busses DO, perform the comparison, update even match signal MTCH0 and odd match signal MTCH1, and update next column pointer $X_{Sn}$ all within the same cycle of the $CRD_C$ clock.

As Toggle Mode speed increases, completing all of these operations within a single cycle of the $CRD_C$ clock becomes increasingly difficult. One possible solution is to slow the $CRD_C$ clock by increasing the number of divisions (in an embodiment the period of the $CRD_C$ clock is equal to the number of divisions times the period of the high speed clock signal $DQS_x$). However, such a solution increases die area and manufacturing cost. Technology is described to provide a column redundancy system that may operate at higher Toggle Mode speeds without slowing the $CRD_C$ clock.

Figure 18A:
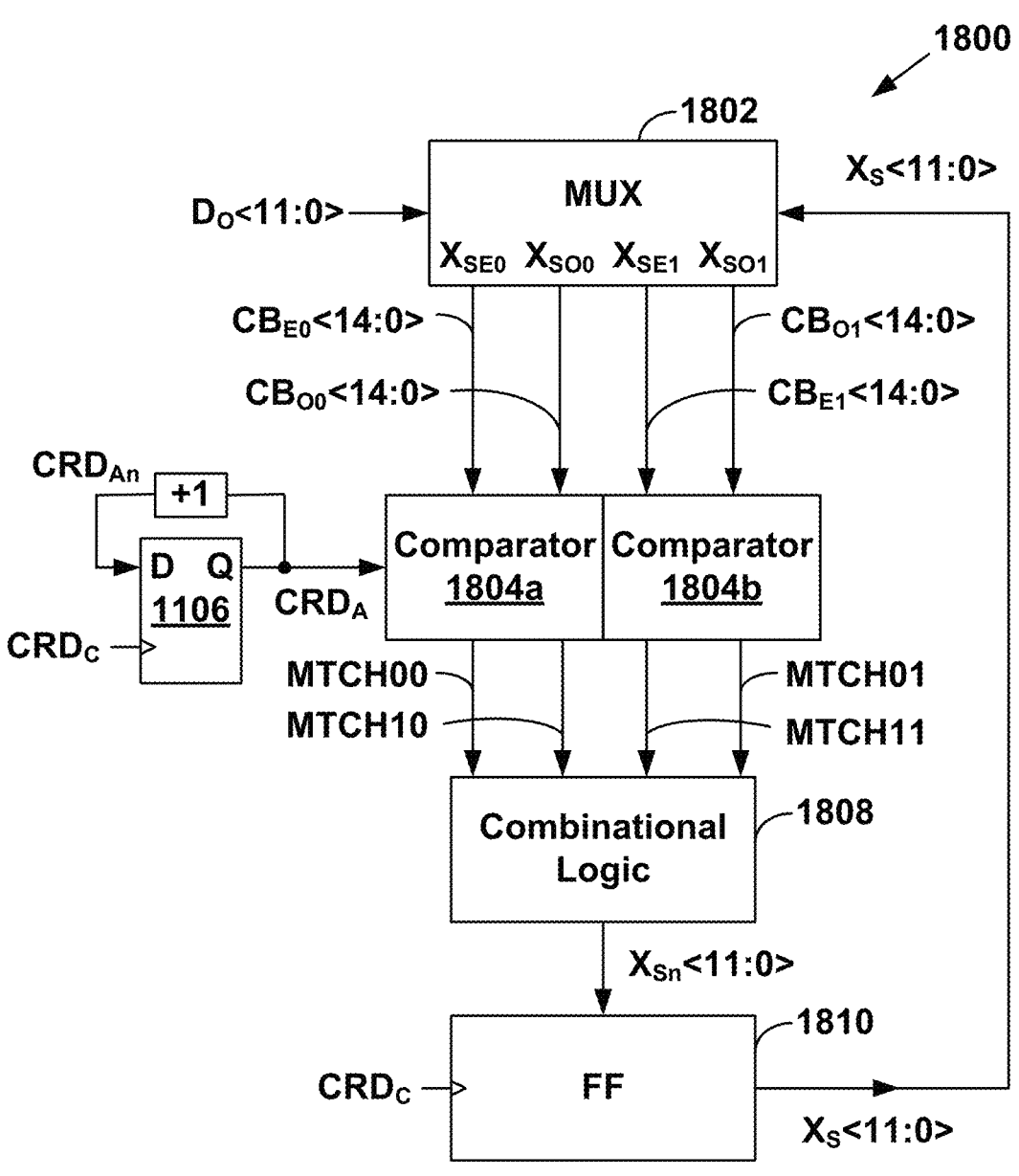
FIG. 18A is a simplified block diagram of another column redundancy system.

FIG. 18A is a simplified block diagram of another column redundancy system 1800, which includes a MUX 1802, a first comparator 1804*a*, a second comparator 1804*b*, flip-flop 1806, a combinational logic block 1808, and a flip-flop 1810. Column redundancy system 1800 is an embodiment of circuits included in column replacement control circuits 236 of FIGS. 2A-2B.

MUX 1802 has a first input terminal coupled to receive bad column address data (e.g., from CRD plane 810) on busses DO<11:0>, and has a second input terminal coupled to receive column pointer $X_S$<11:0>. In the illustrated example, busses DO<11:0> provide twelve bad column addresses, and column pointer $X_S$<11:0> has a twelve bit width for selecting amongst the twelve bad column addresses on busses DO<11:0>. Persons of ordinary skill in the art will understand that busses DO alternatively may provide more or fewer than twelve bad column addresses, and column pointer $X_S$ may have bit widths greater than or less than twelve bits In an embodiment, MUX 1802 provides at a first output $CB_{E0}$, a second output $CB_{O0}$, a third output $CB_{E1}$, and a fourth output $CB_{O1}$ four bad column addresses from busses DO<11:0> based on bit values of column pointer $X_S$<11:0>. In an embodiment, each bad column address is fifteen bits, although other address bit lengths may be used.

In an embodiment, four consecutive bits of column pointer $X_S$<11:0> have a value of 1, and all other bits of column pointer $X_S$<11:0> are 0. For example, column pointer $X_S(0)=X_S(1)=X_S(2)=X_S(3)=1$, and all other bits of column pointer $X_S$<11:0> are 0.

In an embodiment, the four consecutive bits of column pointer $X_S$<11:0> that have a value of 1 include a first pair of column pointers and a second pair of column pointers. In an embodiment, the first pair of column pointers includes a first even column pointer $X_{SE0}$ and a first odd column pointer $X_{SO0}$, and the second pair of column pointers includes a second even column pointer $X_{SE1}$ and a second odd column pointer $X_{SO1}$.

Because the bits of column pointer $X_S$<11:0> that have a value of 1 are consecutive, one of the first pair of column pointers and the second pair of column pointers has pointer values that are less than the pointer values of the other of the first pair of column pointers and the second pair of column pointers. The pair of column pointers having the lower pointer values is referred to herein as the "lower pair of column pointers," and the pair of column pointers having the higher pointer values is referred to herein as the "upper pair of column pointers."

So for example, during a first cycle of the $CRD_C$ clock the first pair of column pointers may include first even column pointer $X_{SE0}=0$ and first odd column pointer $X_{SO0}=1$, and the second pair of column pointers may include second even column pointer $X_{SE1}=2$ and second odd column pointer $X_{SO1}=3$. In this instance, the first pair of column pointers ($X_{SE0}=0$ and $X_{SO0}=1$) is the lower pair of column pointers, and the second pair of column pointers ($X_{SE1}=2$ and $X_{SO1}=3$) is the upper pair of column pointers.

In contrast, during a second cycle of the $CRD_C$ clock the first pair of column pointers may include first even column pointer $X_{SE0}=4$ and first odd column pointer $X_{SO0}=5$, and the second pair of column pointers may include second even column pointer $X_{SE1}=2$ and second odd column pointer $X_{SO1}=3$. In this instance, the first pair of column pointers ($X_{SE0}=4$ and $X_{SO0}=5$) is the upper pair of column pointers, and the second pair of column pointers ($X_{SE1}=2$ and $X_{SO1}=3$) is the lower pair of column pointers. Thus, the same pair of column pointers (e.g., $X_{SE1}=2$ and $X_{SO1}=3$) may be the upper pair of column pointers during one cycle of the $CRD_C$ clock, but may be the lower pair of column pointers during a different cycle of the $CRD_C$ clock.

In an embodiment, MUX 1802 selects four bad column addresses from busses DO<11:0> corresponding to the bit values of column pointer $X_S$<11:0>, and outputs the bad column addresses as a first even bad column address at first output $CB_{E0}$, (also referred to herein as "first even bad column address $CB_{E0}$"), a first odd bad column address at second output $CB_{O0}$ (also referred to herein as "first odd bad column address $CB_{O0}$"), a second even bad column address at third output $CB_{E1}$ (also referred to herein as "second even bad column address $CB_{E1}$"), and a second odd bad column address at fourth output $CB_{O1}$ (also referred to herein as "second odd bad column address $CB_{O1}$").

In an embodiment, first even bad column address $CB_{E0}$ and first odd bad column address $CB_{O0}$ are associated with the bad column addresses pointed to by first even column pointer $X_{SE0}$ and first odd column pointer $X_{SO0}$, respectively. In an embodiment, second even bad column address $CB_{E1}$ and second odd bad column address $CB_{O1}$ are associated with the bad column addresses pointed to by second even column pointer $X_{SE1}$ and second odd column pointer $X_{SO1}$, respectively.

For example, during a first cycle of the $CRD_C$ clock assume that column pointer $X_S(0)=X_S(1)=X_S(2)=X_S(3)=1$. The first pair of column pointers ($X_{SE0}=0$ and $X_{SO0}=1$) is the lower pair of column pointers, and the second pair of column pointers ($X_{SE1}=2$ and $X_{SO1}=3$) is the upper pair of column pointers.

First even bad column address $CB_{E0}$ and first odd bad column address $CB_{O0}$ are associated with the bad column addresses pointed to by first even column pointer $X_{SE0}=0$ and first odd column pointer $X_{SO0}=1$ respectively. During this first cycle of the $CRD_C$ clock, first even bad column address $CB_{E0}$ and first odd bad column address $CB_{O0}$ are associated with the lower pair of column pointers ($X_{SE0}=0$ and $X_{SO0}=1$).

Second even bad column address $CB_{E1}$ and second odd bad column address $CB_{O1}$ are associated with the bad column addresses pointed to by second even column pointer $X_{SE1}=2$ and second odd column pointer $X_{SO1}=3$ respectively. During this first cycle of the $CRD_C$ clock, second even bad column address $CB_{E1}$ and second odd bad column address $CB_{O1}$ are associated with the upper pair of column pointers ($X_{SE1}=2$ and $X_{SO1}=3$).

During a second cycle of the $CRD_C$ clock assume that column pointer $X_S(2)=X_S(3)=X_S(4)=X_S(5)=1$. The first pair of column pointers ($X_{SE0}=4$ and $X_{SO0}=5$) is the upper pair of column pointers, and the second pair of column pointers ($X_{SE1}=2$ and $X_{SO1}=3$) is the lower pair of column pointers.

First even bad column address $CB_{E0}$ and first odd bad column address $CB_{O0}$ are associated with the bad column addresses pointed to by first even column pointer $X_{SE0}=4$ and first odd column pointer $X_{SO0}=5$ respectively. During this second cycle of the $CRD_C$ clock first even bad column address $CB_{E0}$ and first odd bad column address $CB_{O0}$ are associated with the upper pair of column pointers ($X_{SE0}=4$ and $X_{SO0}=5$).

Second even bad column address $CB_{E1}$ and second odd bad column address $CB_{O1}$ are associated with the bad column addresses pointed to by second even column pointer $X_{SE1}=2$ and second odd column pointer $X_{SO1}=3$ respectively. During this second cycle of the $CRD_C$ clock, second even bad column address $CB_{E1}$ and second odd bad column address $CB_{O1}$ are associated with the lower pair of column pointers ($X_{SE1}=2$ and $X_{SO1}=3$).

In an embodiment, first comparator 1804a receives at first and second input terminals first even bad column address $CB_{E0}$ and first odd bad column address $CB_{O0}$, respectively, from MUX 1802, and receives at a third input terminal input column address $CRD_A$. As described above, first even bad column address $CB_{E0}$ and first odd bad column address $CB_{O0}$, may be alternately associated with the lower pair of column pointers or the upper pair of column pointers As used herein, if during a cycle of the $CRD_C$ clock first even bad column address $CB_{E0}$ and first odd bad column address $CB_{O0}$ are associated with the lower pair of column pointers, first comparator 1804a is referred to in that cycle of the $CRD_C$ clock as the "lower comparator." As used herein, if during a cycle of the $CRD_C$ clock first even bad column address $CB_{E0}$ and first odd bad column address $CB_{O0}$ are associated with the upper pair of column pointers, first comparator 1804a is referred to in that cycle of the $CRD_C$ clock as the "upper comparator."

In an embodiment, first comparator 1804a compares input column address $CRD_A$ with first even bad column address $CB_{E0}$ and first odd bad column address $CB_{O0}$, and generates a first pair of match signals. In an embodiment, the first pair of match signals includes a first even match signal MTCH00 and a first odd match signal MTCH10. In an embodiment, first even match signal MTCH00 corresponds to an even-numbered column and first odd match signal MTCH10 corresponds to an odd-numbered column.

In an embodiment, if first comparator 1804a determines that input column address $CRD_A$ matches first even bad column address $CB_{E0}$, first comparator 1804a outputs first even match signal MTCH00=1, otherwise first comparator 1804a outputs first even match signal MTCH00=0. In an embodiment, if first comparator 1804a determines that input column address $CRD_A$ matches first odd bad column address $CB_{O0}$, first comparator 1804a outputs first odd match signal MTCH10=1, otherwise first comparator 1804a outputs first odd match signal MTCH10=0. In an embodiment, if first comparator 1804a determines that input column address $CRD_A$ matches both first even bad column address $CB_{E0}$ and first odd bad column address $CB_{O0}$, first comparator 1804a outputs first even match signal MTCH00=1 and first odd match signal MTCH10=1.

In an embodiment, second comparator 1804b receives at first and second input terminals second even bad column address $CB_{E1}$ and second odd bad column address $CB_{O1}$, respectively, from MUX 1802, and receives at a third input terminal input column address $CRD_A$. As described above, second even bad column address $CB_{E1}$ and second odd bad column address $CB_{O1}$, may be alternately associated with the lower pair of column pointers or the upper pair of column pointers As used herein, if during a cycle of the $CRD_C$ clock second even bad column address $CB_{E1}$ and second odd bad column address $CB_{O1}$ are associated with the upper pair of column pointers, second comparator 1804b is referred to in that cycle of the $CRD_C$ clock as the upper comparator. As used herein, if during a cycle of the $CRD_C$ clock second even bad column address $CB_{E1}$ and second odd bad column address $CB_{O1}$ are associated with the lower pair of column pointers, second comparator 1804b is referred to in that cycle of the $CRD_C$ clock as the lower comparator.

In an embodiment, second comparator 1804b compares input column address $CRD_A$ with second even bad column address $CB_{E1}$ and second odd bad column address $CB_{O1}$, and generates a second pair of match signals. In an embodiment, the second pair of match signals includes a second even match signal MTCH01 and a second odd match signal MTCH11. In an embodiment, second even match signal MTCH01 corresponds to an even-numbered column and second odd match signal MTCH11 corresponds to an odd-numbered column.

In an embodiment, if second comparator 1804b determines that input column address $CRD_A$ matches second even bad column address $CB_{E1}$, second comparator 1804b outputs second even match signal MTCH01=1, otherwise second comparator 1804b outputs second even match signal MTCH01=0. In an embodiment, if second comparator 1804b determines that input column address $CRD_A$ matches second odd bad column address $CB_{O1}$, second comparator 1804b outputs second odd match signal MTCH11=1, otherwise second comparator 1804b outputs second odd match signal MTCH11=0. In an embodiment, if second comparator 1804b determines that input column address $CRD_A$ matches both second even bad column address $CB_{E1}$ and second odd bad column address $CB_{O1}$, second comparator 1804b outputs second even match signal MTCH01=1 and second odd match signal MTCH11=1.

In an embodiment, combinational logic 1808 receives first even match signal MTCH00 and first odd match signal MTCH10 from first comparator 1804a, and receives second even match signal MTCH01 and second odd match signal MTCH11 from second comparator 1804b.

In an embodiment, during each cycle of the $CRD_C$ clock combinational logic 1808 uses the even and odd match signals of only one of first comparator 1804a and second comparator 1804b to determine whether to update next column pointer $X_{Sn}$ to point to the next two consecutive even and odd bad column addresses.

In an embodiment, during each cycle of the $CRD_C$ clock, combinational logic 1808 uses the even and odd match signals of the lower comparator to determine whether to update next column pointer $X_{Sn}$ to point to the next two consecutive even and odd bad column addresses.

In an embodiment, a next column pointer $X_{Sn}$ includes a next first even column pointer $X_{SnE0}$, a next first odd column pointer $X_{SnO0}$, a next second even column pointer $X_{SnE1}$ and a next second odd column pointer $X_{SnO1}$.

In an embodiment, during each cycle of the $CRD_C$ clock in which first comparator 1804a is the lower comparator combinational logic 1808 updates next column pointer $X_{Sn}$ whenever first even match signal MTCH00 and first odd match signal MTCH10 are both=1. In particular, combinational logic 1808 increments by four each of next first even column pointer $X_{SnE0}$ and next first odd column pointer $X_{SnO0}$, and keeps next second even column pointer $X_{SnE1}$ and next second odd column pointer $X_{SnO1}$ unchanged. That is:

$$X_{SnE0} = X_{SnE0} + 4$$

$$X_{SnO0} = X_{SnO0} + 4$$

$$X_{SnE1} = X_{SnE1}$$

$$X_{SnO1} = X_{SnO1}$$

In an embodiment, during each cycle of the $CRD_C$ clock in which second comparator 1804b is the lower comparator combinational logic 1808 updates next column pointer $X_{Sn}$ whenever second even match signal MTCH01 and second odd match signal MTCH11 are both=1. In particular, combinational logic 1808 increments by four each of next second even column pointer $X_{SnE1}$ and next second odd column pointer $X_{SnO1}$, and keeps next first even column pointer $X_{SnE0}$ and next first odd column pointer $X_{SnO0}$ unchanged. That is:

$$X_{SnE0} = X_{SnE0}$$

$$X_{SnO0} = X_{SnO0}$$

$$X_{SnE1} = X_{SnE1} + 4$$

$$X_{SnO1} = X_{SnO1} + 4$$

Flip-flop 1810 receives next column pointer $X_{Sn}$ from combinational logic 1808 at a first input terminal, receives the $CRD_C$ clock at a second input terminal, and generates column pointer $X_S$ based on the bit values of next column pointer $X_{Sn}$. Thus, on the next cycle of the $CRD_C$ clock the bit values of column pointer $X_S$ are equal to the bit values of next column pointer $X_{Sn}$ from the current cycle of the $CRD_C$ clock.

Figure 18B:
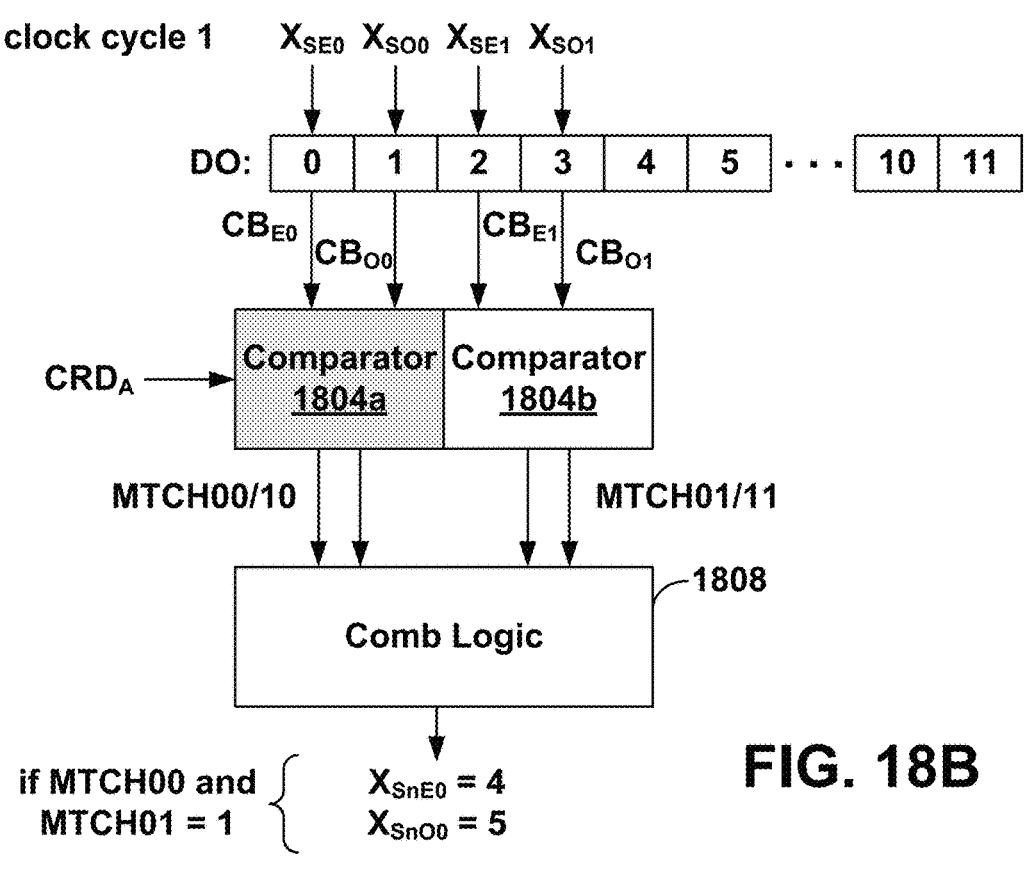
FIGS. 18B-18C depict an example operation of the column redundancy system of FIG. 18A.

FIG. 18B depicts an example operation of column redundancy system 1800 of FIG. 18A during a first cycle of the $CRD_C$ clock. In this example, column pointer $X_S(0)=X_S(1)=X_S(2)=X_S(3)=1$, and all other bits of column pointer $X_S$ are 0. Thus, first even column pointer $X_{SE0}=0$, first odd column pointer $X_{SO0}=1$, second even column pointer $X_{SE1}=2$, and second odd column pointer $X_{SO1}=3$. In this first clock cycle, the first pair of column pointers ($X_{SE0}=0$ and $X_{SO0}=1$) is the lower pair of column pointers, and the second pair of column pointers ($X_{SE1}=2$ and $X_{SO1}=3$) is the upper pair of column pointers.

In addition, at the start of the first cycle of the $CRD_C$ clock, next column pointer $X_{Sn}$ is equal to column pointer $X_S$. So next first even column pointer $X_{SnE0}=0$, next first odd column pointer $X_{SnO0}=1$, next second even column pointer $X_{SnE1}=2$, next second odd column pointer $X_{SnO1}=3$, and all other bits of next column pointer $X_{Sn}$ are 0.

First even bad column address $CB_{E0}$ and first odd bad column address $CB_{O0}$ are associated with the lower pair of column pointers ($X_{SE0}=0$ and $X_{SO0}=1$), and second even bad column address $CB_{E1}$ and second odd bad column address $CB_{O1}$ are associated with the upper pair of column pointers ($X_{SE1}=2$ and $X_{SO1}=3$).

First comparator 1804a receives at first and second input terminals first even bad column address $CB_{E0}$ and first odd bad column address $CB_{O0}$, respectively, and second comparator 1804b receives at first and second input terminals second even bad column address $CB_{E1}$ and second odd bad column address $CB_{O1}$, respectively. In the first cycle of the $CRD_C$ clock, first comparator 1804a is the lower comparator, and second comparator 1804b is the upper comparator.

First comparator 1804a compares input column address $CRD_A$ with first even bad column address $CB_{E0}$ and first odd bad column address $CB_{O0}$, and generates first even match signal MTCH00 and first odd match signal MTCH10 based on the comparison results. Second comparator 1804b compares input column address $CRD_A$ with second even bad column address $CB_{E1}$ and second odd bad column address $CB_{O1}$, and generates second even match signal MTCH01 and a second odd match signal MTCH11 based on the comparison results.

Assume that during the first cycle of the $CRD_C$ clock, input column address $CRD_A$ matches first even bad column address $CB_{E0}$ and first odd bad column address $CB_{O0}$, and does not match second even bad column address $CB_{E1}$ and second odd bad column address $CB_{O1}$. Thus, first comparator 1804a generates first even match signal MTCH00=1 and first odd match signal MTCH10=1, and second comparator 1804b generates second even match signal MTCH01=0 and second odd match signal MTCH11=0.

As described above, combinational logic 1808 uses the even and odd match signals of the lower comparator to determine whether to update next column pointer $X_{Sn}$ to point to the next two consecutive even and odd bad column addresses. Thus, during the first cycle of the $CRD_C$ clock combinational logic 1808 determines whether to update next column pointer $X_{Sn}$ based on first even match signal MTCH00 and first odd match signal MTCH10 provided by first comparator 1804a.

As described above, during each cycle of the $CRD_C$ clock in which first comparator 1804a is the lower comparator combinational logic 1808 updates next column pointer $X_{Sn}$ when first even match signal MTCH00 and first odd match signal MTCH10 are both=1. In this example first even match signal MTCH00=1 and first odd match signal MTCH10=1. Thus, combinational logic 1808 increments by four each of next first even column pointer $X_{SnE0}$ and next first odd column pointer $X_{SnO0}$, and keeps next second even column pointer $X_{SnE1}$ and next second odd column pointer $X_{SnO1}$ unchanged.

Thus, next first even column pointer $X_{SnE0}=0+4=4$, next first odd column pointer $X_{SnO0}=1+4=5$, next second even column pointer $X_{SnE1}=2$, and next second odd column pointer $X_{SnO1}=3$. All other bits of next column pointer $X_{Sn}$ are 0.

On the second cycle of the $CRD_C$ clock the bit values of column pointer $X_S$ provided by flip-flop 1810 are equal to the bit values of next column pointer $X_{Sn}$ from the first cycle of the $CRD_C$ clock. That is, $X_S(2)=X_S(3)=X_S(4)=X_S(5)=1$, and all other bits of column pointer $X_S$ are 0.

Figure 18C:
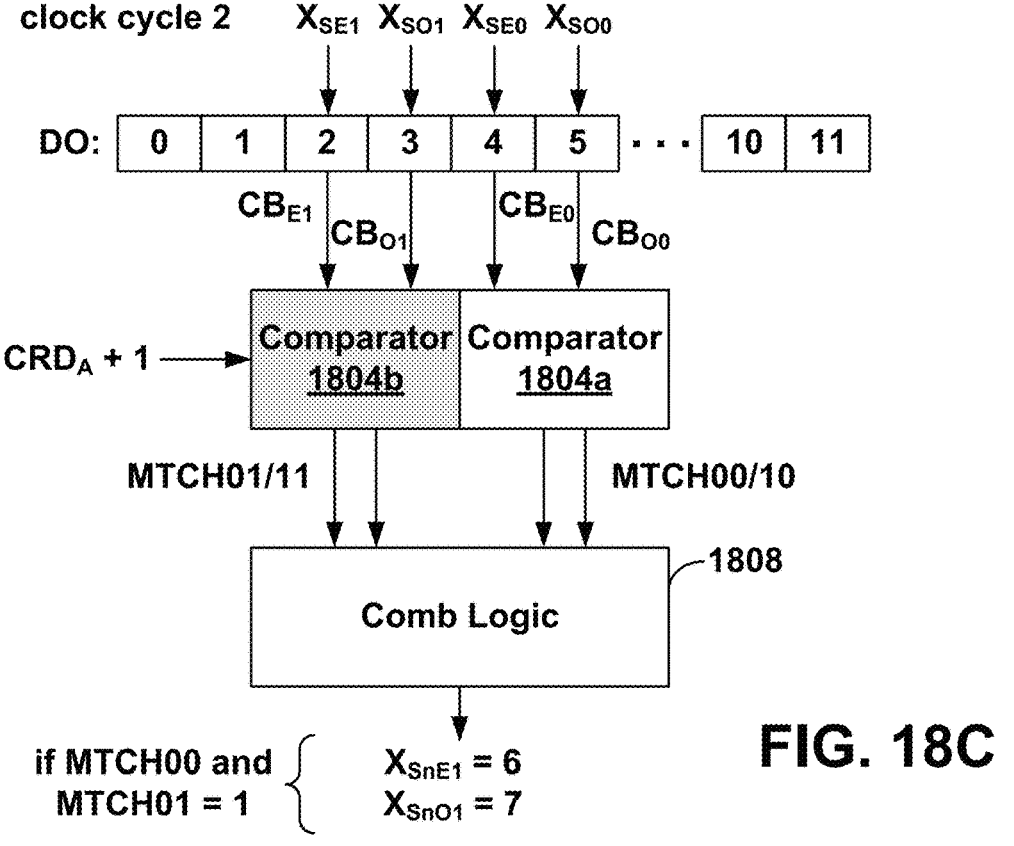

FIG. 18C depicts an example operation of column redundancy system 1800 of FIG. 18A during the second cycle of the $CRD_C$ clock. First even column pointer $X_{SE0}=4$, first odd column pointer $X_{SO0}=5$, second even column pointer $X_{SE1}=2$, and second odd column pointer $X_{SO1}=3$. In this second clock cycle, the first pair of column pointers ($X_{SE0}=4$ and $X_{SO0}=5$) is the upper pair of column pointers, and the second pair of column pointers ($X_{SE1}=2$ and $X_{SO1}=3$) is the lower pair of column pointers.

First even bad column address $CB_{E0}$ and first odd bad column address $CB_{O0}$ are associated with the upper pair of column pointers ($X_{SE0}$=4 and $X_{SO0}$=5), and second even bad column address $CB_{E1}$ and second odd bad column address $CB_{O1}$ are associated with the lower pair of column pointers ($X_{SE1}$=2 and $X_{SO1}$=3).

First comparator 1804a receives at first and second input terminals first even bad column address $CB_{E0}$ and first odd bad column address $CB_{O0}$, respectively, and second comparator 1804b receives at first and second input terminals second even bad column address $CB_{E1}$ and second odd bad column address $CB_{O1}$, respectively. In the second cycle of the $CRD_C$ clock, first comparator 1804a is the upper comparator, and second comparator 1804b is the lower comparator.

On the second cycle of the $CRD_C$ clock, the input column address is incremented to ($CRD_A$+1). First comparator 1804a compares input column address ($CRD_A$+1) with first even bad column address $CB_{E0}$ and first odd bad column address $CB_{O0}$, and generates first even match signal MTCH00 and first odd match signal MTCH10 based on the comparison results. Second comparator 1804b compares input column address ($CRD_A$+1) with second even bad column address $CB_{E1}$ and second odd bad column address $CB_{O1}$, and generates second even match signal MTCH01 and a second odd match signal MTCH11 based on the comparison results.

Assume that during the second cycle of the $CRD_C$ clock, input column address ($CRD_A$+1) matches second even bad column address $CB_{E1}$ and second odd bad column address $CB_{O1}$ but does not match first even bad column address $CB_{E0}$ and first odd bad column address $CB_{O0}$. Thus, first comparator 1804a generates first even match signal MTCH00=0 and first odd match signal MTCH10=0, and second comparator 1804b generates second even match signal MTCH01=1 and second odd match signal MTCH11=1.

As described above, combinational logic 1808 uses the even and odd match signals of the lower comparator to determine whether to update next column pointer $X_{Sn}$ to point to the next two consecutive even and odd bad column addresses. Thus, during the second cycle of the $CRD_C$ clock combinational logic 1808 determines whether to update next column pointer $X_{Sn}$ based on second even match signal MTCH01 and second odd match signal MTCH11 provided by second comparator 1804b.

As described above, during each cycle of the $CRD_C$ clock in which second comparator 1804b is the lower comparator combinational logic 1808 updates next column pointer $X_{Sn}$ when second even match signal MTCH01 and second odd match signal MTCH11 are both=1. In this example second even match signal MTCH01=1 and second odd match signal MTCH11=1. Thus, combinational logic 1808 increments by four each of next second even column pointer $X_{SnE1}$ and next second odd column pointer $X_{SnO1}$, and keeps next first even column pointer $X_{SnE1}$ and next first odd column pointer $X_{SnO1}$ unchanged.

Thus, next second even column pointer $X_{SnE1}$=2+4=6, next second odd column pointer $X_{SnO1}$=3+4=7, next first even column pointer $X_{SnE0}$=4, and next first odd column pointer $X_{SnO0}$=5. All other bits of next column pointer $X_{Sn}$ are 0.

On the third cycle of the $CRD_C$ clock the bit values of column pointer $X_S$ provided by flip-flop 1810 are equal to the bit values of next column pointer $X_{Sn}$ from the second cycle of the $CRD_C$ clock. That is, $X_S(4)$=$X_S(5)$=$X_S(6)$=$X_S(7)$=1, and all other bits of column pointer $X_S$ are 0.

Figure 18D:
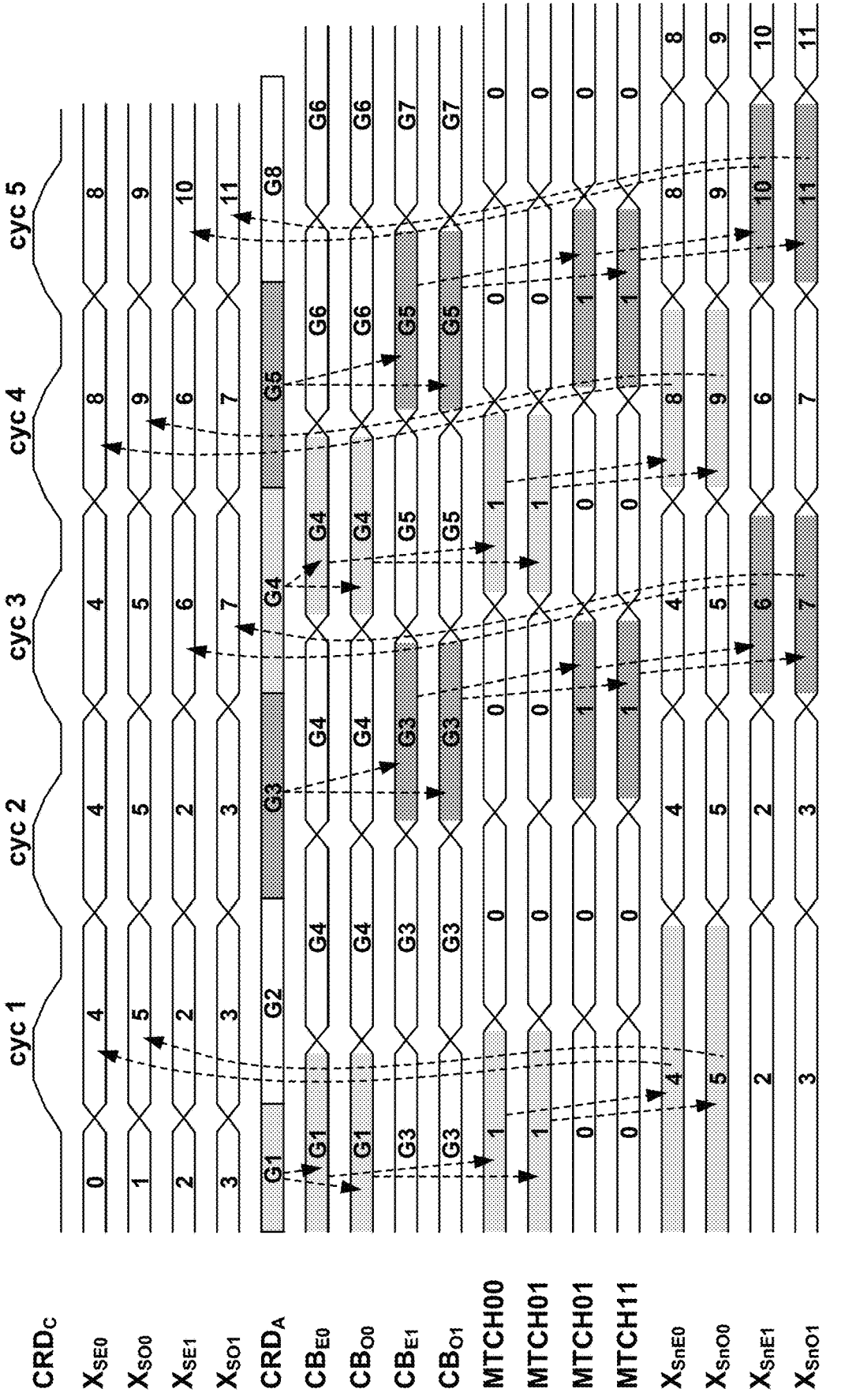
FIG. 18D is an example timing diagram depicting various values of signals of the column redundancy system of FIG. 18A.

FIG. 18D is an example timing diagram depicting values of various signals of column redundancy system 1800 of FIG. 18A. In particular, FIG. 18D depicts example values of first even column pointer $X_{SE0}$, first odd column pointer $X_{SO0}$, second even column pointer $X_{SE1}$, second odd column pointer $X_{SO1}$, input column address $CRD_A$, first even bad column address $CB_{E0}$, first odd bad column address $CB_{O0}$, second even bad column address $CB_{E1}$, second odd bad column address $CB_{O0}$, first even match signal MTCH00, first odd match signal MTCH10, second even match signal MTCH01, second odd match signal MTCH11, next first even column pointer $X_{SnE0}$, next first odd column pointer $X_{SnO0}$, next second even column pointer $X_{SnE1}$, and next second odd column pointer $X_{SnO1}$ over several cycles of the $CRD_C$ clock.

In the depicted example, prior to cycle 1 of the $CRD_C$ clock ("cycle 0"), first even column pointer $X_{SE0}$=0, first odd column pointer $X_{SO0}$=1, second even column pointer $X_{SE1}$=2, second odd column pointer $X_{SO1}$=3, the indexed group address of input column address $CRD_A$=G1, the indexed group address of first even bad column address $CB_{E0}$=G1, the indexed group address of second first odd bad column address $CB_{O0}$=G1, the indexed group address of second even bad column address $CB_{E1}$=G3, and the indexed group address of second odd bad column address $CB_{O1}$=G3.

The indexed group address of input column address $CRD_A$ matches the indexed group address of first even bad column address $CB_{E0}$ and the indexed group address of second odd bad column address $CB_{O0}$. As a result, first comparator 1804a provides first even match signal MTCH00=1 and first odd match signal MTCH10=1.

The indexed group address of input column address $CRD_A$ does not match the indexed group address of second even bad column address $CB_{E1}$ or the indexed group address of second odd bad column address $CB_{O1}$. As a result, second comparator 1804b provides second even match signal MTCH01=0 and second odd match signal MTCH11=0.

In cycle 0 of the $CRD_C$ clock, first comparator 1804a is the lower comparator, and second comparator 1804b is the upper comparator. Accordingly, combinational logic 1808 increments by four each of next first even column pointer $X_{SnE0}$ and next first odd column pointer $X_{SnO0}$, and keeps next second even column pointer $X_{SnE1}$ and next second odd column pointer $X_{SnO1}$ unchanged. Thus, next first even column pointer $X_{SnE0}$=0+4=4, next first odd column pointer $X_{SnO0}$=1+4=5, next second even column pointer $X_{SnE1}$=2, and next second odd column pointer $X_{SnO1}$=3.

In cycle 1 of $CRD_C$ clock, the values of first even column pointer $X_{SE0}$ and first odd column pointer $X_{SO0}$ are updated to the values of next first even column pointer $X_{SnE0}$ and next first odd column pointer $X_{SnO0}$, respectively, (indicated by the dashed lines in FIG. 18D). Thus, first even column pointer $X_{SE0}$=4 and first odd column pointer $X_{SO0}$=5. Second even column pointer $X_{SE1}$ and second odd column pointer $X_{SO1}$ remain unchanged. That is, second even column pointer $X_{SE1}$=2 and second odd column pointer $X_{SO1}$=3.

Thus, during cycle 1 of the $CRD_C$ clock second even bad column address $CB_{E1}$ and second odd bad column address $CB_{O1}$ are associated with the lower pair of column pointers, first even bad column address $CB_{E0}$ and first odd bad column address $CB_{O0}$ are associated with the upper pair of column pointers, second comparator 1804a is the lower comparator and first comparator 1804a is the upper comparator.

The indexed group address of input column address $CRD_A$=G2, the indexed group address of first even bad column address $CB_{E0}$=G4, the indexed group address of first odd bad column address $C_{BO0}$=G4, the indexed group address of second even bad column address $CB_{E1}$=G3, and the indexed group address of second odd bad column address $CB_{O1}$=G3.

The indexed group address of input column address $CRD_A$ does not match any of the indexed group address of first even bad column address $CB_{E0}$, the indexed group address of first odd bad column address $CB_{O0}$, the indexed group address of second even bad column address $CB_{E1}$ or the indexed group address of second odd bad column address $CB_{O1}$. As a result, first comparator 1804a provides first even match signal MTCH00=0 and first odd match signal MTCH10=0, and second comparator 1804b provides second even match signal MTCH01=0 and second odd match signal MTCH11=0.

As a result, combinational logic 1808 keeps each of next first even column pointer $X_{SnE0}$, next first odd column pointer $X_{SnO0}$, next second even column pointer $X_{SnE1}$ and next second odd column pointer $X_{SnO1}$ unchanged. Thus, next first even column pointer $X_{SnE0}$=4, next first odd column pointer $X_{SnO0}$=5, next second even column pointer $X_{SnE1}$=2, and next second odd column pointer $X_{SnO1}$=3.

Note that in cycle 0 of the $CRD_C$ clock second even bad column address $CB_{E1}$ and second odd bad column address $CB_{O1}$ are associated with the upper pair of column pointers, but in cycle 1 of the $CRD_C$ clock second even bad column address $CB_{E1}$ and second odd bad column address $CB_{O1}$ retain the same values as in cycle 0, and are associated with the lower pair of column pointers.

In this regard, second even bad column address $CB_{E1}$ and second odd bad column address $CB_{O1}$ are "pre-fetched" one cycle before the cycle of the $CRD_C$ clock in which they are used by second comparator 1804b to determine whether input column address $CRD_A$ matches the indexed group address of second even bad column address $CB_{E1}$ and the indexed group address of second odd bad column address $CB_{O1}$.

Thus, because second even bad column address $CB_{E1}$ and second odd bad column address $CB_{O1}$ are available from the previous clock cycle, even if there is a delay in cycle 1 in updating first even column pointer $X_{SE0}$ and first odd column pointer $X_{SO0}$, the delay will not impact the validity of the second comparator 1804b results and the values of second even match signal MTCH01=0 and second odd match signal MTCH11=0.

Next, in cycle 2 of $CRD_C$ clock the values of first even column pointer $X_{SE0}$, first odd column pointer $X_{SO0}$, second even column pointer $X_{SE1}$ and second odd column pointer $X_{SO1}$ remain unchanged. Thus, first even column pointer $X_{SE0}$=4, first odd column pointer $X_{SO0}$=5, second even column pointer $X_{SE1}$=2 and second odd column pointer $X_{SO1}$=3.

During cycle 2 of the $CRD_C$ clock second even bad column address $CB_{E1}$ and second odd bad column address $CB_{O1}$ remain associated with the lower pair of column pointers, first even bad column address $CB_{E0}$ and first odd bad column address $CB_{O0}$ remain associated with the upper pair of column pointers, second comparator 1804a is the lower comparator and first comparator 1804a is the upper comparator.

The indexed group address of input column address $CRD_A$=G3, the indexed group address of first even bad column address $CB_{E0}$=G4, the indexed group address of first odd bad column address $CB_{O0}$=G4, the indexed group address of second even bad column address $CB_{E1}$=G3, and the indexed group address of second odd bad column address $CB_{O1}$=G3.

The indexed group address of input column address $CRD_A$ does not match the indexed group address of first even bad column address $CB_{E0}$ or the indexed group address of first odd bad column address $CB_{O0}$, but matches the indexed group address of second even bad column address $CB_{E1}$ and the indexed group address of second odd bad column address $CB_{O1}$. As a result, first comparator 1804a provides first even match signal MTCH00=0 and first odd match signal MTCH10=0, and second comparator 1804b provides second even match signal MTCH01=1 and second odd match signal MTCH11=1.

As described above, during cycle 2 of the $CRD_C$ clock second comparator 1804b is the lower comparator and first comparator 1804a is the upper comparator. Accordingly, because second even match signal MTCH01=1 and second odd match signal MTCH11=1, combinational logic 1808 increments by four each of next second even column pointer $X_{SnE1}$ and next second odd column pointer $X_{SnO1}$, and keeps next first even column pointer $X_{SnE0}$ and next first odd column pointer $X_{SnO0}$ unchanged. Thus, next first even column pointer $X_{SnE0}$=4, next first odd column pointer $X_{SnO0}$=5, next second even column pointer $X_{SnE1}$=2+4=6, and next second odd column pointer $X_{SnO1}$=3+4=7.

Next, in cycle 3 of the $CRD_C$ clock the values of first even column pointer $X_{SE0}$ and first odd column pointer $X_{SO0}$ remain unchanged, but the values of second even column pointer $X_{SE1}$ and second odd column pointer $X_{SO1}$ are updated to the values of next second even column pointer $X_{SnE1}$ and next second odd column pointer $X_{SnO1}$, respectively, (indicated by the dashed lines in FIG. 18D). Thus, first even column pointer $X_{SE0}$=4, first odd column pointer $X_{SO0}$=5, second even column pointer $X_{SE1}$=6 and second odd column pointer $X_{SO1}$=7.

Thus, during cycle 3 of the $CRD_C$ clock first even bad column address $CB_{E0}$ and first odd bad column address $CB_{O0}$ are associated with the lower pair of column pointers, second even bad column address $CB_{E1}$ and second odd bad column address $CB_{O1}$ are associated with the upper pair of column pointers, first comparator 1804a is the lower comparator and second comparator 1804a is the upper comparator.

The indexed group address of input column address $CRD_A$=G4, the indexed group address of first even bad column address $CB_{E0}$=G4, the indexed group address of first odd bad column address $CB_{O0}$=G4, the indexed group address of second even bad column address $CB_{E1}$=G5, and the indexed group address of second odd bad column address $CB_{O1}$=G5.

The indexed group address of input column address $CRD_A$ matches the indexed group address of first even bad column address $CB_{E0}$ and the indexed group address of first odd bad column address $CB_{O0}$, but does not match the indexed group address of but second even bad column address $CB_{E1}$ or the indexed group address of second odd bad column address $CB_{O1}$. As a result, first comparator 1804a provides first even match signal MTCH00=1 and first odd match signal MTCH10=1, and second comparator 1804b provides second even match signal MTCH01=0 and second odd match signal MTCH11=0.

As described above, during cycle 3 of the $CRD_C$ clock first comparator 1804a is the lower comparator, and second comparator 1804b is the upper comparator. Accordingly, because first even match signal MTCH00=1 and first odd match signal MTCH10=1, combinational logic 1808 increments by four each of next first even column pointer $X_{SnE0}$ and next first odd column pointer $X_{SnO0}$, but keeps next second even column pointer $X_{SnE1}$ and next second odd column pointer $X_{SnO1}$, unchanged. Thus, next first even column pointer $X_{SnE0}=4+4=8$, next first odd column pointer $X_{SnO0}=5+4=9$, next second even column pointer $X_{SnE1}=6$, and next second odd column pointer $X_{SnO1}=7$.

Note that cycle 2 and cycle 3 of the $CRD_C$ clock include back-to-back matches. Note also that in cycle 2 of the $CRD_C$ clock first even bad column address $CB_{E0}$ and first odd bad column address $CB_{O0}$ are associated with the upper pair of column pointers, but in cycle 3 of the $CRD_C$ clock first even bad column address $CB_{E0}$ and first odd bad column address $CB_{O0}$ retain the same values as in cycle 2, and are associated with the lower pair of column pointers.

In this regard, first even bad column address $CB_{E0}$ and first odd bad column address $CB_{O0}$ are "pre-fetched" one cycle before the cycle of the $CRD_C$ clock in which they are used by first comparator 1804a to determine whether input column address $CRD_A$ matches the indexed group address of first even bad column address $CB_{E0}$ and the indexed group address of first odd bad column address $CB_{O0}$.

Thus, because first even bad column address $CB_{E0}$ and first odd bad column address $CB_{O0}$ are available from the previous clock cycle, even if there is a delay in cycle 3 in updating second even column pointer $X_{SE1}$ and second odd column pointer $X_{SO1}$, the delay will not impact the validity of the first comparator 1804a results and the values of first even match signal MTCH00=1 and first odd match signal MTCH10=1.

Next, in cycle 4 of the $CRD_C$ clock the values of first even column pointer $X_{SE0}$ and first odd column pointer $X_{SO0}$ are updated to the values of next first even column pointer $X_{SnE0}$ and next first odd column pointer $X_{SnO0}$, respectively (indicated by the dashed lines in FIG. 18D), but the values of second even column pointer $X_{SE1}$ and second odd column pointer $X_{SO1}$ remain unchanged. Thus, first even column pointer $X_{SE0}=8$, first odd column pointer $X_{SO0}=9$, second even column pointer $X_{SE1}=6$ and second odd column pointer $X_{SO1}=7$.

Thus, during cycle 4 of the $CRD_C$ clock first even bad column address $CB_{E0}$ and first odd bad column address $CB_{O0}$ are associated with the upper pair of column pointers, second even bad column address $CB_{E1}$ and second odd bad column address $CB_{O1}$ are associated with the lower pair of column pointers, first comparator 1804a is the upper comparator and second comparator 1804a is the lower comparator.

The indexed group address of input column address $CRD_A=G5$, the indexed group address of first even bad column address $CB_{E0}=G6$, the indexed group address of first odd bad column address $CB_{O0}=G6$, the indexed group address of second even bad column address $CB_{E1}=G5$, and the indexed group address of second odd bad column address $CB_{O1}=G5$.

The indexed group address of input column address $CRD_A$ does not match the indexed group address of first even bad column address $CB_{E0}$ or the indexed group address of first odd bad column address $CB_{O0}$, but matches the indexed group address of second even bad column address $CB_{E1}$ and the indexed group address of second odd bad column address $CB_{O1}$. As a result, first comparator 1804a provides first even match signal MTCH00=0 and first odd match signal MTCH10=0, and second comparator 1804b provides second even match signal MTCH01=1 and second odd match signal MTCH11=1.

As described above, during cycle 4 of the $CRD_C$ clock first comparator 1804a is the upper comparator, and second comparator 1804b is the lower comparator. Accordingly, because second even match signal MTCH01=1 and second odd match signal MTCH11=1, combinational logic 1808 keeps next first even column pointer $X_{SnE0}$ and next first odd column pointer $X_{SnO0}$ unchanged, but increments by four each of next second even column pointer $X_{SnE1}$ and next second odd column pointer $X_{SnO1}$. Thus, next first even column pointer $X_{SnE0}=8$, next first odd column pointer $X_{SnO0}=9$, next second even column pointer $X_{SnE1}=6+4=10$, and next second odd column pointer $X_{SnO1}=7+4=11$.

Note that cycle 3 and cycle 4 of the $CRD_C$ clock include back-to-back matches. Note also that in cycle 3 of the $CRD_C$ clock second even bad column address $CB_{E1}$ and second odd bad column address $CB_{O1}$ are associated with the upper pair of column pointers, but in cycle 4 of the $CRD_C$ clock second even bad column address $CB_{E1}$ and second odd bad column address $CB_{O1}$ retain the same values as in cycle 3, and are associated with the lower pair of column pointers.

In this regard, second even bad column address $CB_{E1}$ and second odd bad column address $CB_{O1}$ are "pre-fetched" one cycle before the cycle of the $CRD_C$ clock in which they are used by second comparator 1804b to determine whether input column address $CRD_A$ matches the indexed group address of second even bad column address $CB_{E1}$ and the indexed group address of second odd bad column address $CB_{O1}$.

Thus, because second even bad column address $CB_{E1}$ and second odd bad column address $CB_{O1}$ are available from the previous clock cycle, even if there is a delay in clock cycle 4 in updating first even column pointer $X_{SE0}$ and first odd column pointer $X_{SO0}$, the delay will not impact the validity of the second comparator 1804b results and the values of second even match signal MTCH01=1 and second odd match signal MTCH11=1.

Next, in cycle 5 of the $CRD_C$ clock the values of first even column pointer $X_{SE0}$ and first odd column pointer $X_{SO0}$ remain unchanged, but the values of second even column pointer $X_{SE1}$ and second odd column pointer $X_{SO1}$ are updated to the values of next second even column pointer $X_{SnE1}$ and next second odd column pointer $X_{SnO1}$, respectively (indicated by the dashed lines in FIG. 18D). Thus, first even column pointer $X_{SE0}=8$, first odd column pointer $X_{SO0}=9$, second even column pointer $X_{SE1}=10$ and second odd column pointer $X_{SO1}=11$.

Thus, during cycle 5 of the $CRD_C$ clock first even bad column address $CB_{E0}$ and first odd bad column address $CB_{O0}$ are associated with the lower pair of column pointers, second even bad column address $CB_{E1}$ and second odd bad column address $CB_{O1}$ are associated with the upper pair of column pointers, first comparator 1804a is the lower comparator and second comparator 1804a is the upper comparator.

The indexed group address of input column address $CRD_A=G8$, the indexed group address of first even bad column address $CB_{E0}=G6$, the indexed group address of first odd bad column address $CB_{O0}=G6$, the indexed group address of second even bad column address $CB_{E1}=G7$, and the indexed group address of second odd bad column address $CB_{O1}=G7$.

The indexed group address of input column address $CRD_A$ does not match the indexed group address of first even bad column address $CB_{E0}$, the indexed group address of first odd bad column address $CB_{O0}$, the indexed group address of second even bad column address $CB_{E1}$, or the indexed group address of second odd bad column address $CB_{O1}$. As a result, first comparator 1804a provides first even match signal MTCH00=0 and first odd match signal MTCH10=0, and second comparator 1804b provides second even match signal MTCH01=0 and second odd match signal MTCH11=0.

As described above, during cycle 5 of the $CRD_C$ clock first comparator 1804a is the lower comparator, and second comparator 1804b is the upper comparator. Accordingly, because first even match signal MTCH00=0 and first odd match signal MTCH10=0, combinational logic 1808 keeps next first even column pointer $X_{SnE0}$, next first odd column pointer $X_{SnO0}$, next second even column pointer $X_{SnE1}$ and next second odd column pointer $X_{SnO1}$ unchanged. Thus, next first even column pointer $X_{SnE0}$=8, next first odd column pointer $X_{SnO0}$=9, next second even column pointer $X_{SnE1}$=10, and next second odd column pointer $X_{SnO1}$=11.

Note that in cycle 4 of the $CRD_C$ clock first even bad column address $CB_{E0}$ and first odd bad column address $CB_{O0}$ are associated with the upper pair of column pointers, but in cycle 5 of the $CRD_C$ clock first even bad column address $CB_{E0}$ and first odd bad column address $CB_{O0}$ retain the same values as in cycle 4, and are associated with the lower pair of column pointers.

In this regard, first even bad column address $CB_{E0}$ and first odd bad column address $CB_{O0}$ are "pre-fetched" one cycle before the cycle of the $CRD_C$ clock in which they are used by first comparator 1804a to determine whether input column address $CRD_A$ matches the indexed group address of first even bad column address $CB_{E0}$ and the indexed group address of fourth output $CB_{O0}$.

Thus, because first even bad column address $CB_{E0}$ and second odd bad column address $CB_{O0}$ are available from the previous clock cycle, even if there is a delay in clock cycle 5 in updating second even column pointer $X_{SE1}$ and second odd column pointer $X_{SO1}$, the delay will not impact the validity of the first comparator 1804a results and the values of first even match signal MTCH01=0 and first odd match signal MTCH11=0.

Without wanting to be bound by any particular theory, it is believed that by pre-fetching the first even bad column address $CB_{E0}$ and first odd bad column address $CB_{O0}$ (second even bad column address $CB_{E1}$ and second odd bad column address $CB_{O1}$) one clock cycle before the clock cycle in which they are used, even if there is a delay in a current clock cycle in updating second even column pointer $X_{SE1}$ and second odd column pointer $XS_{O1}$ (first even column pointer $XS_{E0}$ and first odd column pointer $XS_{O0}$), the delay will not impact the validity of the first comparator 1804a (second comparator 1804b) output.

Without wanting to be bound by any particular theory, it is believed that by pre-fetching the first even bad column address $CB_{E0}$ and first odd bad column address $CB_{O0}$ (second even bad column address $CB_{E1}$ and second odd bad column address $CB_{O1}$) one clock cycle before the clock cycle in which they are used, the disclosed column redundancy systems (such as column redundancy system 1800 of FIG. 18A) may operate with higher toggle mode speeds.

FIG. 19 is a flow chart of an example column redundancy data process 1900 that may be implemented by the example column redundancy system 1800 of FIG. 18A. In an embodiment, example column redundancy data process 1900 may be implemented by column replacement control circuits 236 of FIGS. 2A-2B.

At step 1902, providing a memory structure and a plurality of data latches. In an embodiment, the memory structure includes non-volatile memory cells that include a plurality of columns, each column having a column address. In an embodiment, the plurality of data latches include defective column addresses.

At step 1904, during each cycle of a clock signal, comparing an input column address with a first pair of defective column addresses from the plurality of data latches and a second pair of defective column addresses from the plurality of data latches.

At step 1906, upon determining that the input column address matches one of the first pair of defective column addresses or the second pair of defective column addresses, incrementing pointers to a next first pair of defective column addresses or a next second pair of defective column addresses, respectively.

In embodiments, at least one of the first pair of defective column addresses and the second pair of defective column addresses was retrieved from the plurality of data latches during a previous cycle of the clock signal.

In an embodiment, an apparatus is provided that includes a memory structure including non-volatile memory cells that include a plurality of columns, each column including a column address, and a column redundancy system coupled to the memory structure and a clock signal. The column redundancy system is configured to in a first cycle of the clock signal first compare a first input column address to a first pair of defective column addresses received during an immediately preceding cycle of the clock signal, second compare the first input column address to a second pair of defective column addresses received during the first cycle of the clock signal.

In another embodiment, an apparatus is provided that includes a memory structure including non-volatile memory cells that include a plurality of columns, each column including a column address, and a control circuit coupled to the memory structure. The control circuit is configured to receive a first pair of pointers to a first pair of defective column addresses, receive a second pair of pointers to a second pair of defective column addresses, compare an input column address with the first pair of defective column addresses to generate a first match result, compare the input column address with the second pair of defective column addresses to generate a second match result, and based on one of the first match result or the second match result, increment one of the first pair of pointers or the second pair of pointers, respectively.

In another embodiment, a method is provided that includes providing a memory structure and a plurality of data latches. The memory structure includes non-volatile memory cells that include a plurality of columns, each column having a column address. The plurality of data latches include defective column addresses. During each cycle of a clock signal, comparing a input column address with a first pair of defective column addresses from the plurality of data latches and a second pair of defective column addresses from the plurality of data latches, and upon determining that the input column address matches one of the first pair of defective column addresses or the second pair of defective column addresses, incrementing pointers to a next first pair of defective column addresses or a next second pair of defective column addresses, respectively. At least one of the first pair of defective column addresses and the second pair of defective column addresses was retrieved during a previous cycle of the clock signal from the plurality of data latches.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a memory structure comprising non-volatile memory cells that include a plurality of columns, each column comprising a column address; and
a column redundancy system coupled to the memory structure and a clock signal, the column redundancy system configured to:
in a first cycle of the clock signal:
first compare a first input column address to a first pair of defective column addresses received during an immediately preceding cycle of the clock signal; and
second compare the first input column address to a second pair of defective column addresses received during the first cycle of the clock signal.

2. The apparatus of claim 1, wherein the column redundancy system is further configured to use results of the first compare to increment pointers to a third pair of defective column addresses for use by the column redundancy system during a second cycle of the clock signal immediately following the first cycle of the clock signal.

3. The apparatus of claim 2, wherein in the second cycle of the clock signal the column redundancy system is further configured to:
third compare a second input column address to the second pair of defective column addresses received during the first cycle of the clock signal; and
fourth compare the second input column address to a third pair of defective column addresses received during the second cycle of the clock signal.

4. The apparatus of claim 3, wherein the column redundancy system is further configured to use results of the third compare to increment pointers to a fourth pair of defective column addresses for use by the column redundancy system during a third cycle of the clock signal immediately following the second cycle of the clock signal.

5. The apparatus of claim 1, wherein:
the first pair of defective column addresses comprises a first even defective column address and a first odd defective column address; and
the second pair of defective column addresses comprises a second even defective column address and a second odd defective column address.

6. The apparatus of claim 1, wherein:
the first pair of defective column addresses comprises a first even defective column address and a first odd defective column address; and
the column redundancy system is further configured to:
determine that the first input column address matches the first even defective column address and the first odd defective column address; and
increment pointers to a third pair of defective column addresses to be used by the column redundancy system during a second cycle of the clock signal immediately following the first cycle of the clock signal.

7. The apparatus of claim 1, wherein the column redundancy system is further configured to:
generate a first even match signal and a first odd match signal based on results of the first compare; and
based on values of the first even match signal and the first odd match signal, increment pointers to a third pair of defective column addresses to be used by the column redundancy system during a second cycle of the clock signal immediately following the first cycle of the clock signal.

8. The apparatus of claim 1, wherein the first pair of defective column addresses has values less than the second pair of defective column addresses.

9. The apparatus of claim 1, wherein on each cycle of the clock signal the column redundancy system is further configured to select four bad column addresses corresponding to bit values of a column pointer, wherein:
a first two of the selected bad column addresses comprises the first pair of defective column addresses; and
a second two of the selected bad column addresses comprises the second pair of defective column addresses.

10. The apparatus of claim 9, wherein:
the column pointer comprises multiple bits; and
during each cycle of the clock signal, four consecutive bits of the column pointer are used to identify the first pair of defective column addresses and the second pair of defective column addresses.

11. The apparatus of claim 1, wherein:
the column redundancy system further comprises a column pointer comprising multiple bits, each bit corresponding to a defective column address; and
during the first cycle of the clock signal a first four consecutive bits comprise a first value and all other bits comprise a second value.

12. The apparatus of claim 11, wherein the column redundancy system is further configured to:
determine that the first input column address matches the first pair of defective column addresses; and
determine that during a second cycle of the clock signal immediately following the first cycle of the clock signal a second four consecutive bits comprise the first value and all other bits comprise the second value.

13. An apparatus comprising:
a memory structure comprising non-volatile memory cells comprising a plurality of columns, each column comprising a column address;

a control circuit coupled to the memory structure, the control circuit configured to:

receive a first pair of pointers to a first pair of defective column addresses;

receive a second pair of pointers to a second pair of defective column addresses;

compare an input column address with the first pair of defective column addresses to generate a first match result;

compare the input column address with the second pair of defective column addresses to generate a second match result; and based on one of the first match result or the second match result, increment one of the first pair of pointers or the second pair of pointers, respectively.

14. The apparatus of claim 13, wherein:

the first pair of defective column addresses comprises a first even defective column address and a first odd defective column address; and the second pair of defective column addresses comprises a second even defective column address and a second odd defective column address.

15. The apparatus of claim 13, wherein the control circuit is further configured to:

receive the first pair of pointers during a current cycle of a clock signal;

receive the second pair of pointers during an immediately preceding cycle of the clock signal.

16. The apparatus of claim 13, wherein the control circuit is further configured to:

determine during a current cycle of a clock signal that the first input column address matches the first pair of defective column addresses; and increment the first pair of pointers for use by the column redundancy system during an immediately subsequent cycle of the clock signal.

17. The apparatus of claim 16, wherein the control circuit is further configured to maintain values of the second pair of pointers for use by the column redundancy system during the immediately subsequent cycle of the clock signal.

18. The apparatus of claim 16, wherein the control circuit is further configured to increment by four the first pair of pointers.

19. A method comprising:

providing a memory structure comprising non-volatile memory cells that include a plurality of columns, each column comprising a column address, and a plurality of data latches comprising defective column addresses; and during each cycle of a clock signal:

comparing an input column address with a first pair of defective column addresses from the plurality of data latches and a second pair of defective column addresses from the plurality of data latches; and upon determining that the input column address matches one of the first pair of defective column addresses or the second pair of defective column addresses, incrementing pointers to a next first pair of defective column addresses or a next second pair of defective column addresses, respectively;

wherein at least one of the first pair of defective column addresses and the second pair of defective column addresses was retrieved from the plurality of data latches during a previous cycle of the clock signal.

20. The method of claim 19, further comprising incrementing the input column address on each cycle of the clock signal.

* * * * *